United States Patent
Chen et al.

(10) Patent No.: US 12,368,109 B2
(45) Date of Patent: Jul. 22, 2025

(54) INTERPOSER STRUCTURE FOR SEMICONDUCTOR PACKAGE INCLUDING PERIPHERAL METAL PAD AROUND ALIGNMENT MARK AND METHODS OF FABRICATING SAME

(71) Applicant: Taiwan Semiconductor Manufacturing Company Limited, Hsinchu (TW)

(72) Inventors: Hsien-Wei Chen, Hsinchu (TW); Meng-Liang Lin, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 468 days.

(21) Appl. No.: 17/830,550

(22) Filed: Jun. 2, 2022

(65) Prior Publication Data

US 2023/0395521 A1    Dec. 7, 2023

(51) Int. Cl.
*H01L 23/544* (2006.01)
*H01L 21/48* (2006.01)
(Continued)

(52) U.S. Cl.
CPC ........ H01L 23/544 (2013.01); H01L 21/4857 (2013.01); H01L 21/486 (2013.01);
(Continued)

(58) Field of Classification Search
CPC . H01L 23/544; H01L 21/4857; H01L 21/486; H01L 23/49811; H01L 23/49822; H01L 23/49838; H01L 25/0655; H01L 24/16; H01L 24/32; H01L 24/73; H01L 2223/54426; H01L 2223/5448; H01L 2224/16227; H01L 2224/16238; H01L 2224/32225; H01L 2224/73204; H01L 2924/3512; H01L 2924/37001;
(Continued)

(56) References Cited

U.S. PATENT DOCUMENTS

2018/0143374 A1* 5/2018 Coolbaugh ............. H01L 23/13
2020/0105544 A1* 4/2020 Tsai .................... H01L 21/4853
2022/0352110 A1* 11/2022 Yim .................. H01L 23/49838

\* cited by examiner

*Primary Examiner* — Ratisha Mehta
*Assistant Examiner* — Sophia W Kao
(74) *Attorney, Agent, or Firm* — The Marbury Law Group, PLLC

(57) ABSTRACT

An interposer for a semiconductor package and a method of fabricating an interposer including a peripheral metal pad surrounding an alignment mark. The alignment mark and the surrounding peripheral metal pad are formed on a first dielectric material layer of the interposer. A second dielectric material layer is located over the first dielectric material layer and at least partially over the peripheral metal pad structure and includes an recess extending around a periphery of the alignment mark. A third dielectric material layer is located over the second dielectric material layer and extends into the recess and contacts the alignment mark, the first dielectric material layer, and optionally a portion of the peripheral metal pad. The peripheral metal pad may enhance the adhesion between the first, second and third dielectric material layers near the alignment mark structure and thereby reduce the likelihood of crack formation.

20 Claims, 44 Drawing Sheets

(51) Int. Cl.
*H01L 23/00* (2006.01)
*H01L 23/498* (2006.01)
*H01L 25/065* (2023.01)

(52) U.S. Cl.
CPC .. *H01L 23/49811* (2013.01); *H01L 23/49822* (2013.01); *H01L 23/49838* (2013.01); *H01L 25/0655* (2013.01); *H01L 24/16* (2013.01); *H01L 24/32* (2013.01); *H01L 24/73* (2013.01); *H01L 2223/54426* (2013.01); *H01L 2223/5448* (2013.01); *H01L 2224/16227* (2013.01); *H01L 2224/16238* (2013.01); *H01L 2224/32225* (2013.01); *H01L 2224/73204* (2013.01); *H01L 2924/3512* (2013.01); *H01L 2924/37001* (2013.01)

(58) Field of Classification Search
CPC ............. H01L 23/5383; H01L 23/5386; H01L 2221/68327; H01L 2223/5442; H01L 2223/5446; H01L 2224/81; H01L 21/561; H01L 21/568; H01L 25/50; H01L 21/6835; H01L 23/3128; H01L 23/5385; H01L 2221/68345
See application file for complete search history.

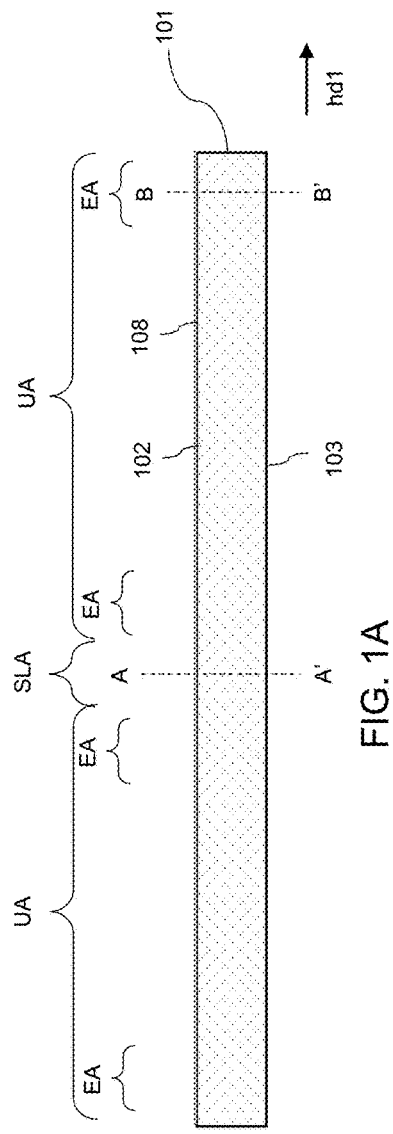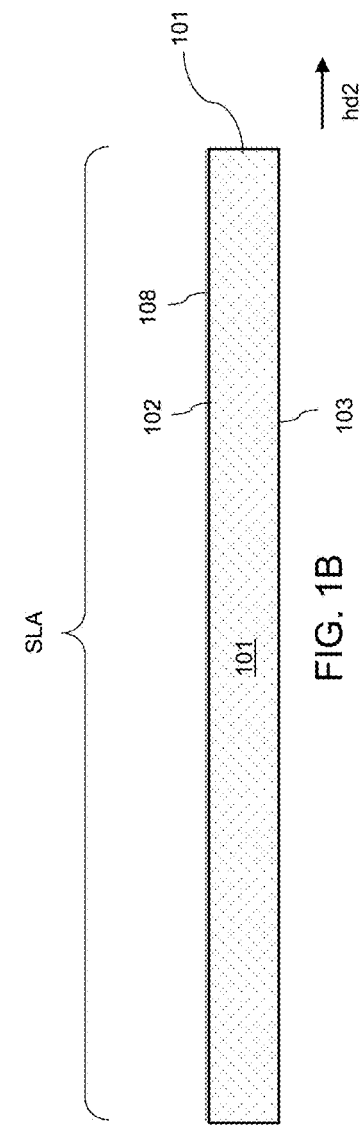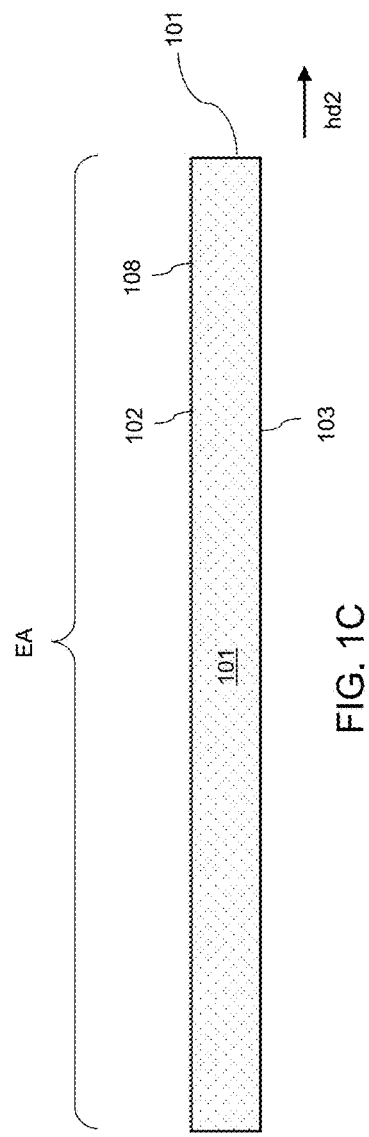

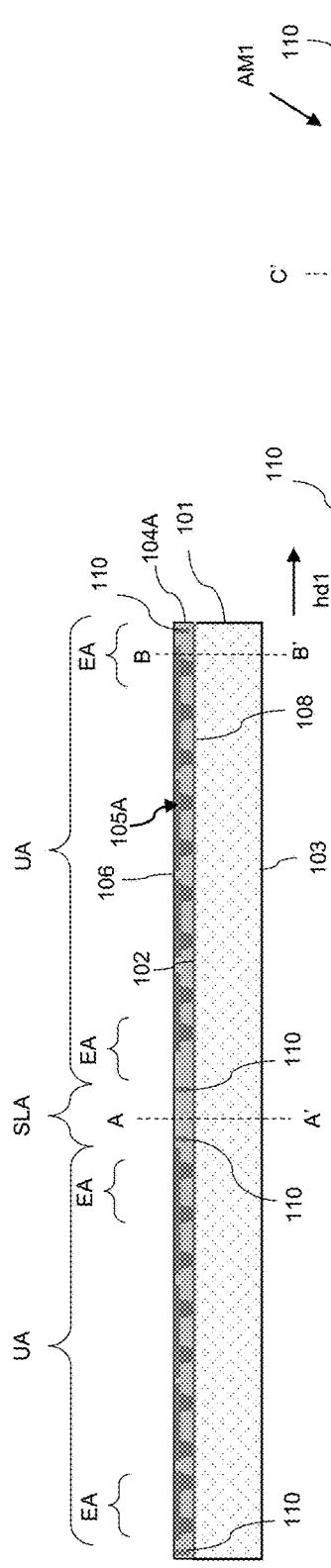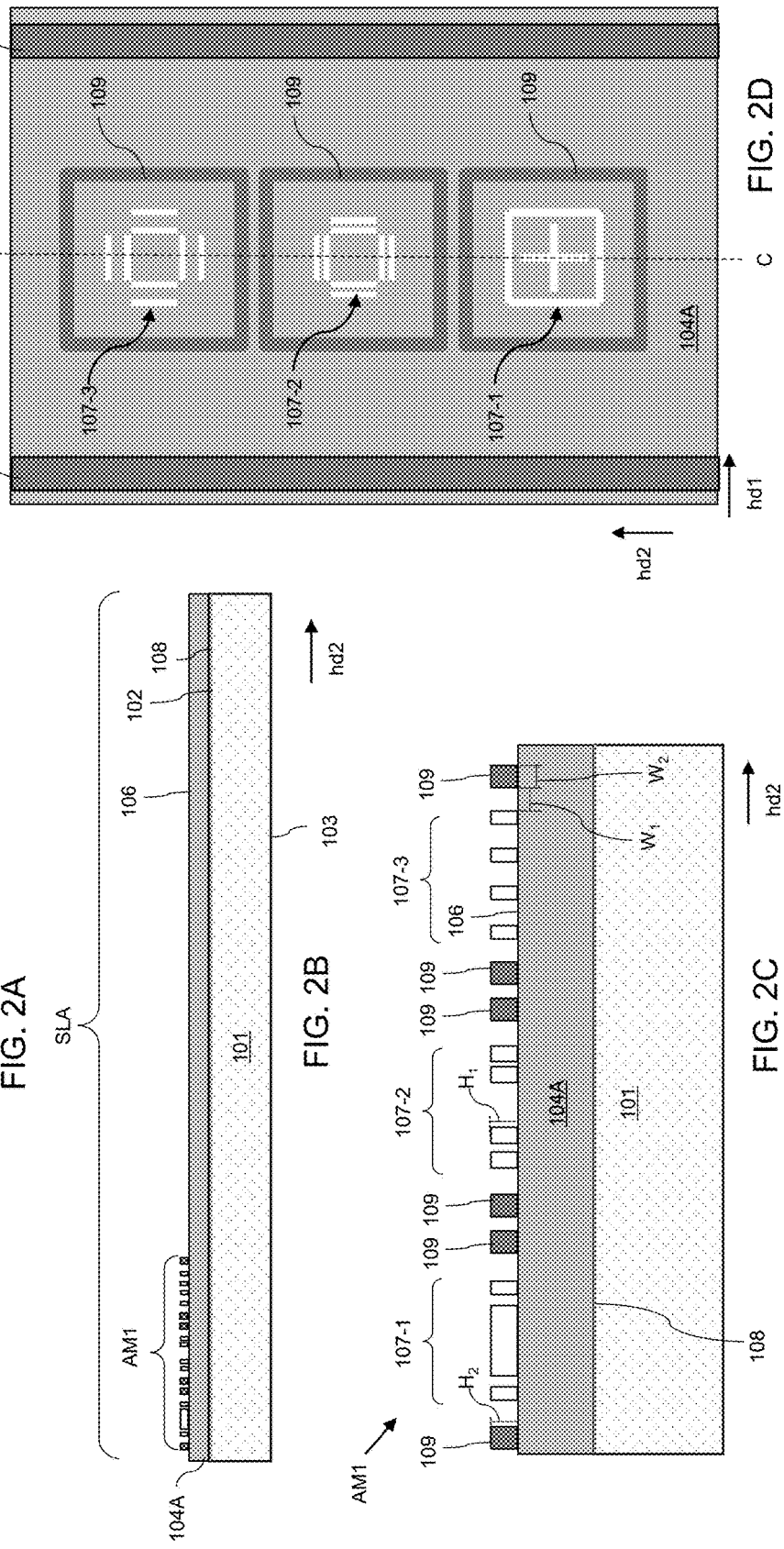
FIG. 2A
FIG. 2B
FIG. 2C
FIG. 2D

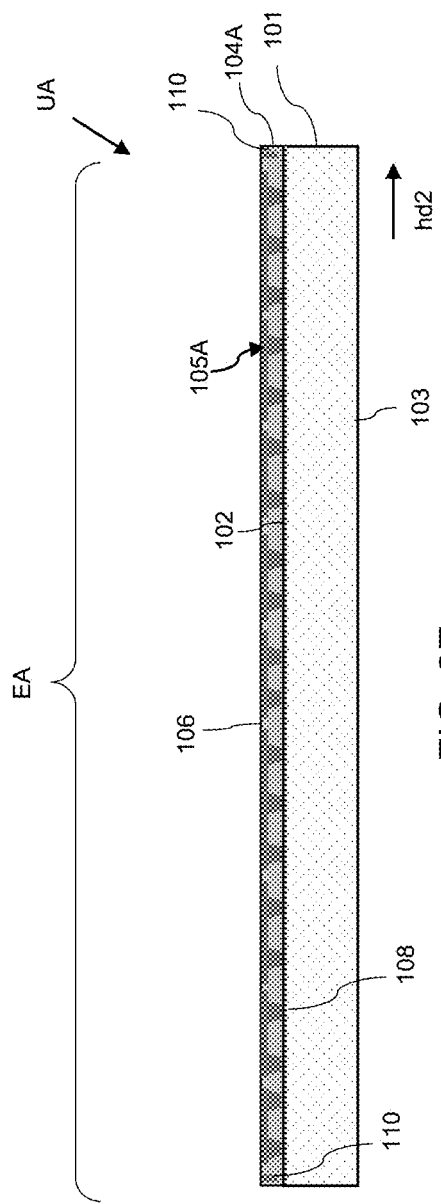

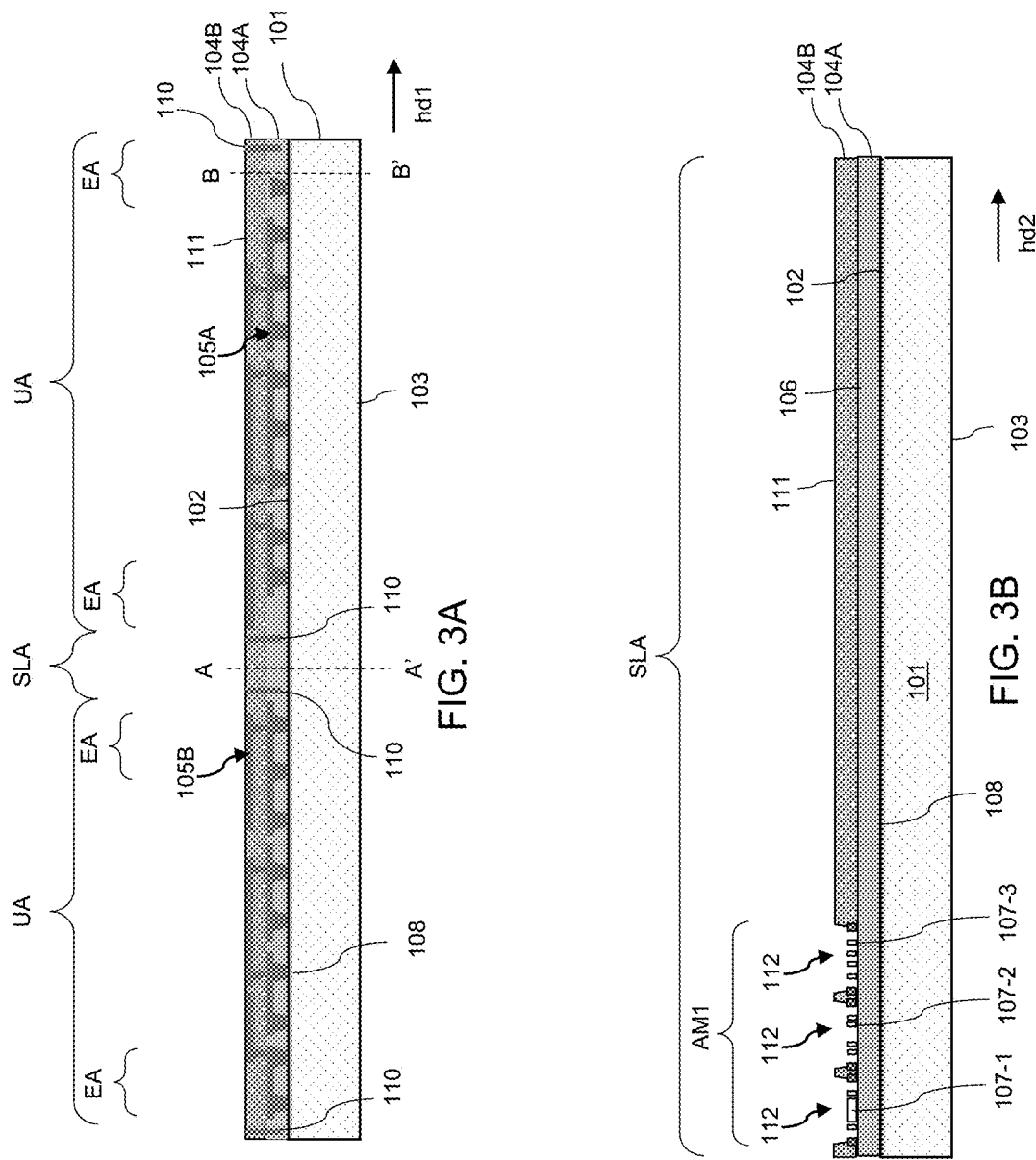

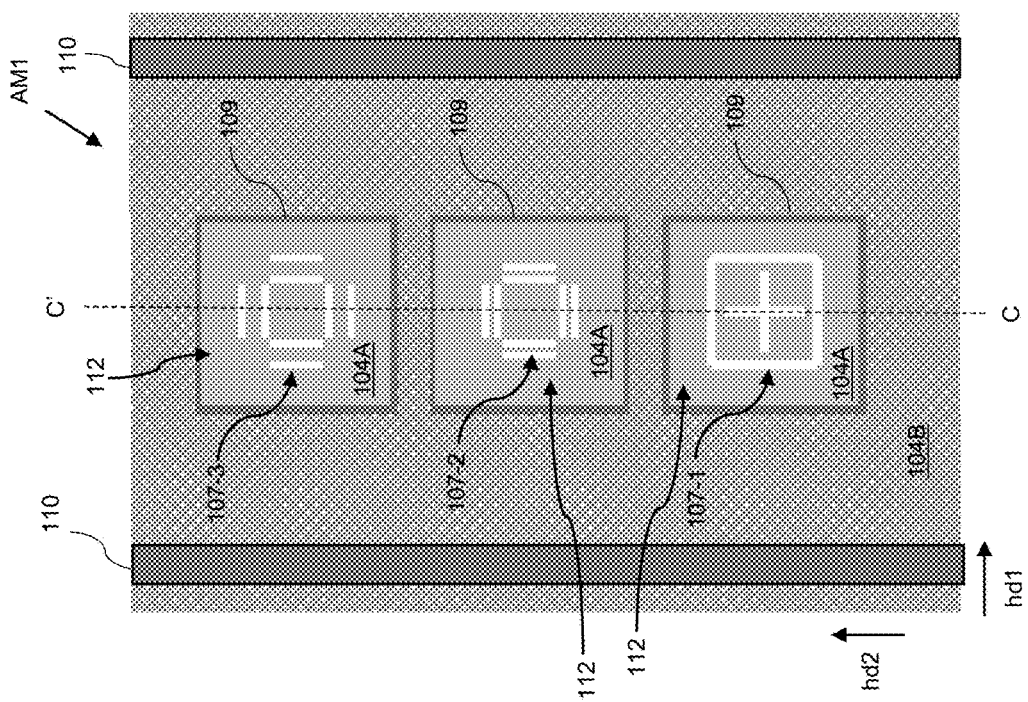
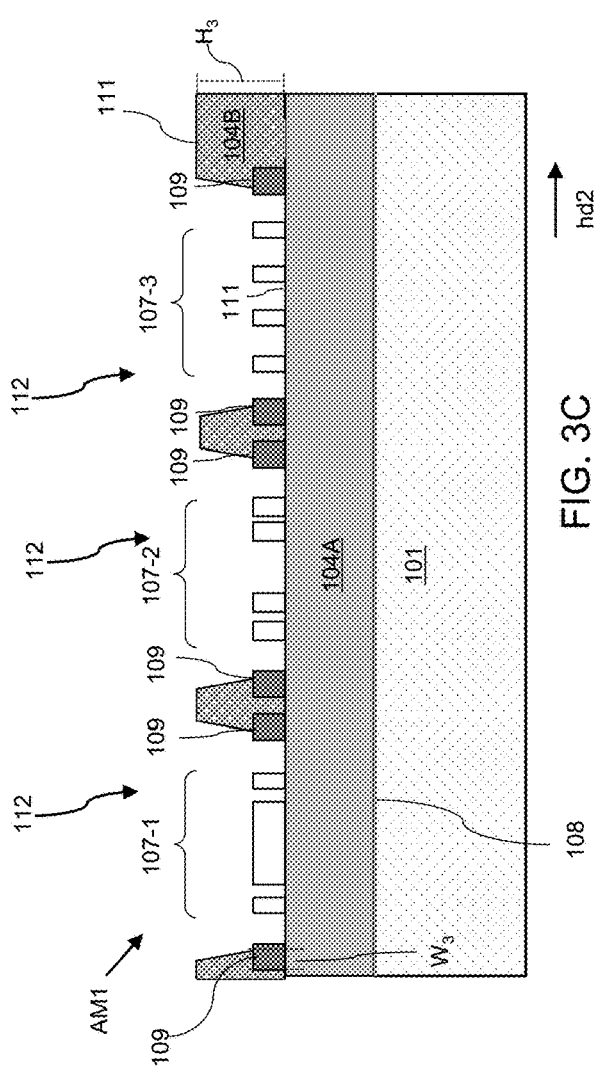
FIG. 3D
FIG. 3C

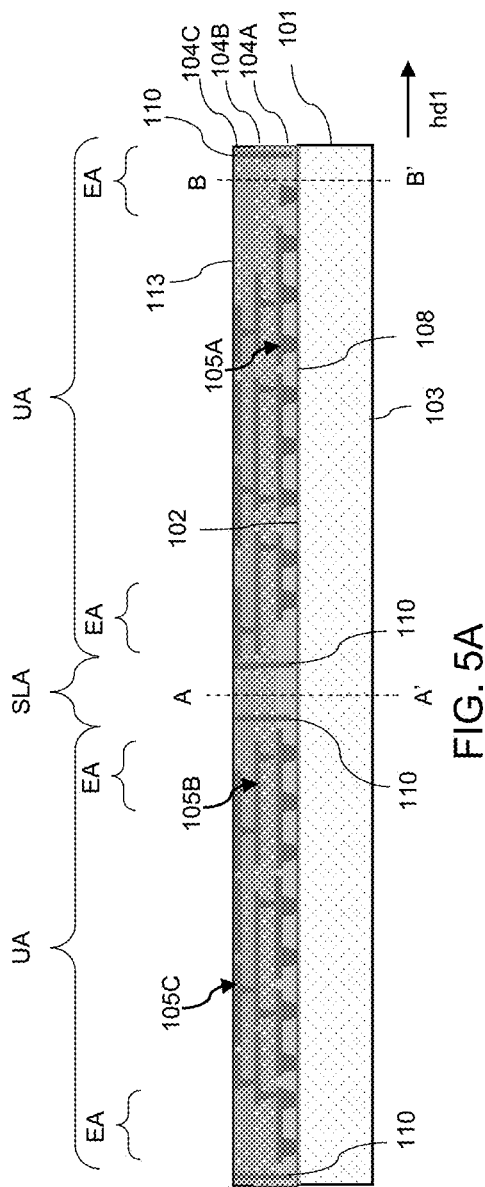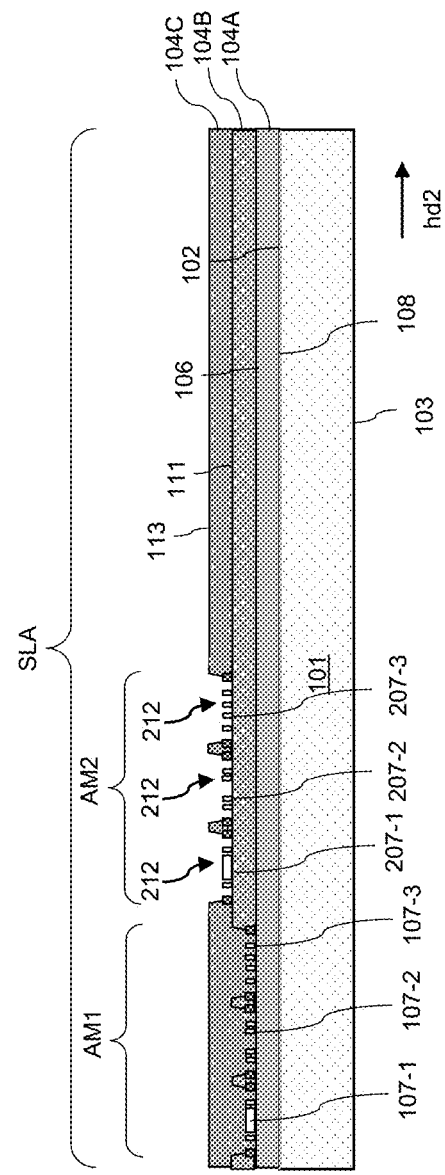

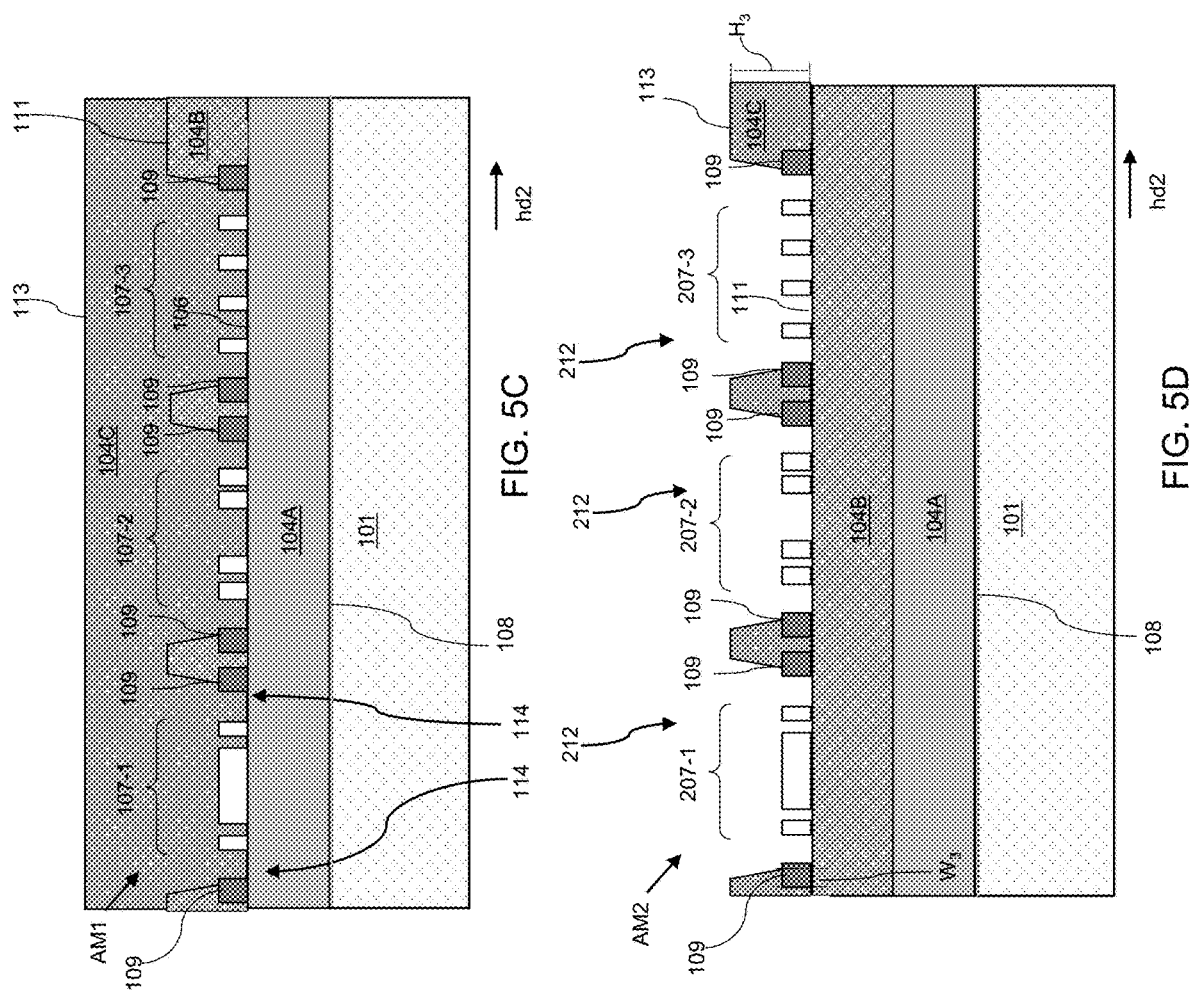

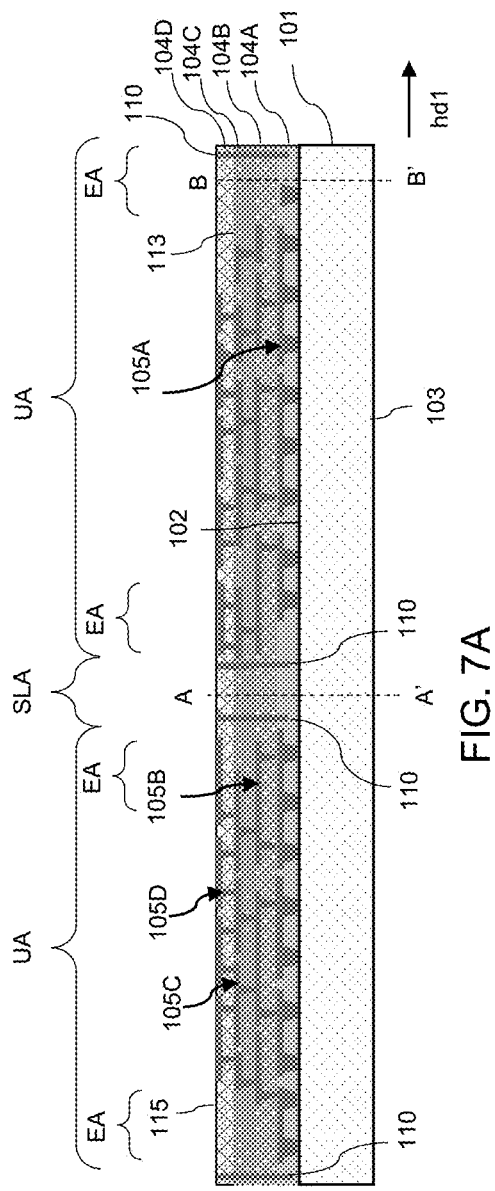
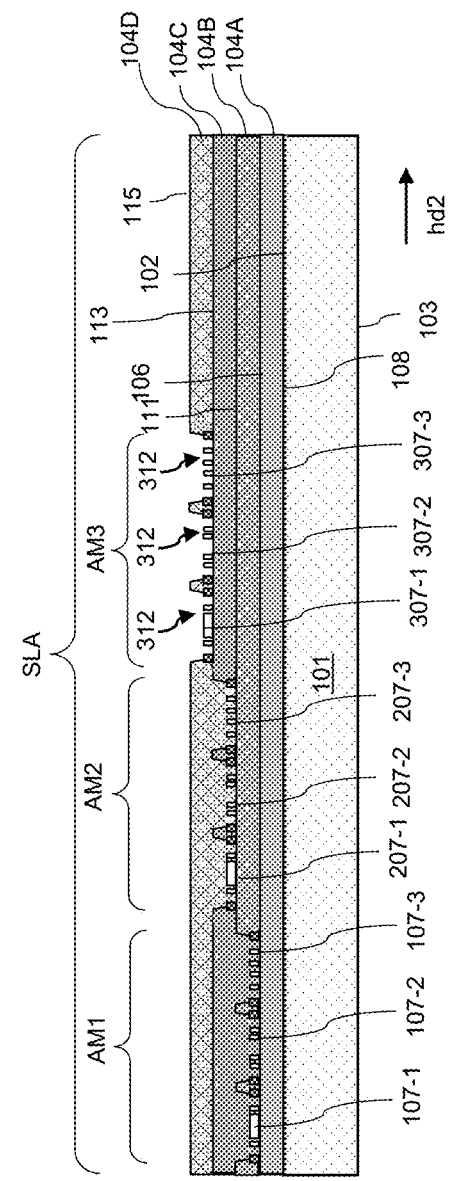
FIG. 7A
FIG. 7B

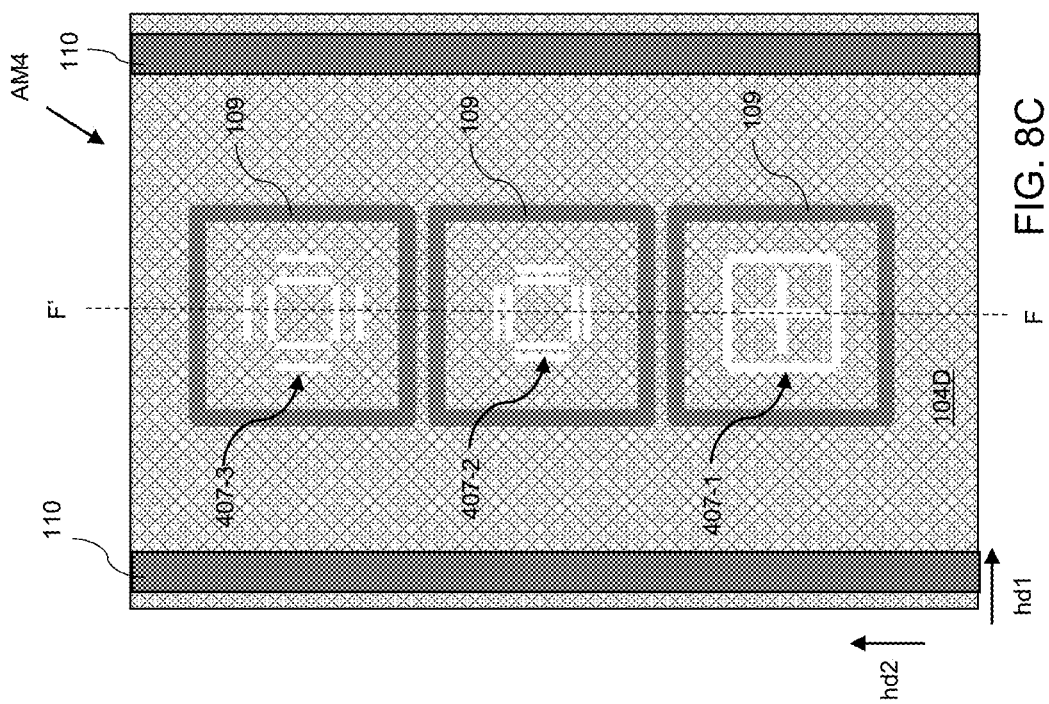
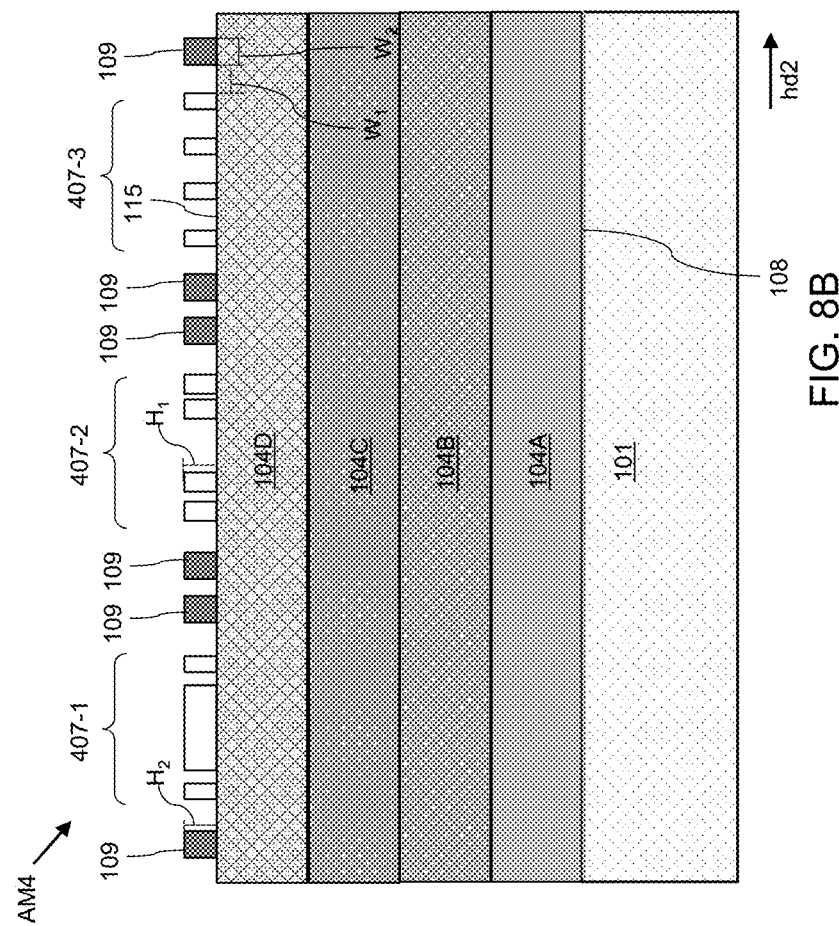
FIG. 8C
FIG. 8B

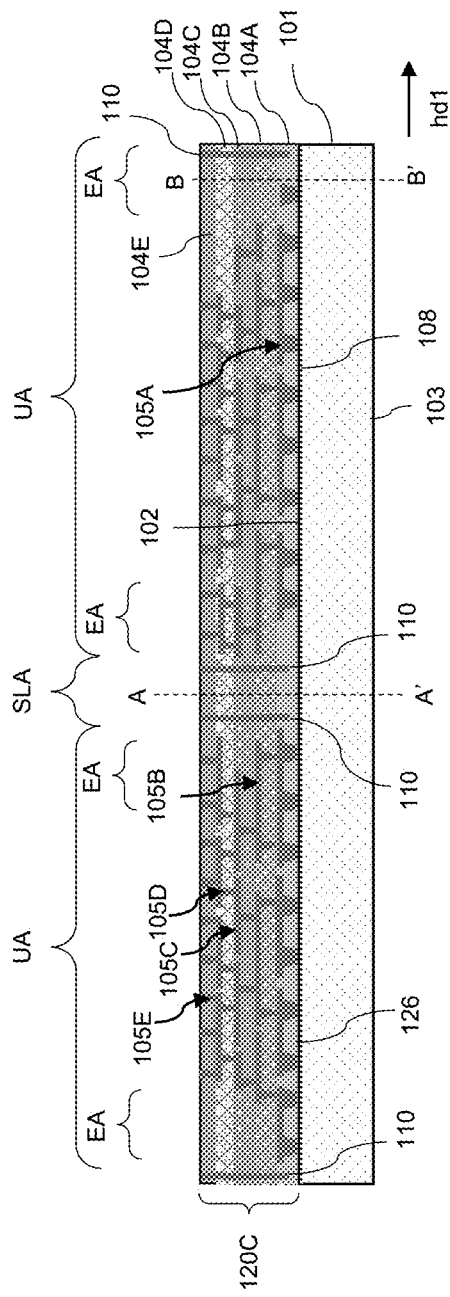
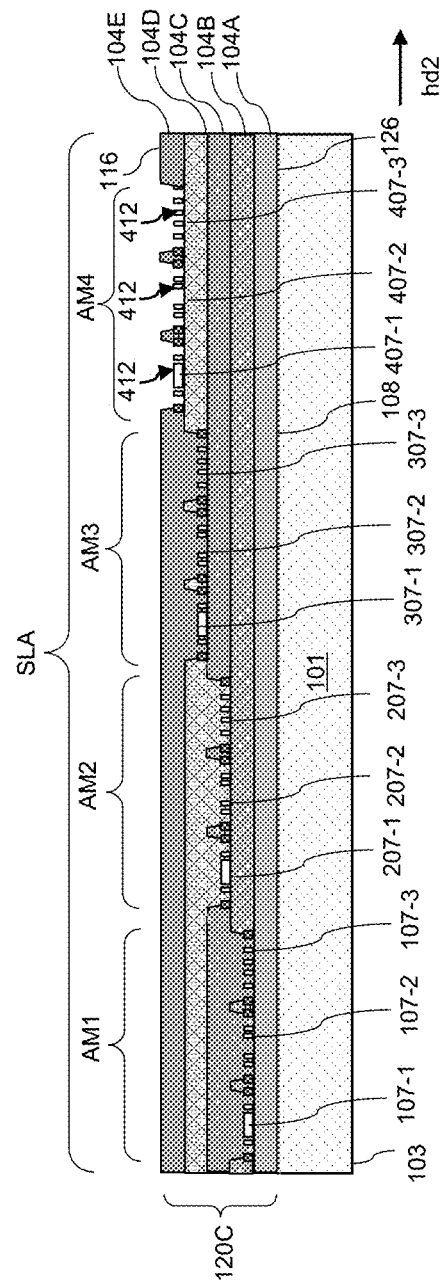
FIG. 9A
FIG. 9B

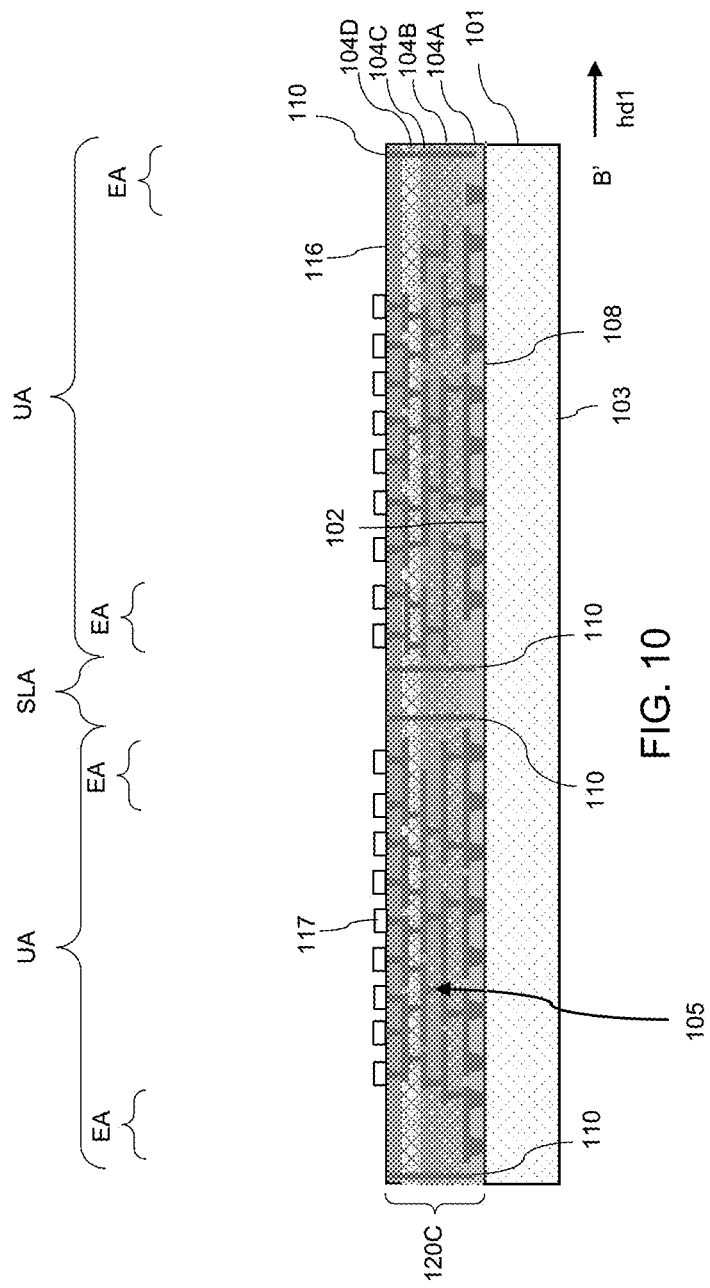

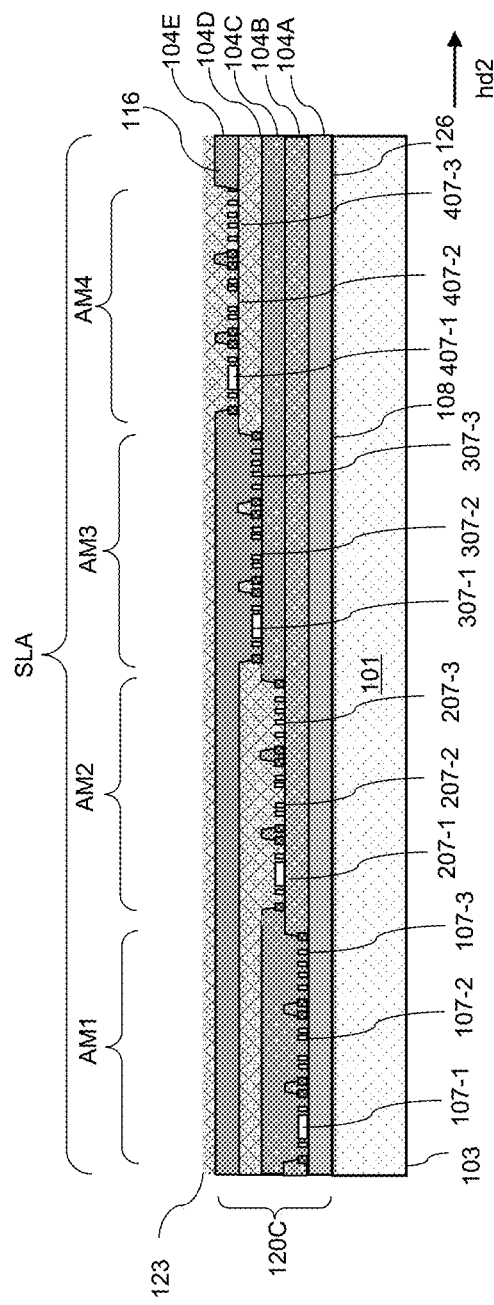
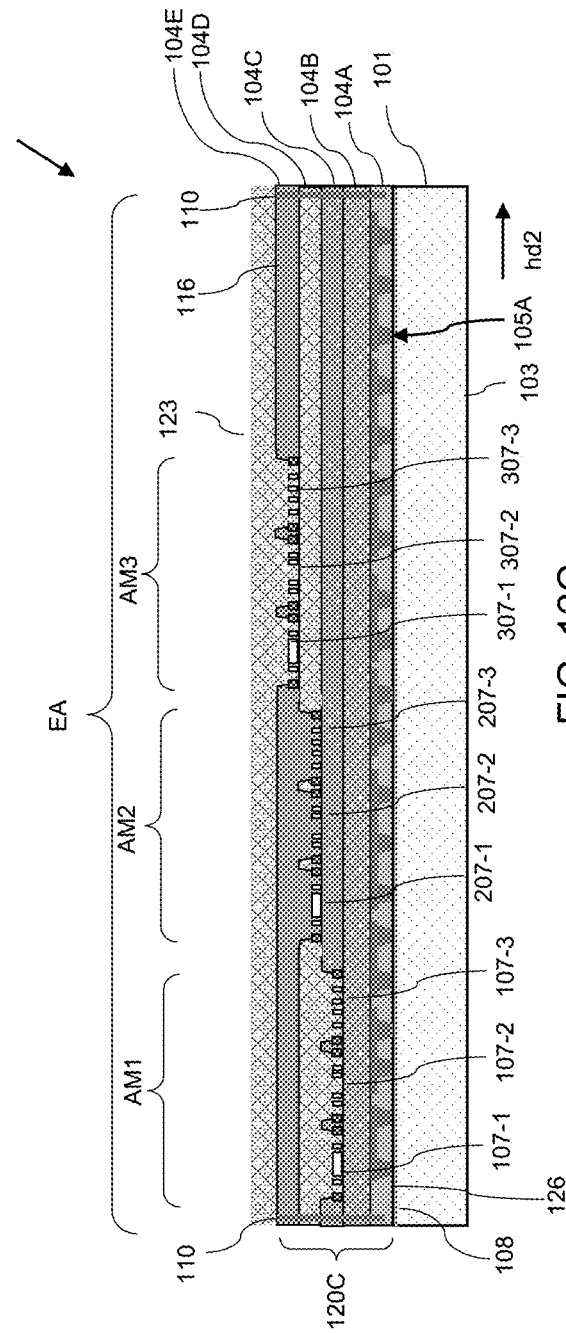
FIG. 12B
FIG. 12C

INTERPOSER STRUCTURE FOR SEMICONDUCTOR PACKAGE INCLUDING PERIPHERAL METAL PAD AROUND ALIGNMENT MARK AND METHODS OF FABRICATING SAME

BACKGROUND

Semiconductor devices are used in a variety of electronic applications. Some example uses may include personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, for example, in multi-chip modules, or in other types of packaging. However, as semiconductor packages have become more complex, ensuring mechanical integrity of the package has become more difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of an intermediate structure during a process of forming a semiconductor package including a first carrier substrate according to various embodiments of the present disclosure.

FIG. 1B is a vertical cross-sectional view of the intermediate structure along line A-A' in FIG. 1A according to various embodiments of the present disclosure.

FIG. 1C is a vertical cross-sectional view of the intermediate structure along line B-B' in FIG. 1A according to various embodiments of the present disclosure.

FIG. 2A is a vertical cross-sectional view of the intermediate structure during a process of forming a semiconductor package illustrating a first dielectric material layer and first redistribution structures over a first surface of the first carrier substrate according to various embodiments of the present disclosure.

FIG. 2B is a vertical cross-sectional view of the intermediate structure along line A-A' in FIG. 2A illustrating a first plurality of alignment marks and peripheral metal pads over the first dielectric material layer in a first alignment mark region of a scribe line area according to various embodiments of the present disclosure.

FIG. 2C is a vertical cross-sectional view of the intermediate structure showing an enlarged view of the first alignment mark region in the scribe line area including the first plurality of alignment marks and peripheral metal pads according to various embodiments of the present disclosure.

FIG. 2D is a top view of the first alignment mark region in the scribe line area shown in FIG. 2C according to various embodiments of the present disclosure.

FIG. 2E is a vertical cross-sectional view of the exemplary intermediate structure along line B-B' in FIG. 2A illustrating the first dielectric material layer and first redistribution structures over the first surface of the first carrier substrate in an in-chip die edge area according to various embodiments of the present disclosure.

FIG. 3A is a vertical cross-sectional view of the intermediate structure during a process of forming a semiconductor package illustrating a second dielectric material layer and second redistribution structures over the first dielectric material layer and first redistribution structures according to various embodiments of the present disclosure.

FIG. 3B is a vertical cross-sectional view of the intermediate structure along line A-A' in FIG. 3A illustrating recesses through the second dielectric material layer exposing the first plurality of alignment marks in the first alignment mark region of the scribe line area according to various embodiments of the present disclosure.

FIG. 3C is a vertical cross-sectional view of the intermediate structure showing an enlarged view of the first alignment mark region in the scribe line area including the recesses through the second dielectric layer exposing the first plurality of alignment marks according to various embodiments of the present disclosure.

FIG. 3D is a top view of the first alignment mark region in the scribe line area shown in FIG. 3C according to various embodiments of the present disclosure.

FIG. 5A is a vertical cross-sectional view of the intermediate structure during a process of forming a semiconductor package illustrating a third dielectric material layer and third redistribution structures over the second dielectric material layer and second redistribution structures according to various embodiments of the present disclosure.

FIG. 5B is a vertical cross-sectional view of the intermediate structure along line A-A' in FIG. 5A illustrating the third dielectric material layer over the first plurality of alignment marks in the first alignment mark region of the scribe line area and recesses through the third dielectric material layer exposing the second plurality of alignment marks in the second alignment mark region of the scribe line area according to various embodiments of the present disclosure.

FIG. 5C is a vertical cross-sectional view of the intermediate structure showing an enlarged view of the first alignment mark region in the scribe line area illustrating the third dielectric material layer over the first plurality of alignment marks and over the upper surface and side surfaces of the second dielectric material layer and the upper surface of the first dielectric material layer according to various embodiments of the present disclosure.

FIG. 5D is a vertical cross-sectional view of the intermediate structure showing an enlarged view of the second alignment mark region in the scribe line area including the recesses through the third dielectric layer exposing the second plurality of alignment marks according to various embodiments of the present disclosure.

FIG. 7A is a vertical cross-sectional view of the intermediate structure during a process of forming a semiconductor package illustrating a fourth dielectric material layer and fourth redistribution structures over the third dielectric material layer and third redistribution structures according to various embodiments of the present disclosure.

FIG. 7B is a vertical cross-sectional view of the intermediate structure along line A-A' in FIG. 7A illustrating the fourth dielectric material layer over the second plurality of alignment marks in the second alignment mark region of the scribe line area and recesses through the fourth dielectric material layer exposing the third plurality of alignment marks in the third alignment mark region of the scribe line area according to various embodiments of the present disclosure.

FIG. 8B is a vertical cross-sectional view of the intermediate structure showing an enlarged view of the fourth alignment mark region in the scribe line area including the fourth plurality of alignment marks and peripheral metal pads over the fourth dielectric material layer according to various embodiments of the present disclosure.

FIG. 8C is a top view of the fourth alignment mark region in the scribe line area shown in FIG. 8B according to various embodiments of the present disclosure.

FIG. 9A is a vertical cross-sectional view of the intermediate structure during a process of forming a semiconductor package illustrating a top dielectric material layer and top redistribution structures formed over the fourth dielectric material layer and fourth redistribution structures to provide a continuous interposer structure according to various embodiments of the present disclosure.

FIG. 9B is a vertical cross-sectional view of the intermediate structure along line A-A' in FIG. 9A illustrating the top dielectric material layer over the third plurality of alignment marks in the third alignment mark region of the scribe line area and recesses through the top dielectric material layer exposing the fourth plurality of alignment marks in the fourth alignment mark region of the scribe line area according to various embodiments of the present disclosure.

FIG. 10 is a vertical cross-sectional view of the intermediate structure during a process of forming a semiconductor package illustrating a plurality of interposer bonding structures formed over the upper surface the continuous interposer structure according to various embodiments of the present disclosure.

FIG. 12B is a vertical cross-sectional view of the intermediate structure along line A-A' in FIG. 12A illustrating the first underfill material portion over the fourth plurality of alignment marks in the fourth alignment mark region of the scribe line area according to various embodiments of the present disclosure.

FIG. 12C is a vertical cross-sectional view of the intermediate structure along line B-B' in FIG. 12A illustrating the first underfill material portion over the third plurality of alignment marks in the third alignment mark region of the in-chip die edge area according to various embodiments of the present disclosure.

DETAILED DESCRIPTION

Figure 3E:
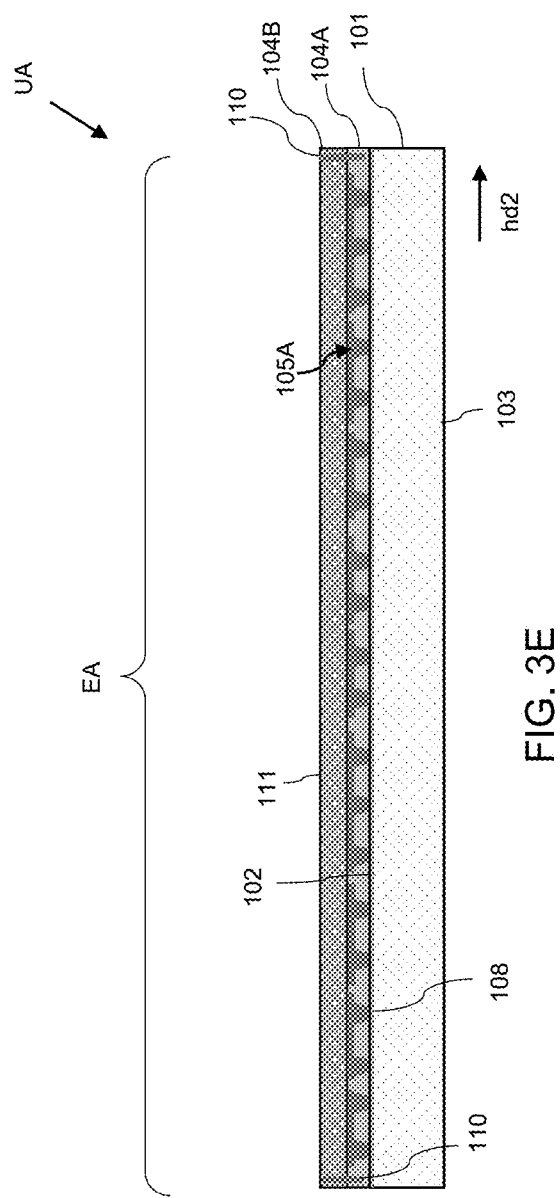
FIG. 3E is a vertical cross-sectional view of the intermediate structure along line B-B' in FIG. 3A illustrating the second dielectric material layer over the first dielectric material layer and first redistribution structures in the in-chip die edge area according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein may be directed to semiconductor packages, and in particular to interposers for semiconductor packages and methods of fabricating interposers for semiconductor packages.

Typically, in a semiconductor package a number of semiconductor integrated circuit (IC) dies (i.e., "chips") may be mounted onto a common substrate, which may also be referred to as a "package substrate." In some packages, such as in a fan out wafer level package (FOWLP) and/or fan-out panel level package (FOPLP), a plurality of semiconductor IC dies may be mounted to an interposer including conductive interconnect structures (e.g., metal lines and vias) extending therethrough. The resulting package structure, including the interposer and the semiconductor IC dies mounted thereon, may then be mounted onto a surface of a package substrate using solder connections.

The interposer of the semiconductor package structure may be an organic interposer including conductive interconnect structures formed in and surrounded by a dielectric material matrix. The organic interposer may be formed by sequentially depositing layers of a dielectric material, such as a dielectric polymer material, over a supporting substrate (e.g., a carrier substrate), and lithographically-patterning and etching each layer to form open regions (e.g., recesses, trenches and/or via openings). A metallization process may then be used to fill the open regions and form the conductive interconnect structures within each successive layer of dielectric material. In this manner, the interposer may be built layer-by-layer over the supporting substrate. A plurality of organic interposers may be formed on a common supporting substrate, and individual organic interposers may subsequently be singulated (e.g., diced) to form a package structure that may be mounted to a package substrate to form a semiconductor package.

Fabrication of an organic interposer may be relatively complex process involving multiple lithographic patterning steps requiring a high degree of precision and proper alignment and registration to form the conductive interconnect structures extending through the various dielectric material layers of the interposer. To facilitate lithographic processing of the in-progress interposer, visible alignment marks may be formed in one or more regions of the dielectric layers that do not contain conductive interconnect structures, such as along the peripheral edges of the interposers or within the scribe line areas between adjacent interposers. However, the alignment marks may produce weak spots in the stacked dielectric layers that may be prone to cracking when subjected to thermal and/or mechanical stress. Such cracking may result in interposer defects such as abnormal metal plating and/or die saw chipping which may reduce yields and increase costs.

In order to inhibit cracking in the stacked dielectric layers near the locations of alignment marks during the interposer fabrication process, a metal pad structure may be formed around the periphery of each of the alignment marks. In various embodiments disclosed herein, an alignment mark structure and a peripheral metal pad structure surrounding the alignment mark structure may be formed over a first dielectric material layer. A second dielectric material layer may be formed over the first dielectric material layer and over the alignment mark structure and the peripheral metal pad structure. An open region may be formed through the second dielectric material layer to expose the alignment mark structure and the upper surface of the first dielectric material layer at the bottom of the opening, where the upper surface of the peripheral metal pad structure may be at least partially covered by the second dielectric material layer. The exposed alignment mark structure at the bottom of the open region may facilitate the lithographic patterning of the second dielectric material layer to form conductive interconnect structures (also referred to as "redistribution structures") within and through the second dielectric material layer. In some embodiments, a third dielectric material layer may be subsequently deposited over the second dielectric material layer and within the open region in the second dielectric material layer, where the third dielectric material layer may contact the alignment mark structure, the upper surface of the first dielectric material, and optionally a portion of the upper surface and a side surface of the peripheral metal pad structure. In various embodiments, the peripheral metal pad structure may increase the adhesion between the portions of the first dielectric material layer, second dielectric material layer and third dielectric material layer that converge around the alignment mark structure, which may help to increase the strength of the dielectric material layer stack (i.e., first dielectric material layer, second dielectric material layer and third dielectric material layer) and reduce the likelihood of crack formation through the various dielectric material layers of the interposer.

As used herein, an "alignment mark structure" may include all or any portion of an alignment mark formed during a process of fabricating an interposer that remains present in the finished interposer. For example, an alignment mark structure may be a complete alignment mark or may be a portion of an alignment mark that remains present in a first interposer following a singulation (e.g., dicing) process used to separate the first interposer from an adjacent structure, such as one or more second interposers formed with the first interposer on a common substrate. Similarly, a "peripheral metal pad structure" includes all or any portion of a peripheral metal pad extending around the periphery of an alignment mark formed during a process of fabricating an interposer that remains present in the finished interposer. For example, a peripheral metal pad structure may be a complete peripheral metal pad surrounding an alignment mark or may be a portion of a peripheral metal pad partially surrounding the remaining portion of an alignment mark that remains present in a first interposer following a singulation (e.g., dicing) process used to separate the first interposer from an adjacent structure, such as one or more second interposers formed with the first interposer on a common substrate.

FIG. 1A is a vertical cross-sectional view of an intermediate structure during a process of forming a semiconductor package including a first carrier substrate 101 according to various embodiments of the present disclosure. FIG. 1B is a vertical cross-sectional view of the exemplary intermediate structure along line A-A' in FIG. 1A according to various embodiments of the present disclosure. FIG. 1C is a vertical cross-sectional view of the exemplary intermediate structure along line B-B' in FIG. 1A according to various embodiments of the present disclosure.

Referring to FIGS. 1A-1C, the first carrier substrate 101 may include a first surface 102 (also referred to as a top surface 102) and a second surface 103 (also referred to as a bottom surface 103) opposite the first surface 102. The first carrier substrate 101 may be formed of a suitable substrate material, such as glass material, a ceramic material (e.g., a sapphire substrate), a semiconductor material (e.g., a silicon substrate), or the like. Other suitable materials for the first carrier substrate 101 are within the contemplated scope of disclosure. In some embodiments, the first carrier substrate 101 may be formed of an optically transparent material.

The first carrier substrate 101 may include at least one unit area (UA) corresponding to the location in which an interposer may be subsequently formed. In various embodiments, the first carrier substrate 101 may include a plurality or array of UAs, where a single instance of an interposer may be formed in each UA of the plurality or array of UAs. In the embodiment illustrated in FIG. 1A, the first carrier substrate 101 includes two UAs, although it will be understood that the first carrier substrate 101 may include more than two UAs. In some embodiments, the first carrier substrate 101 may include a two-dimensional rectangular array of UAs, each corresponding to the location of an interposer to be subsequently formed.

Referring again to FIGS. 1A-1C, the area between adjacent UAs of the first carrier substrate 101 may be referred to as scribe line areas (SLAs). FIGS. 1A and 1B illustrate a single scribe line area (SLA) between adjacent UAs along a first horizontal direction hd1, although it will be understood that the first carrier substrate 101 may include a plurality of SLAs, including a continuous matrix of SLAs extending around and between each of the UA of the first carrier substrate 101. Areas within each UA along a peripheral edge of the UA may be referred to as in-chip die edge areas (EAs).

In some embodiments, a first release layer 108 may optionally be located over the first side 102 of the first carrier substrate 101. The first release layer 108 may include an adhesive material that may adhere the subsequently-formed interposers to the first side 102 of the first carrier substrate 101. In some embodiments, the first release layer 108 may include an adhesive material that may be subsequently treated to cause the adhesive material of the first release layer 108 lose its adhesive properties, such that the first carrier substrate 101 may be separated from the interposers. In some embodiments, the adhesive material of the first release layer 108 may lose its adhesive properties when subjected to treatment using an energy source, such as a thermal, optical (e.g., UV, laser, etc.) and/or sonic (e.g., ultrasonic) energy source. In one non-limiting example, the first release layer 108 may include a light-to-heat conversion (LTHC) material that may selectively absorb optical radiation in certain wavelength range(s), such as ultraviolet radiation, causing the LTHC material to heat up and thereby lose adhesion. In other embodiments in which the first carrier substrate 101 is formed of an optically transparent material, the application of an optical energy source may cause the first release layer 108 to lose its adhesive property. Alternatively, the first release layer 108 may include an adhesive material, such as an acrylic pressure-sensitive adhesive material, that may decompose when subjected to an elevated temperature. Other suitable materials for the first release layer 108 are within the contemplated scope of disclosure.

FIG. 2A is a vertical cross-sectional view of the intermediate structure during a process of forming a semiconductor package illustrating a first dielectric material layer 104A and first redistribution structures 105A over the first surface 102 of the first carrier substrate 101 according to various embodiments of the present disclosure. FIG. 2B is a vertical cross-sectional view of the intermediate structure along line A-A' in FIG. 2A illustrating a first plurality of alignment marks 107-1, 107-2 and 107-3 and peripheral metal pads 109 over the first dielectric material layer 104A in a first alignment mark region AM1 of a scribe line area SLA according to various embodiments of the present disclosure. FIG. 2C is a vertical cross-sectional view of the exemplary intermediate structure showing an enlarged view of the first alignment mark region AM1 in the scribe line area SLA including the first plurality of alignment marks 107-1, 107-2 and 107-3 and peripheral metal pads 109 according to various embodiments of the present disclosure. FIG. 2D is a top view of the first alignment mark region in the scribe line area shown in FIG. 2C according to various embodiments of the present disclosure, where the vertical cross-sectional view in FIG. 2C is taken along line C-C' in FIG. 2D. FIG. 2E is a vertical cross-sectional view of the exemplary intermediate structure along line B-B' in FIG. 2A illustrating the first dielectric material layer 104A and first redistribution structures 105A over the first surface 102 of the first carrier substrate 101 in an in-chip die edge area EA according to various embodiments of the present disclosure.

Referring to FIGS. 2A-2E, the first dielectric material layer 104A may include a suitable dielectric material. In various embodiments, the first dielectric material layer 104A may include a dielectric polymer material, such as polyimide (PI), benzocyclobutene (BCB), or polybenzobisoxazole (PBO). Other suitable dielectric materials are within the contemplated scope of disclosure. The first dielectric material layer 104A may be deposited over the first surface 102 of the first carrier substrate 101 (or, if present, over the first release layer 108) using a suitable deposition process, such as a spin coating and drying process. Other suitable deposition processes are within the contemplated scope of disclosure. The thickness of first dielectric material layer 104A may be in a range from 2 μm to 40 μm, such as from 4 μm to 20 μm, although greater and lesser thicknesses are within the contemplated scope of disclosure.

Referring to FIGS. 2A and 2E, within each of the UAs, the first dielectric material layer 104A may be patterned, for example, by applying and patterning a respective photoresist layer over the upper surface 106 of the first dielectric material layer 104A, and by transferring the pattern in the photoresist layer into the first dielectric material layer 104A using an etch process such as an anisotropic etch process. The etch process may provide a plurality of open regions, including trenches and via openings, within the first dielectric material layer 104A. Following the etch process, the photoresist layer may be removed using a suitable process, such as by ashing or dissolution using a solvent.

Alternatively, the first dielectric material layer 104A may include a photosensitive material that may be exposed through a patterned mask to transfer the mask pattern directly to the dielectric material layer 104A. An etch process may then be used to form the plurality of open regions, including trenches and via openings, within the first dielectric material layer 104A.

The first redistribution structures 105A may be formed by providing a conductive material within the plurality of open regions (i.e., trenches and vias) formed in the first dielectric material layer 104A. Suitable conductive materials for the first redistribution structures may include a metallic material, such as Cu, Ni, W, Cu, Co, Mo, Ru, etc., including alloys and combinations of the same. In some embodiments, the first redistribution structures 105A may include a metallic barrier layer, such as a layer of Ti, TiN, TaN, or WN, contacting the first dielectric material layer 104A, and a metallic fill material, which may include an elemental metal (e.g., Cu, Ni, etc.) or an alloy or a combination thereof, over the metallic barrier layer. Other suitable metallic barrier and metallic fill materials for the first redistribution structures 105A are within the contemplated scope of disclosure. The first redistribution structures 105A may be formed by depositing a metallic material over the upper surface 106 of the first dielectric material layer 104A and within the open regions in the first dielectric material layer 104A using a suitable deposition process, such as, for example, physical vapor deposition (PVD), sputtering, chemical vapor deposition (CVD), atomic layer deposition (ALD), plasma-enhanced chemical vapor deposition (PECVD), electrochemical deposition (e.g., electroplating), or combinations thereof. Portions of the metallic material may be removed from over the upper surface 106 of the first dielectric material layer 104A via a planarization process (e.g., chemical mechanical planarization (CMP)) and/or an etching process. The remaining portion of the metallic material may form the first redistribution structures 105A embedded within the first dielectric material layer 104A. In some embodiments, a portion of the metallic material may form a lower portion of a seal ring 110 that may extend around the periphery of the first redistribution structures 105A within each of the UAs, as shown in FIGS. 2A, 2D and 2E.

Referring to FIGS. 2B-2D, a first plurality of alignment marks 107-1, 107-2 and 107-3 and peripheral metal pads 109 may be formed over upper surface 106 of the first dielectric material layer 104A in a first alignment mark region (AM1) of the SLA. The first plurality of alignment marks 107-1, 107-2 and 107-3 and peripheral metal pads 109 may be adjacent to one another along a second horizontal direction hd2 that is orthogonal to the first horizontal direction hd1. In various embodiments, the first plurality of alignment marks 107-1, 107-2 and 107-3 and the peripheral metal pads 109 may be formed of a conductive material, such as a metallic material as described above with reference to FIGS. 2A and 2B. In some embodiments, the first redistribution structures 105A, the first plurality of alignment marks 107-1, 107-2 and 107-3 and the peripheral metal pads 109 may be formed of the same metallic materials (in some embodiments, the same metallic liner and metallic fill materials). In other embodiments, the metallic materials for each of the first redistribution structures 105A, the first plurality of alignment marks 107-1, 107-2 and 107-3 and the peripheral metal pads 109 may be different from one another. In still other embodiments, some of the metallic materials may be the same, while others are different. For example, in such other embodiments, the first redistribution structures 105A and the first plurality of alignment marks 107-1, 107-2 and 107-3 may be formed of the same metallic materials, while the peripheral metal pad 109 may be formed of a different metallic material. In some embodiments, the first plurality of alignment marks 107-1, 107-2 and 107-3 and the peripheral metal pads 109 may all be formed of the same metallic material, such as copper, nickel or a copper-nickel stack. Other suitable materials for the alignment marks 107-1, 107-2 and 107-3 and the peripheral metal pads 109 are within the contemplated scope of disclosure.

As noted above, in some embodiments, the metallic material deposited over the upper surface 106 of the first dielectric material layer 104A and within the open regions in the first dielectric material layer 104A to form the first redistribution structures 105A within the UAs of the intermediate structure may also be used to form the first plurality of alignment marks 107-1, 107-2 and 107-3 and the peripheral metal pads 109 in the AM1 of the SLA. The metallic material may be patterned, for example, by applying and patterning a respective photoresist layer over the upper surface of the metallic material, and by transferring the pattern in the photoresist layer into the metallic material using an etch process such as an anisotropic etch process to form the first plurality of alignment marks 107-1, 107-2 and 107-3 and the peripheral metal pads 109 in the AM1 of the SLA. Following the etch process, the photoresist layer may be removed using a suitable process, such as by ashing or dissolution using a solvent.

Alternatively, the first plurality of alignment marks 107-1, 107-2 and 107-3 and the peripheral metal pads 109 in the SLA and the first redistribution structures 105A in the UAs may be formed of different metallic materials. For example, a first metallic material may be deposited over the upper surface 106 of the first dielectric material layer 104A and within the open regions in the first dielectric material layer 104A using a suitable deposition process as described above to form the first redistribution structures 105A within the UAs of the intermediate structure, and a second metallic material may be deposited over the upper surface 106 of the first dielectric material layer 104A within the AM1 of the SLA in a separate deposition process. The second metallic material may be patterned as described above to form the first plurality of alignment marks 107-1, 107-2 and 107-3 and the peripheral metal pads 109 in the AM1 of the SLA.

In still further embodiments, the first plurality of alignment marks 107-1, 107-2 and 107-3 and the peripheral metal pads 109 and the first redistribution structures 105A may be formed of the same metallic material (e.g., copper, nickel, etc.) that may be deposited in separate deposition steps. For example, a metallic material may be deposited over the upper surface 106 of the first dielectric material layer 104A and within the open regions in the first dielectric material layer 104A using a suitable deposition process as described above to form the first redistribution structures 105A within the UAs of the intermediate structure, and the same metallic material may be deposited over the upper surface 106 of the first dielectric material layer 104A within the AM1 of the SLA in a separate deposition process. The metallic material may be patterned as described above to form the first plurality of alignment marks 107-1, 107-2 and 107-3 and the peripheral metal pads 109 in the AM1 of the SLA.

Referring to FIGS. 2B-2D, the alignment marks 107-1, 107-2 and 107-3 may each be in the form of a pattern that may be used as a reference for subsequent lithographic patterning steps. For example, when forming additional features, such as additional redistribution structures, over the first dielectric material layer 104A and the first redistribution structures 105A within the UAs of the intermediate structure, the alignment marks 107-1, 107-2 and 107-3 may facilitate proper alignment and registration of the photolithography equipment used to form the additional features over previously-fabricated features (e.g., first redistribution structures 105A) of the intermediate structure. The pattern(s) of the alignment marks 107-1, 107-2 and 107-3 may be readily identifiable and distinguishable from other features of the exemplary intermediate structure, either visually by an operator (with or without optical magnification) and/or via an automated optical recognition system. In various embodiments, the alignment marks 107-1, 107-2 and 107-3 may be located in region(s) of the exemplary intermediate structure that will not affect subsequent processing steps or interposer performance. Thus, in the embodiment shown in FIGS. 2A-2E, the alignment marks 107-1, 107-2 and 107-3 are located over the first dielectric material layer 104A in the SLA between adjacent UAs, and there are no alignment marks over the first dielectric material layer 104A within the in-chip die EAs because alignment marks in these areas would interfere with the first redistribution structures 105A as shown in FIGS. 2A and 2E. In other embodiments, alignment marks may be provided within the in-chip die EAs and/or in other locations within the UAs that do not affect subsequent processing steps or interposer performance. Further, although the embodiment shown in FIGS. 2B-2D includes three alignment marks 107-1, 107-2 and 107-3, each having different patterns, formed in the AM1 it will be understood that a greater or lesser number of alignment marks may be formed in the AM1, where the alignment marks may have the same or different patterns. In addition, although a single AM1 is illustrated in FIGS. 2B-2D, it will be understood that multiple incidents of the AM1 may be formed in different locations in the exemplary intermediate structure. For example, each of the SLAs between adjacent UAs and/or around the periphery of the UAs may include at least one instance of a AM1 as shown in FIGS. 2B-2D.

Referring to FIG. 2C, in various embodiments, the alignment marks 107-1, 107-2 and 107-3 in the AM1 in the SLA have height dimension $H_1$ with respect to the upper surface 106 of the first dielectric material layer 104A. The peripheral metal pads 109 have a height dimension $H_2$ with respect to the upper surface 106 of the first dielectric material layer 104A that may be greater than, less than, or equal to the height dimension $H_1$ of the alignment marks 107-1, 107-2 and 107-3. In some embodiments, the ratio of the height dimension of the peripheral metal pads 109 to the height dimension of the alignment marks 107-1, 107-2 and 107-3 (i.e., $H_2/H_1$) may be greater than or equal to 0.8 and less than or equal to 1.2. In some embodiments, the height dimension $H_2$ of the peripheral metal pads 109 may be greater than or equal to 1 µm and less than or equal to 10 µm, although lesser and greater height dimensions for the peripheral metal pads 109 are within the contemplated scope of disclosure.

Referring to FIGS. 2C and 2D, a peripheral metal pad 109 may surround the periphery of each of the alignment marks 107-1, 107-2 and 107-3 in the AM1 of the SLA. Each of the peripheral metal pads 109 may be offset from the respective alignment marks 107-1, 107-2 and 107-3 which the peripheral metal pad 109 surrounds, such that there is a minimum distance $W_1$ between the alignment marks 107-1, 107-2 and 107-3 and the surrounding peripheral metal pad 109. In some embodiments, 3 µm≤$W_1$≤10 µm. In various embodiments, the peripheral metal pads 109 may have a width dimension $W_2$ that is between about 5 µm and about 20 µm. In the embodiment shown in FIGS. 2B-2D, discrete peripheral metal pads 109 surround each of the alignment marks 107-1, 107-2 and 107-3. In other embodiments described further below, a continuous peripheral metal pad 109 may surround multiple alignment marks 107-1, 107-2 and 107-3, including all of the alignment marks 107-1, 107-2 and 107-3 within the AM1.

As described in further detail below, the peripheral metal pads 109 may increase the mechanical integrity of the interposer structure that is formed over the first carrier substrate 101. In particular, the peripheral metal pads 109 may be located at an interface region between the first dielectric material layer 104A and one or more additional material layers that may be subsequently formed around and/or over the alignment marks 107-1, 107-2 and 107-3 in the AM1. The peripheral metal pads 109 may help to promote adhesion between the different material layers in the AM1, and may also help to provide mechanical strength and minimize stress in the stacking interface between the various dielectric material layers, and inhibit cracks from forming in the AM1. This may result in fewer defects in the subsequently completed interposers and improved device yields.

FIG. 3A is a vertical cross-sectional view of the intermediate structure during a process of forming the semiconductor package illustrating a second dielectric material layer 104B and second redistribution structures 105B over the first dielectric material layer 104A and first redistribution structures 105A according to various embodiments of the present disclosure. FIG. 3B is a vertical cross-sectional view of the exemplary intermediate structure along line A-A' in FIG. 3A illustrating recesses 112 through the second dielectric material layer 104B exposing the first plurality of alignment marks 107-1, 107-2 and 107-3 in the AM1 of the SLA according to various embodiments of the present disclosure. FIG. 3C is a vertical cross-sectional view of the exemplary intermediate structure showing an enlarged view of the AM1 in the scribe line area SLA including the recesses 112 through the second dielectric layer 104B exposing the first plurality of alignment marks 107-1, 107-2 and 107-3 according to various embodiments of the present disclosure. FIG. 3D is a top view of the AM1 in the SLA shown in FIG. 3C according to various embodiments of the present disclosure, where the vertical cross-sectional view in FIG. 3C is taken along line C-C' in FIG. 3D. FIG. 3E is a vertical cross-sectional view of the intermediate structure along line B-B' in FIG. 3A illustrating the second dielectric material layer 104B over the first dielectric material layer 104A and first redistribution structures 105A in the in-chip die EA according to various embodiments of the present disclosure.

Referring to FIGS. 3A-3E, the second dielectric material layer 104B may include a suitable dielectric material as described above, such as a dielectric polymer material. In some embodiments, the second dielectric material layer 104B may have the same composition as the first dielectric material layer 104A. Alternatively, the second dielectric material layer 104B may have a different composition than the first dielectric material layer 104B. The second dielectric material layer 104B may be deposited over the upper surface of 106 of the first dielectric material layer 104A using a suitable deposition process, such as a spin coating and drying process. Within the UAs of the intermediate structure, the second dielectric material layer 104B may be deposited over the first redistribution structures 105A and the lower portions of the seal rings 110. Within the SLA of the intermediate structure shown in FIGS. 3A-3E, the second dielectric material layer 104B may be deposited over the alignment marks 107-1, 107-2 and 107-3 and the peripheral metal pads 109 in the AM1.

Referring to FIGS. 3B-3D, portions of the second dielectric material layer 104B may be removed from the SLA to expose the alignment marks 107-1, 107-2 and 107-3 in the AM1. In various embodiments, the second dielectric material layer 104B may be patterned, for example, by applying and patterning a respective photoresist layer over the upper surface 111 of the second dielectric material layer 104B, and by transferring the pattern in the photoresist layer into the second dielectric material layer 104B using an etch process such as an anisotropic etch process. The etch process may provide a plurality of recesses 112 through the second dielectric material layer 104B corresponding to the alignment marks 107-1, 107-2 and 107-3. An alignment mark 107-1, 107-2 and 107-3 may be exposed at the bottom of each of the recesses 112. In some embodiments, the peripheral metal pads 109 surrounding the respective alignment marks 107-1, 107-2 and 107-3 may be partially exposed within the respective recesses 112. A portion of the peripheral metal pads 109 may remain covered by second dielectric material layer 104B. Referring to FIG. 3C, the portion of the peripheral metal pads 109 that remains covered by the second dielectric material layer 104B may have a width dimension $W_3$. In some embodiments, the ratio of the portion of the upper surface of the peripheral metal pad 109 that remains covered by the second dielectric material layer to the total width dimension of the peripheral metal pad 109 (i.e., $W_3/W_2$) may be greater than or equal to 0.1 and less than or equal to 1.0. In some embodiments, described in further detail below, the peripheral metal pads 109 may be fully embedded within the second dielectric material layer 104B such that no portions of the peripheral metal pads 109 are exposed through the recesses 112 in the second dielectric material layer 104B. Following the etch process, the photoresist layer may be removed using a suitable process, such as by ashing or dissolution using a solvent.

In some embodiments, the second dielectric material layer 104B may include a photosensitive material that may be exposed through a patterned mask to transfer the mask pattern directly to the second dielectric material layer 104B. An etch process may then be used to form the plurality of recesses 112 through the second dielectric material layer 104B.

Referring to FIG. 3C, the second dielectric material layer 104B may have a thickness dimension $H_3$ between the upper surface 106 of the first dielectric material layer 104A and the upper surface 111 of the second dielectric material layer 104B that is greater than the height dimension $H_2$ of the peripheral metal pads 109. In various embodiments, the ratio of the height dimension of the peripheral metal pads 109 to the thickness dimension of the second dielectric material layer 104B (i.e., $H_2/H_3$) may be greater than or equal to 0.1 and less than 1.0.

In various embodiments, the alignment marks 107-1, 107-2 and 107-2 exposed through the recesses 112 in the AM1 may be used for alignment and registration of the photolithography equipment used to form second redistribution structures 105B within the UAs of the intermediate structure. Referring to FIG. 3A, within each of the UAs, the second dielectric material layer 104B may be patterned, for example, by applying and patterning a respective photoresist layer over the upper surface 111 of the second dielectric material layer 104B and by transferring the pattern in the photoresist layer into the second dielectric material layer 104B using an etch process such as an anisotropic etch process. The etch process may provide a plurality of open regions, including trenches and via openings, within the second dielectric material layer 104B. Following the etch process, the photoresist layer may be removed using a suitable process, such as by ashing or dissolution using a solvent.

Alternatively, the second dielectric material layer 104B may include a photosensitive material that may be exposed through a patterned mask to transfer the mask pattern directly to the second dielectric material layer 104B. An etch process may then be used to form the plurality of open regions, including trenches and via openings, within the second dielectric material layer 104B.

The second redistribution structures 105B may be formed by providing a conductive material within the plurality of open regions formed in the second dielectric material layer 104B, such as a metallic material as described above with reference to the first redistribution structures 105A. In some embodiments, the second redistribution structures 105B may have the same composition as the first redistribution structures 105A. Alternatively, the second redistribution structures 105B may have a different composition than the composition of the first redistribution structures 105A. The second redistribution structures 105B may be formed by depositing a metallic material over the upper surface 111 of the second dielectric material layer 104B and within the open regions in the second dielectric material layer 104B using a suitable deposition process as described above. Portions of the metallic material may be removed from over the upper surface 111 of the second dielectric material layer 104B via a planarization process (e.g., chemical mechanical planarization (CMP)) and/or an etching process. The remaining portion of the metallic material may form the second redistribution structures 105B embedded within the second dielectric material layer 104B. The second redistribution structures 105B may be located over and may electrically contact first distribution structures 105A in the underlying first dielectric material layer 104A. In some embodiments, a portion of the metallic material may form a portion of the seal ring 110 extending around the periphery of the redistribution structures 105A, 105B within each of the UAs, as shown in FIGS. 3A and 3E.

Referring to FIG. 3E, in some embodiments, the second redistribution structures 105B may not extend to the in-chip die EAs of the UAs of the intermediate structure. Alternatively, the second redistribution structures 105B may extend into the in-chip die EAs of the UAs. In embodiments in which the second redistribution structures 105B are not located in the in-chip die EAs of the UAs, one or more additional alignment marks may be formed over the second dielectric material layer 105B within the in-chip die EAs of the UAs, as described in further detail below.

Figure 4A:
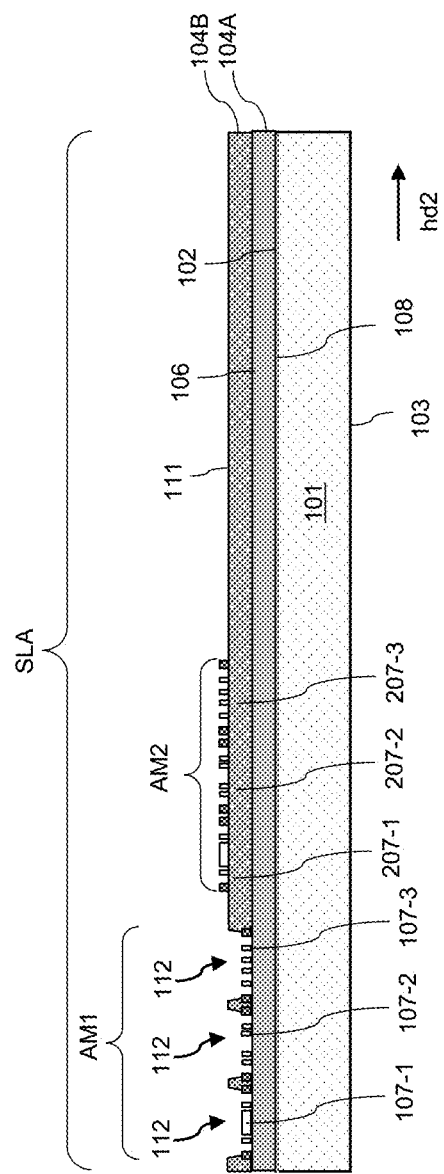
FIG. 4A is a vertical cross-sectional view of the intermediate structure during a process of forming a semiconductor package illustrating a second plurality of alignment marks and peripheral metal pads over the second dielectric material layer in a second alignment mark region of the scribe line area according to various embodiments of the present disclosure.
Figure 4C:
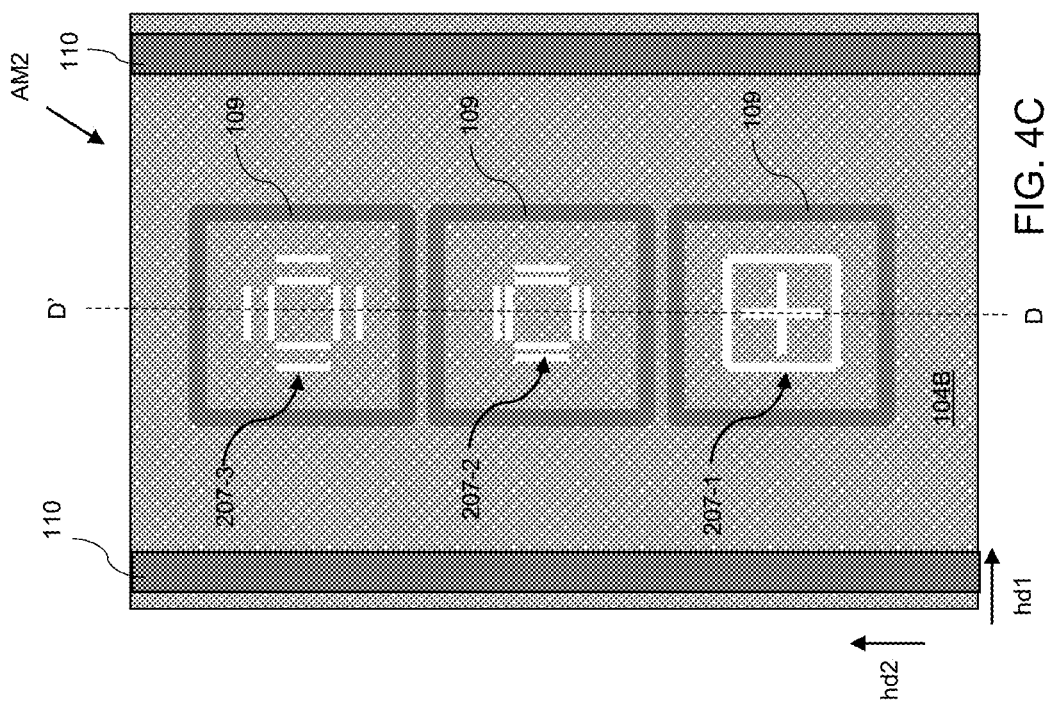
FIG. 4C is a top view of the second alignment mark region in the scribe line area shown in FIG. 4B according to various embodiments of the present disclosure.
Figure 4B:
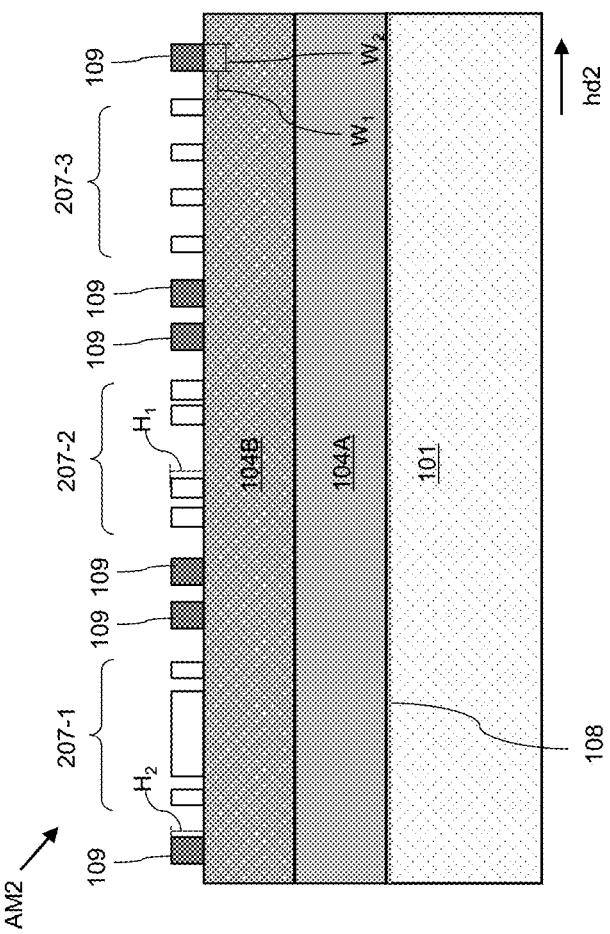
FIG. 4B is a vertical cross-sectional view of the intermediate structure showing an enlarged view of the second alignment mark region in the scribe line area including the second plurality of alignment marks and peripheral metal pads over the second dielectric material layer according to various embodiments of the present disclosure.
Figure 4D:
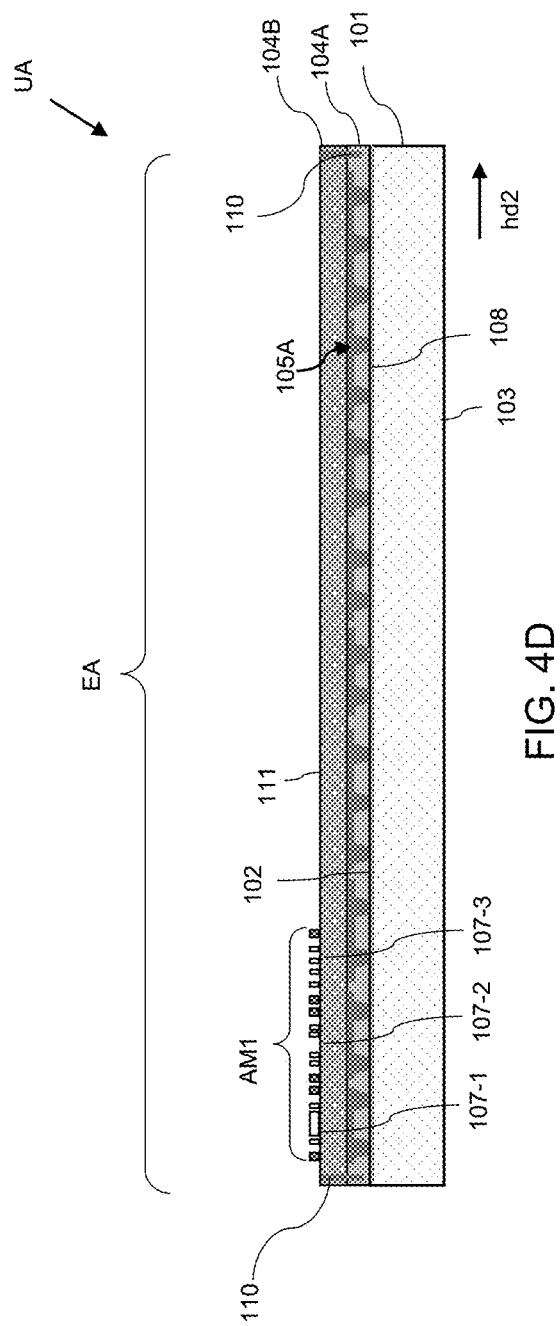
FIG. 4D is a vertical cross-sectional view of the intermediate structure during a process of forming a semiconductor package illustrating a first plurality of alignment marks and peripheral metal pads over the second dielectric material layer in a first alignment mark region of the in-chip die edge area according to various embodiments of the present disclosure.

FIG. 4A is a vertical cross-sectional view of the intermediate structure during a process of forming the semiconductor package illustrating a second plurality of alignment marks 207-1, 207-2 and 207-3 and peripheral metal pads 109 over the second dielectric material layer 104B in a second alignment mark region (AM2) of the SLA according to various embodiments of the present disclosure. FIG. 4B is a vertical cross-sectional view of the intermediate structure showing an enlarged view of the AM2 in the SLA including the second plurality of alignment marks 207-1, 207-2 and 207-3 and peripheral metal pads 109 over the second dielectric material layer 104B according to various embodiments of the present disclosure. FIG. 4C is a top view of the AM2 in the SLA shown in FIG. 4B, where the vertical cross-sectional view in FIG. 4C is taken along line D-D' in FIG. 4B according to various embodiments of the present disclosure. FIG. 4D is a vertical cross-sectional view of the exemplary intermediate structure illustrating a first plurality of alignment marks 107-1, 107-2, 107-3 and peripheral metal pads 109 over the second dielectric material layer 104B in a AM1 of the in-chip die EA according to various embodiments of the present disclosure.

Referring to FIGS. 4A-4C, the second plurality of alignment marks 207-1, 207-2 and 207-3 and peripheral metal pads 109 may be formed over upper surface 111 of the second dielectric material layer 104B in a AM2 of the SLA. The AM2 may be laterally offset from the AM1 within the SLA. In various embodiments, the second plurality of alignment marks 207-1, 207-2 and 207-3 and the peripheral metal pads 109 may be formed of a suitable conductive material, such as a metallic material. The second plurality of alignment marks 207-1, 207-2 and 207-3 and the peripheral metal pads 109 may be formed using materials and processes as described above in connection with the first plurality of alignment marks 107-1, 107-2 and 107-3. In some embodiments, second plurality of alignment marks 207-1, 207-2 and 207-3 and the peripheral metal pads 109 may be formed of the same metallic material used to form the second redistribution structures 105B.

The second plurality of alignment marks 207-1, 207-2 and 207-3 in the AM2 may have a similar or identical configuration as the first plurality of alignment marks 107-1, 107-2 and 107-3 in the AM1. Each of the second plurality of alignment marks 207-1, 207-2 and 207-3 in the AM2 may be in the form of a pattern that may be used as a reference for subsequent lithographic patterning steps. For example, the second plurality of alignment marks 207-1, 207-2 and 207-3 may facilitate proper alignment when forming additional features, such as additional redistribution structures, over the second dielectric material layer 104B and the second redistribution structures 105A within the UAs of the intermediate structure. Although in the embodiment shown in FIGS. 4A-4C, the second plurality of alignment marks 207-1, 207-2 and 207-3 in the AM2 have identical patterns as the first plurality of alignment marks 107-1, 107-2 and 107-3 in the AM1, it will be understood that the plurality of alignment marks in the different alignment mark regions may have different patterns. In various embodiments, multiple incidents of the AM2 may be formed in different locations in the intermediate structure. For example, each of the SLAs between adjacent UAs and/or around the periphery of the UAs may include at least one instance of a AM2 as shown in FIGS. 4A-4C over the second dielectric material layer 104B.

A peripheral metal pad 109 may surround the periphery of each of the plurality of alignment marks 207-1, 207-2 and 207-3 in the AM2 of the SLA. Each of the peripheral metal pads 109 may be offset from the respective alignment marks 207-1, 207-2 and 207-3 by a minimum distance $W_1$. In some embodiments, 3 µm≤$W_1$≤10 µm. In various embodiments, the peripheral metal pads 109 may have a width dimension $W_2$ that is between about 5 µm and about 20 µm. The peripheral metal pads 109 have a height dimension $H_2$ that may be greater than, less than, or equal to the height dimension $H_1$ of the second plurality of alignment marks 207-1, 207-2 and 207-3. In some embodiments, the ratio of the height dimension of the peripheral metal pads 109 to the height dimension of the second plurality of alignment marks 207-1, 207-2 and 207-3 (i.e., $H_2/H_1$) may be greater than or equal to 0.8 and less than or equal to 1.2. In some embodiments, the height dimension $H_2$ of the peripheral metal pads 109 may be greater than or equal to 1 µm and less than or equal to 10 µm, although lesser and greater height dimensions for the peripheral metal pads are within the contemplated scope of disclosure.

Referring to FIG. 4D, a first plurality of alignment marks 107-1, 107-2 and 107-3 and peripheral metal pads 109 may be formed over upper surface 111 of the second dielectric material layer 104B in a AM1 of the in-chip die EA according to various embodiments of the present disclosure. The plurality of alignment marks 107-1, 107-2 and 107-3 and peripheral metal pads 109 formed over upper surface 111 of the second dielectric material layer 104B in the in-chip die EA may be in addition to, or as an alternative to, the second plurality of alignment marks 207-1, 207-2 and 207-3 and peripheral metal pads 109 formed over the upper surface 111 of the second dielectric material layer 104B in the SLA described above with reference to FIGS. 4A-4C. The first plurality of alignment marks 107-1, 107-2 and 107-3 and peripheral metal pads 109 may be formed in the AM1 of the in-chip die EA may have a similar or identical construction as the corresponding alignment marks and peripheral metal pads formed in the AM1 and the AM2 of the SLA, thus repeated discussion of the details of the first plurality of alignment marks 107-1, 107-2 and 107-3 and peripheral metal pads 109 is omitted. Further, although the embodiment shown in FIG. 4D includes a single AM1 in an in-chip die EA of a UA, it will be understood that multiple incidents of the AM1 may be formed in different locations in the in-chip die EAs of the exemplary intermediate structure.

Figure 5E:
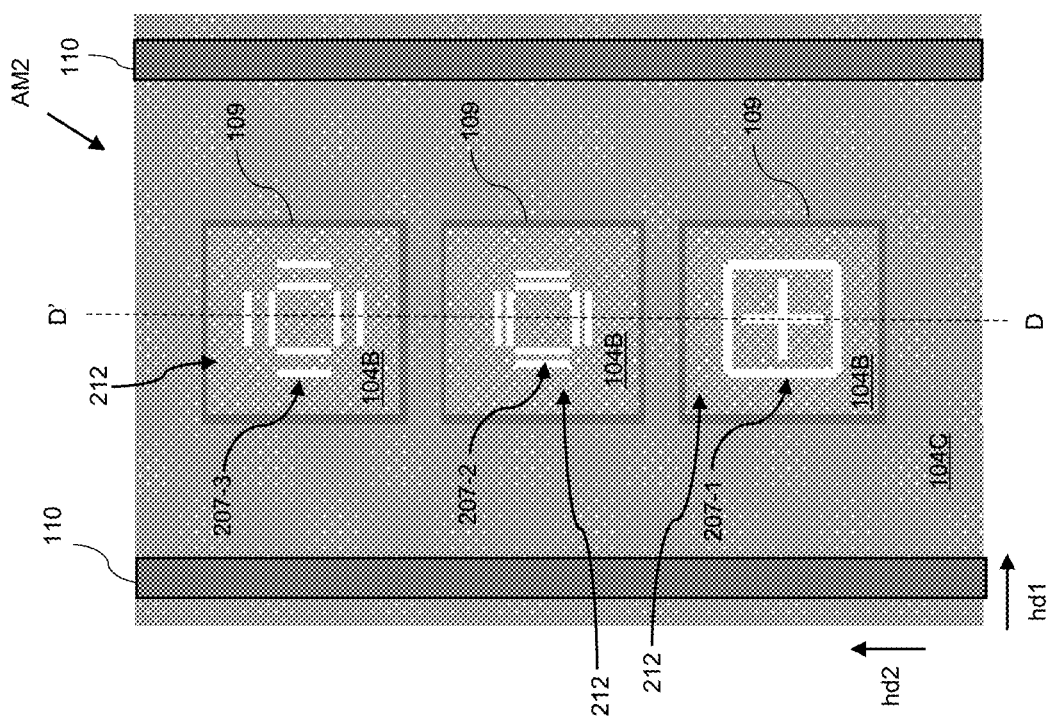
FIG. 5E is a top view of the second alignment mark region in the scribe line area shown in FIG. 5D according to various embodiments of the present disclosure.
Figure 5F:
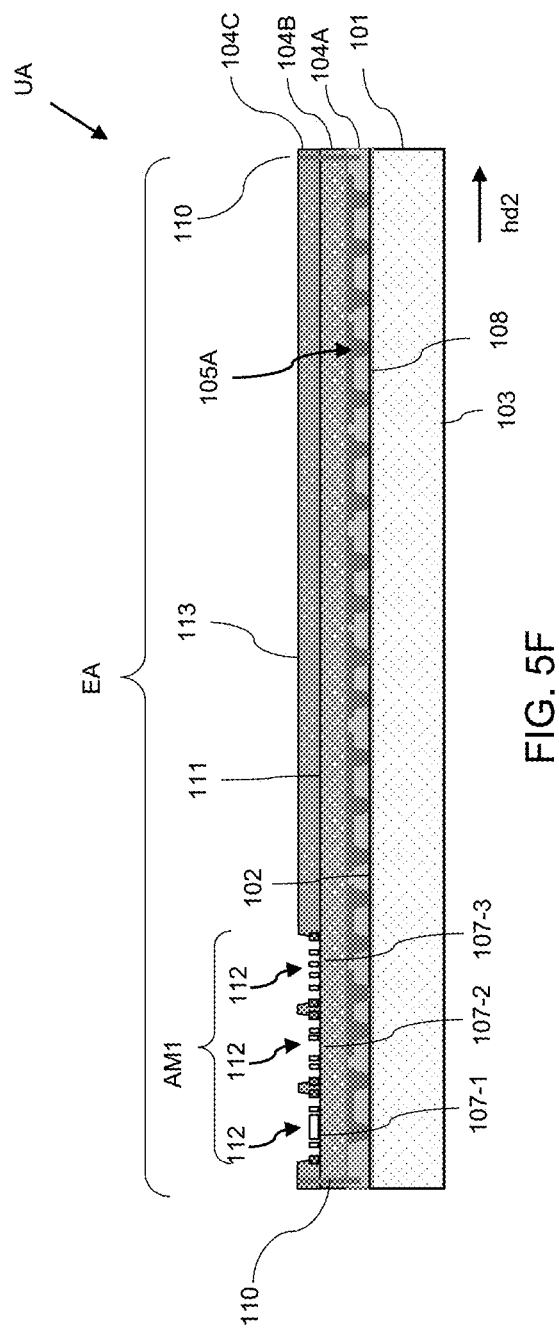
FIG. 5F is a vertical cross-sectional view of the intermediate structure along line B-B' in FIG. 5A illustrating recesses through the third dielectric material layer exposing the first plurality of alignment marks in the first alignment mark region of the in-chip die edge area according to various embodiments of the present disclosure.

FIG. 5A is a vertical cross-sectional view of the intermediate structure during a process of forming a semiconductor package illustrating a third dielectric material layer 104C and third redistribution structures 105C over the second dielectric material layer 104B and second redistribution structures 105B according to various embodiments of the present disclosure. FIG. 5B is a vertical cross-sectional view of the exemplary intermediate structure along line A-A' in FIG. 5A illustrating the third dielectric material layer 104C over the first plurality of alignment marks 107-1, 107-2 and 107-3 in the AM1 of the SLA and recesses 212 through the third dielectric material layer 104C exposing the second plurality of alignment marks 207-1, 207-2 and 207-3 in the AM2 of the SLA according to various embodiments of the present disclosure. FIG. 5C is a vertical cross-sectional view of the intermediate structure showing an enlarged view of the AM1 in the SLA illustrating the third dielectric material layer 104C over the first plurality of alignment marks 107-1, 107-2 and 107-3 and over the upper surface and side surfaces of the second dielectric material layer 104B and the upper surface of the first dielectric material layer 104A according to various embodiments of the present disclosure. FIG. 5D is a vertical cross-sectional view of the intermediate structure showing an enlarged view of the AM2 in the SLA including the recesses 212 through the third dielectric layer 104C exposing the second plurality of alignment marks 207-1, 207-2 and 207-3 according to various embodiments of the present disclosure. FIG. 5E is a top view of the AM2 in the SLA shown in FIG. 5D, where the vertical cross-sectional view in FIG. 5D is taken along line D-D' in FIG. 5E. FIG. 5F is a vertical cross-sectional view of the intermediate structure along line B-B' in FIG. 5A illustrating recesses 112 through the third dielectric material layer 104C exposing the first plurality of alignment marks 107-1, 107-2 and 107-3 in the AM1 of the in-chip die EA according to various embodiments of the present disclosure.

Referring to FIGS. 5A-5F, the third dielectric material layer 104C may include a suitable dielectric material as described above, such as a dielectric polymer material. In some embodiments, the third dielectric material layer 104C may have the same composition as the first dielectric material layer 104A and/or the second dielectric material layer 104B. Alternatively, the third dielectric material layer 104C may have a different composition than the first dielectric material layer 104A and/or the second dielectric material layer 104B. The third dielectric material layer 104C may be deposited over the upper surface of 111 of the second dielectric material layer 104B using a suitable deposition process, such as a spin coating and drying process. Within the UAs of the exemplary intermediate structure, the third dielectric material layer 104C may be deposited over the second redistribution structures 105B, the seal rings 110, and over the first plurality of alignment marks 107-1, 107-2 and 107-3 in the AM1 of the in-chip die EA. Within the SLA of the intermediate structure, the third dielectric material layer 104C may be deposited over the first plurality of alignment marks 107-1, 107-2 and 107-3 and over the exposed upper and side surfaces of the peripheral metal pads 109, and over the upper surface and side surfaces of the second dielectric material layer 104B and the exposed upper surface of the first dielectric material layer 104A in the AM1. The third dielectric material layer 104C may also be deposited over the second plurality of alignment marks 207-1, 207-2 and 207-3 and the peripheral metal pads 109 in the AM2 of the SLA.

Referring to FIGS. 5B and 5C, the third dielectric material layer 104C may fill the recesses 112 in the second dielectric material layer 104B through which the first plurality of alignment marks 107-1, 107-2 and 107-3 in the AM1 of SLA were previously exposed. Thus, the third dielectric material layer 104C may contact the upper surface 111 and side surfaces of the second dielectric material layer 104B within the AM1, and may also contact the exposed upper surface 106 of the first dielectric material layer 104A at the bottom of the recesses 112. Thus, the first dielectric material layer 104A, second dielectric material layer 104B, and third dielectric material layer 104C all contact one another within the AM1. This may result in weak spots in the multi-layer structure, particularly around the peripheral edges of the alignment marks 107-1, 107-2 and 107-3 where all three of the dielectric material layers 104A, 104B and 104C converge (which may be referred to as "stacking interface regions" 114). In particular, these regions are prone to crack formation under thermal and/or mechanical stress due at least in part to a relatively low amount of adhesion between the respective first dielectric material layer 104A, second dielectric material layer 104B, and third dielectric material layer 104C. In various embodiments, by providing a peripheral metal pad 109 in the AM1 and contacting at least the first dielectric material layer 104A and the second dielectric material layer 104B, the adhesion between the first dielectric material layer 104A, second dielectric material layer 104B, and third dielectric material layer 104C may be enhanced, and the likelihood of crack formation may be reduced.

Referring to FIGS. 5B, 5D and 5E, portions of the third dielectric material layer 104C may be removed from the SLA to expose the alignment marks 207-1, 207-2 and 207-3 in the AM2. In various embodiments, the third dielectric material layer 104C may be patterned, for example, by applying and patterning a respective photoresist layer over the upper surface 113 of the third dielectric material layer 104C, and by transferring the pattern in the photoresist layer into the third dielectric material layer 104C using an etch process such as an anisotropic etch process. The etch process may provide a plurality of recesses 212 through the third dielectric material layer 104C, where an alignment mark 207-1, 207-2 and 207-3 may be exposed at the bottom of each of the recesses 212. In some embodiments, the peripheral metal pads 109 surrounding the respective alignment marks 207-1, 207-2 and 207-3 may be partially exposed within the respective recesses 212. A portion of the peripheral metal pads 109 may remain covered by the third dielectric material layer 104C. Referring to FIG. 5D, the portion of the peripheral metal pads 109 that remains covered by the third dielectric material layer 104C may have a width dimension $W_3$. In some embodiments, the ratio of the portion of the upper surface of the peripheral metal pad 109 that remains covered by the third dielectric material layer 104C to the total width dimension of the peripheral metal pad 109 (i.e., $W_3/W_2$) may be greater than or equal to 0.1 and less than or equal to 1.0. Following the etch process, the photoresist layer may be removed using a suitable process, such as by ashing or dissolution using a solvent.

In some embodiments, the third dielectric material layer 104C may include a photosensitive material that may be exposed through a patterned mask to transfer the mask pattern directly to the third dielectric material layer 104C. An etch process may then be used to form the plurality of recesses 212 through the third dielectric material layer 104C.

Referring to FIG. 5D, the third dielectric material layer 104C may have a thickness dimension $H_3$ between the upper surface 111 of the second dielectric material layer 104B and the upper surface 113 of the third dielectric material layer 104C that is greater than the height dimension $H_2$ of the peripheral metal pads 109. In various embodiments, the ratio of the height dimension of the peripheral metal pads 109 to the thickness dimension of the third dielectric material layer 104C (i.e., $H_2/H_3$) may be greater than or equal to 0.1 and less than 1.0.

In various embodiments, the alignment marks 207-1, 207-2 and 207-2 exposed through the recesses 212 in the AM2 may be used for alignment and registration of the photolithography equipment used to form third redistribution structures 105C within the UAs of the exemplary intermediate structure. Referring to FIG. 5A, within each of the UAs, the third dielectric material layer 104C may be patterned as described above to form open regions (i.e., trenches and via openings) within the third dielectric material layer 104C. The third redistribution structures 105C may be formed by providing a conductive material, such as a metallic material, within the plurality of open regions formed in the third dielectric material layer 104C using a suitable deposition process as described above. Portions of the metallic material may be removed from over the upper surface 113 of the third dielectric material layer 104C via a planarization process (e.g., chemical mechanical planarization (CMP)) and/or an etching process. The remaining portion of the metallic material may form the third redistribution structures 105C embedded within the third dielectric material layer 104C. The third redistribution structures 105C may be located over and may electrically contact second distribution structures 105B in the underlying second dielectric material layer 104B. In some embodiments, a portion of the metallic material may form a portion of the seal ring 110 extending around the periphery of the redistribution structures 105A, 105B, 105C within each of the UAs, as shown in FIGS. 5A and 5F.

Referring to FIG. 5F, portions of the third dielectric material layer 104C may be removed from the in-chip die EA to expose the first plurality of alignment marks 107-1, 107-2 and 107-3 in the AM1 of the in-chip die EA. In various embodiments, the third dielectric material layer 104C may be patterned as described above with reference to FIGS. 3B-3D to provide a plurality of recesses 112 through the third dielectric material layer 104C, where an alignment mark 107-1, 107-2 and 107-3 may be exposed at the bottom of each of the recesses 112. In some embodiments, the peripheral metal pads 109 surrounding the respective alignment marks 107-1, 107-2 and 107-3 may be partially exposed within the respective recesses 112. A portion of the peripheral metal pads 109 may remain covered by the third dielectric material layer 104C. In various embodiments, the alignment marks 107-1, 107-2 and 107-2 exposed through the recesses 112 in the AM1 in the in-chip die EA may be used for alignment and registration of the photolithography equipment used to form third redistribution structures 105C within the UAs of the intermediate structure.

Figure 6A:
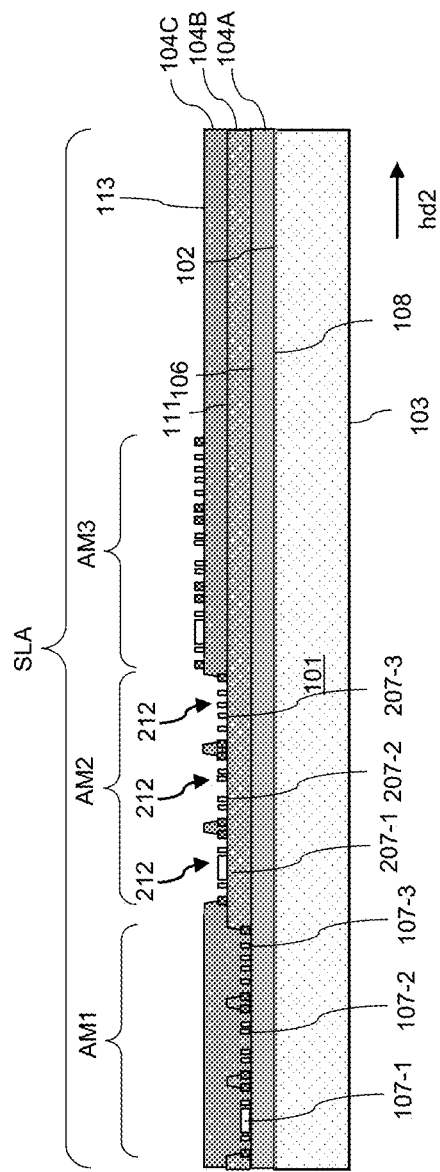
FIG. 6A is a vertical cross-sectional view of the intermediate structure during a process of forming a semiconductor package illustrating a third plurality of alignment marks and peripheral metal pads over the third dielectric material layer in a third alignment mark region of the scribe line area according to various embodiments of the present disclosure.
Figure 6C:
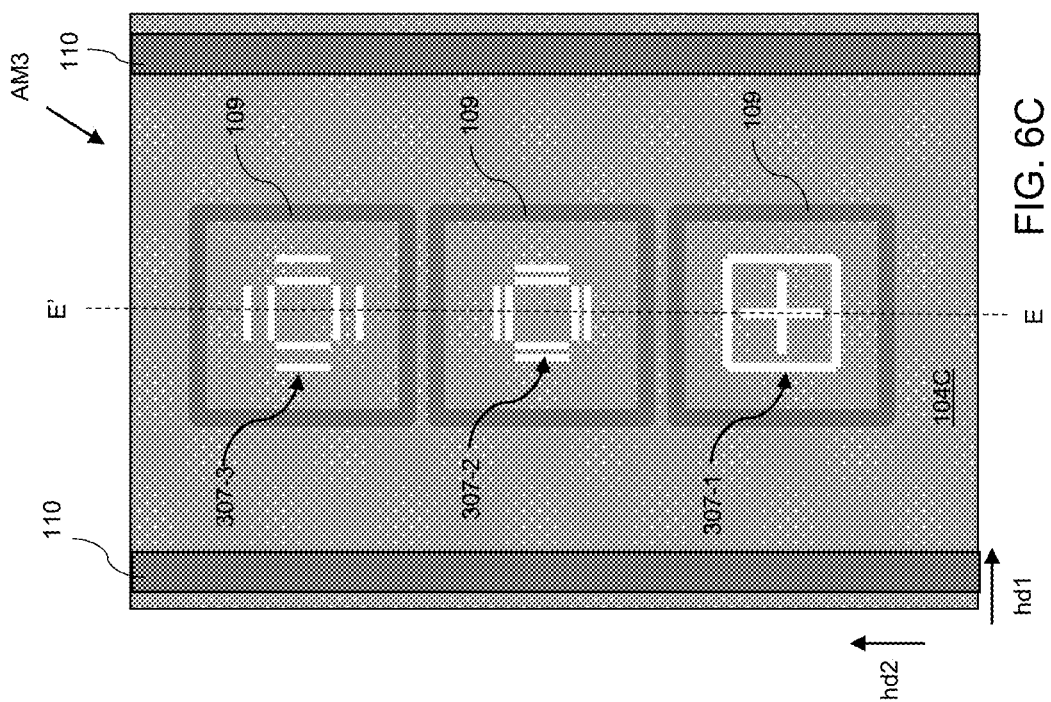
FIG. 6C is a top view of the third alignment mark region in the scribe line area shown in FIG. 6B according to various embodiments of the present disclosure.
Figure 6B:
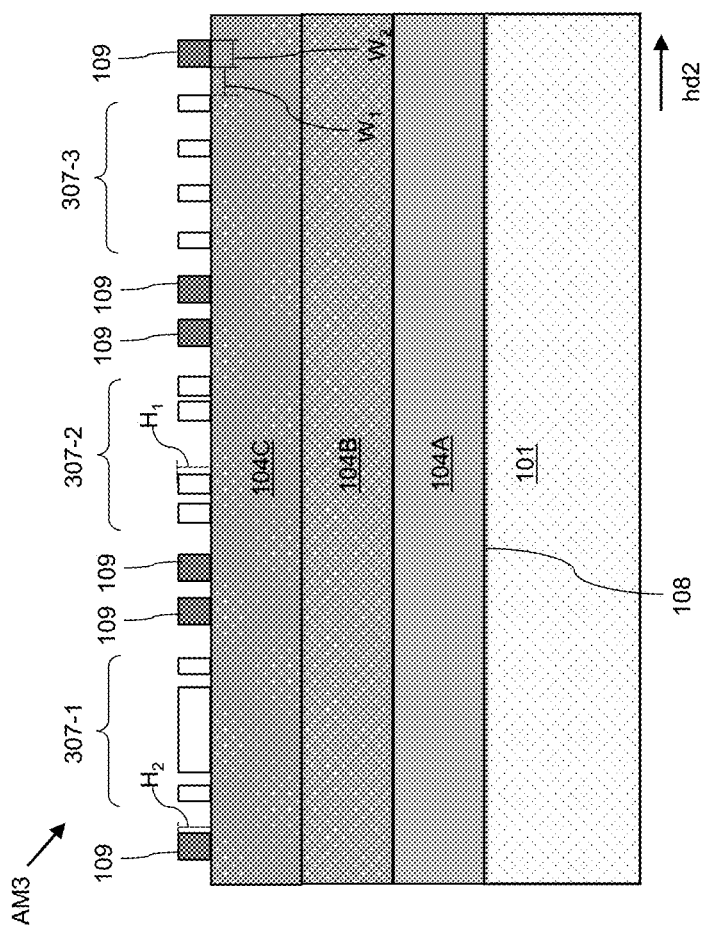
FIG. 6B is a vertical cross-sectional view of the intermediate structure showing an enlarged view of the third alignment mark region in the scribe line area including the third plurality of alignment marks and peripheral metal pads over the third dielectric material layer according to various embodiments of the present disclosure.
Figure 6D:
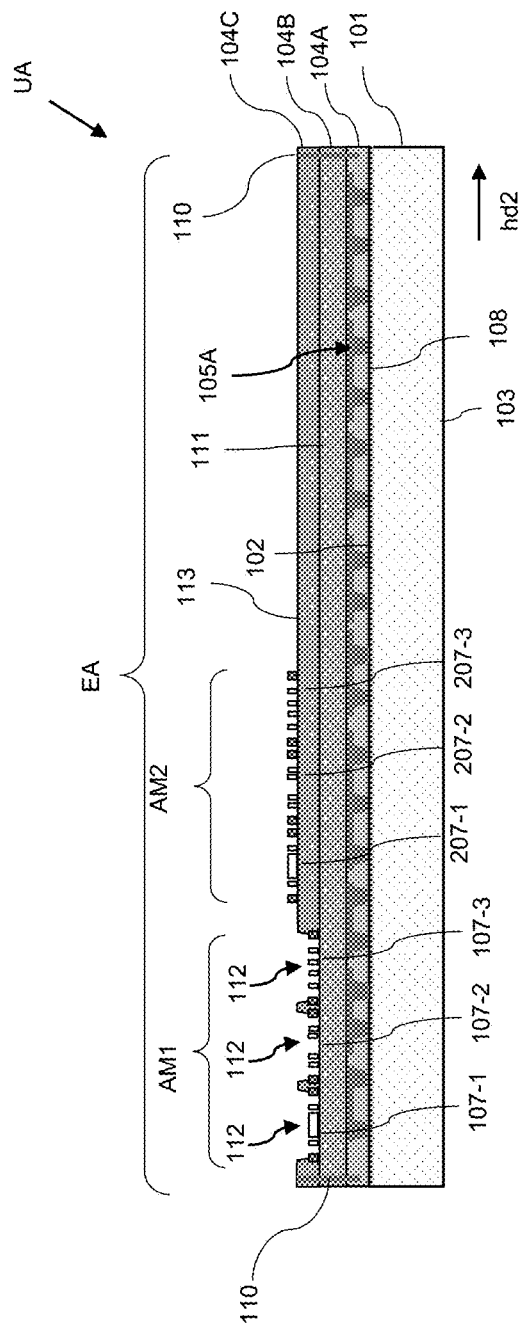
FIG. 6D is a vertical cross-sectional view of the intermediate structure during a process of forming a semiconductor package illustrating a second plurality of alignment marks and peripheral metal pads over the third dielectric material layer in a second alignment mark region of the in-chip die edge area according to various embodiments of the present disclosure.

FIG. 6A is a vertical cross-sectional view of the intermediate structure during a process of forming a semiconductor package illustrating a third plurality of alignment marks 307-1, 307-2 and 307-3 and peripheral metal pads 109 over the third dielectric material layer 104C in a third alignment mark region (AM3) of the SLA according to various embodiments of the present disclosure. FIG. 6B is a vertical cross-sectional view of the intermediate structure showing an enlarged view of the AM3 in the SLA including the third plurality of alignment marks 307-1, 307-2 and 307-3 and peripheral metal pads 109 over the third dielectric material layer 104C according to various embodiments of the present disclosure. FIG. 6C is a top view of the AM3 in the SLA shown in FIG. 6B, where the vertical cross-sectional view in FIG. 6B is taken along line E-E' in FIG. 6C. FIG. 6D is a vertical cross-sectional view of the intermediate structure during a process of forming the semiconductor package illustrating a second plurality of alignment marks 207-1, 207-2 and 207-3 and peripheral metal pads 109 over the third dielectric material layer 104C in a AM2 of the in-chip die EA according to various embodiments of the present disclosure.

Referring to FIGS. 6A-6C, the third plurality of alignment marks 307-1, 307-2 and 307-3 and peripheral metal pads 109 may be formed over upper surface 113 of the third dielectric material layer 104C in a AM3 of the SLA. The AM3 may be laterally offset in a second horizontal direction hd2 from the AM1 and the AM2 within the SLA. In various embodiments, the third plurality of alignment marks 307-1, 307-2 and 307-3 and the peripheral metal pads 109 may be formed of a suitable conductive material, such as a metallic material. The third plurality of alignment marks 307-1, 307-2 and 307-3 and the peripheral metal pads 109 may be formed using materials and processes as described above in connection with the first plurality of alignment marks 107-1, 107-2 and 107-3 and the second plurality of alignment marks 207-1, 207-2 and 207-3. In some embodiments, the third plurality of alignment marks 207-1, 207-2 and 207-3 and the peripheral metal pads 109 may be formed of the same metallic material used to form the third redistribution structures 105C.

The third plurality of alignment marks 307-1, 307-2 and 307-3 in the AM3 may have a similar or identical configuration as the first plurality of alignment marks 107-1, 107-2 and 107-3 in the AM1 and/or the second plurality of alignment marks 207-1, 207-2 and 207-3 in the AM2. Each of the alignment marks 307-1, 307-2 and 307-3 in the AM3 may be in the form of a pattern that may be used as a reference for subsequent lithographic patterning steps. For example, the alignment marks 307-1, 307-2 and 307-3 may facilitate proper alignment when forming additional features, such as additional redistribution structures, over the third dielectric material layer 104C and the third redistribution structures 105C within the UAs of the intermediate structure. Although in the embodiment shown in FIGS. 6A-6C, the alignment marks 307-1, 307-2 and 307-3 in the AM3 have identical patterns as the alignment marks 107-1, 107-2 and 107-3 in the AM1 and the alignment marks 207-1, 207-2 and 207-3 in the AM2, it will be understood that the alignment marks in the different alignment mark regions AM1, AM2 and AM3 may have different patterns. In various embodiments, multiple incidents of the AM3 may be formed in different locations in the exemplary intermediate structure. For example, each of the SLA between adjacent UAs and/or around the periphery of the UAs may include at least one instance of a AM3 as shown in FIGS. 6A-6C over the third dielectric material layer 104C.

A peripheral metal pad 109 may surround the periphery of each of the alignment marks 307-1, 307-2 and 307-3 in the AM3 of the SLA. Each of the peripheral metal pads 109 may be offset from the respective alignment marks 307-1, 307-2 and 307-3 by a minimum distance $W_1$. In some embodiments, 3 µm≤$W_1$≤10 µm. In various embodiments, the peripheral metal pads 109 may have a width dimension $W_2$ that is between about 5 µm and about 20 µm. The peripheral metal pads 109 have a height dimension $H_2$ that may be greater than, less than, or equal to the height dimension $H_1$ of the alignment marks 307-1, 307-2 and 307-3. In some embodiments, the ratio of the height dimension of the peripheral metal pads 109 to the height dimension of the alignment marks 307-1, 307-2 and 307-3 (i.e., $H_2/H_1$) may be greater than or equal to 0.8 and less than or equal to 1.2. In some embodiments, the height dimension $H_2$ of the peripheral metal pads 109 may be greater than or equal to 1 µm and less than or equal to 10 µm, although lesser and greater height dimensions for the peripheral metal pads are within the contemplated scope of disclosure.

Referring to FIG. 6D, a second plurality of alignment marks 207-1, 207-2 and 207-3 and peripheral metal pads 109 may be formed over upper surface 113 of the third dielectric material layer 104C in a AM2 of the in-chip die EA according to various embodiments of the present disclosure. The AM2 of the in-chip die EA may be laterally offset from the AM1 of the in-chip die EA in the second horizontal direction hd2. The alignment marks 207-1, 207-2 and 207-3 and peripheral metal pads 109 formed over upper surface 113 of the third dielectric material layer 104C in the in-chip die EA may be in addition to, or as an alternative to, the alignment marks 307-1, 307-2 and 307-3 and peripheral metal pads 109 formed over the upper surface 113 of the third dielectric material layer 104C in the SLA described above with reference to FIGS. 6A-6C. The second plurality of alignment marks 207-1, 207-2 and 207-3 and peripheral metal pads 109 formed in the AM2 of the in-chip die EA may have a similar or identical construction as the first plurality of alignment marks 107-1, 107-2 and 107-3 and peripheral metal pads 109 formed in the AM1 of the in-chip die EA, as well as to the alignment marks and peripheral metal pads 109 formed in the AM1, AM2 and AM3 of the SLA. Thus, repeated discussion of the details of the second plurality of alignment marks 207-1, 207-2 and 207-3 and peripheral metal pads 109 is omitted. Further, although the embodiment shown in FIG. 6D includes a single AM2 in an in-chip die EA of a UA, it will be understood that multiple incidents of the AM2 may be formed in different locations in the in-chip die EAs of the intermediate structure.

Figure 7C:
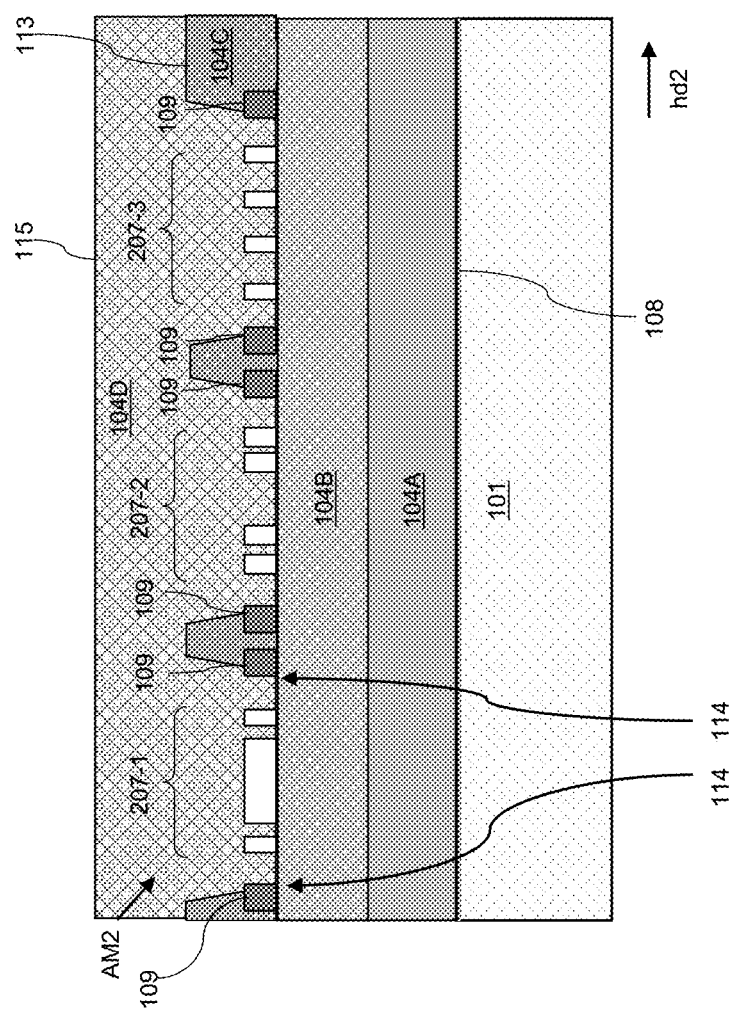
FIG. 7C is a vertical cross-sectional view of the intermediate structure showing an enlarged view of the second alignment mark region in the scribe line area illustrating the fourth dielectric material layer over the second plurality of alignment marks and over the upper surface and side surfaces of the third dielectric material layer and the upper surface of the second dielectric material layer according to various embodiments of the present disclosure.
Figure 7D:
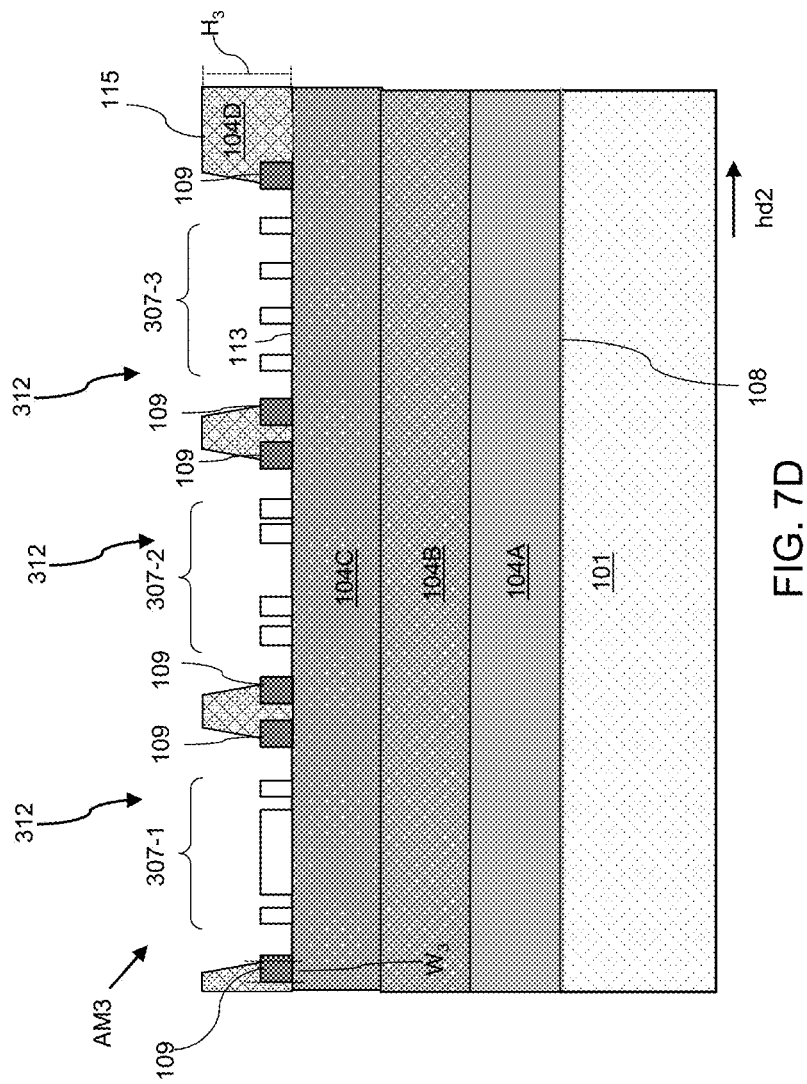
FIG. 7D is a vertical cross-sectional view of the intermediate structure showing an enlarged view of the third alignment mark region in the scribe line area including the recesses through the fourth dielectric layer exposing the third plurality of alignment marks according to various embodiments of the present disclosure.
Figure 7E:
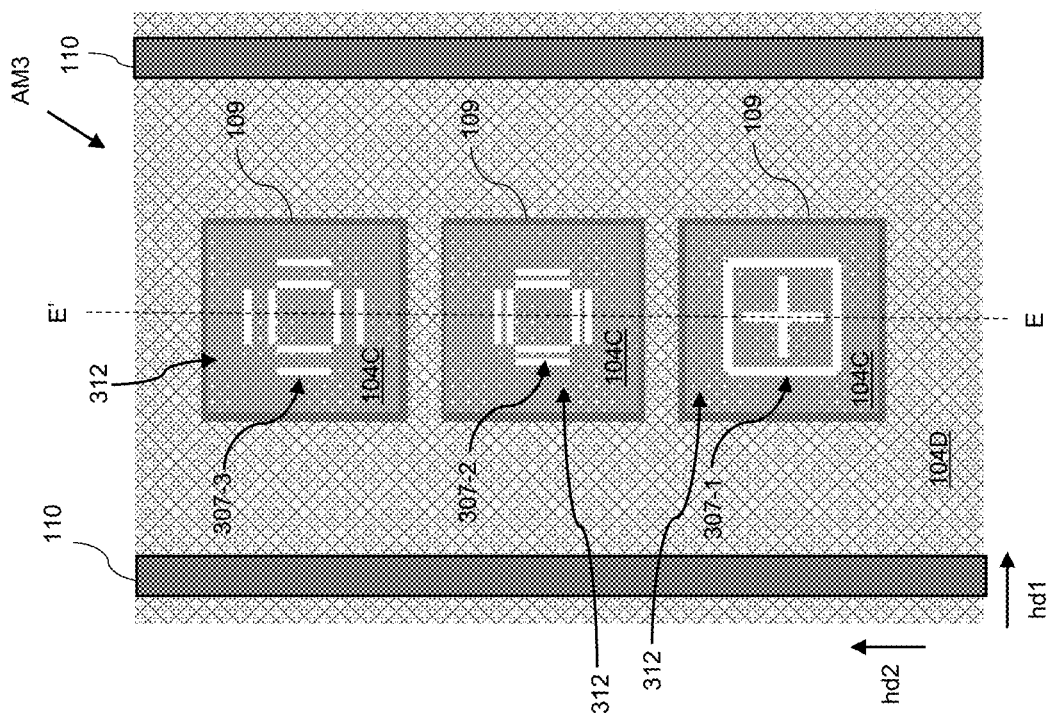
FIG. 7E is a top view of the third alignment mark region in the scribe line area shown in FIG. 7D according to various embodiments of the present disclosure.
Figure 7F:
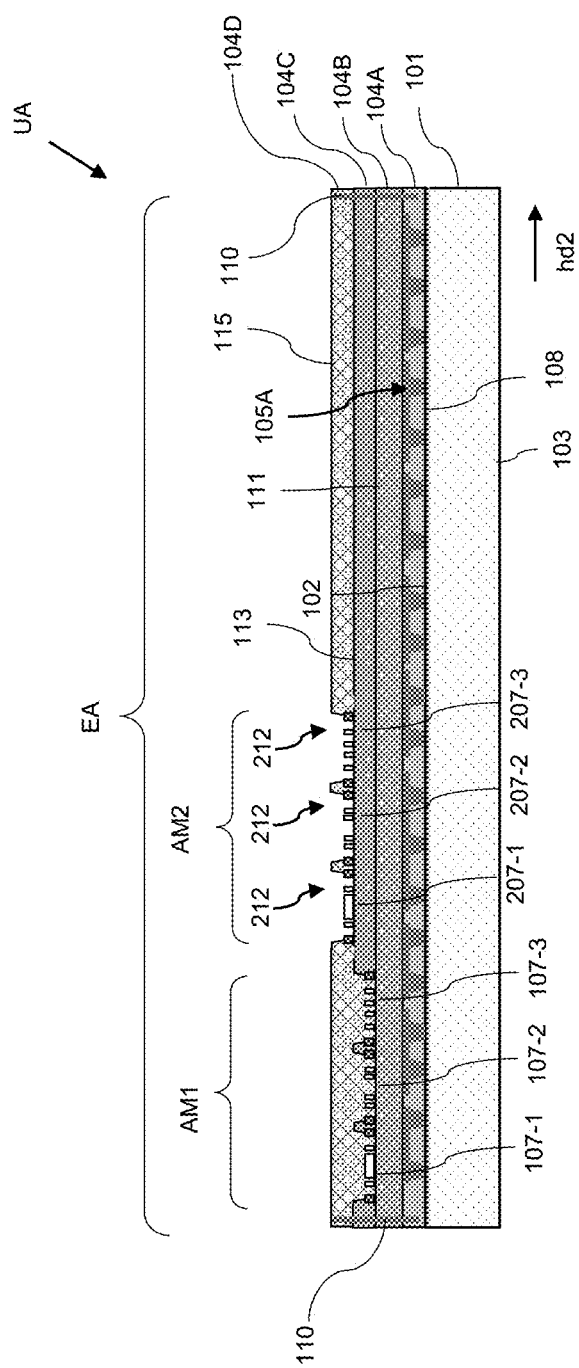
FIG. 7F is a vertical cross-sectional view of the intermediate structure along line B-B' in FIG. 7A illustrating recesses through the fourth dielectric material layer exposing the second plurality of alignment marks in the second alignment mark region of the in-chip die edge area according to various embodiments of the present disclosure.

FIG. 7A is a vertical cross-sectional view of the intermediate structure during a process of forming a semiconductor package illustrating a fourth dielectric material layer 104D and fourth redistribution structures 105D over the third dielectric material layer 104C and third redistribution structures 105C according to various embodiments of the present disclosure. FIG. 7B is a vertical cross-sectional view of the intermediate structure along line A-A' in FIG. 7A illustrating the fourth dielectric material layer 104D over the second plurality of alignment marks 207-1, 207-2 and 207-3 in the AM2 of the SLA and recesses 312 through the fourth dielectric material layer 104D exposing the third plurality of alignment marks 307-1, 307-2 and 307-3 in the AM3 of the SLA according to various embodiments of the present disclosure. FIG. 7C is a vertical cross-sectional view of the intermediate structure showing an enlarged view of the AM2 in the SLA illustrating the fourth dielectric material layer 104D over the second plurality of alignment marks 207-1, 207-2 and 207-3 and over the upper surface and side surfaces of the third dielectric material layer 104C and the upper surface of the second dielectric material layer 104B according to various embodiments of the present disclosure. FIG. 7D is a vertical cross-sectional view of the intermediate structure showing an enlarged view of the AM3 in the SLA including the recesses 312 through the fourth dielectric layer 104D exposing the third plurality of alignment marks 307-1, 307-2 and 307-3 according to various embodiments of the present disclosure. FIG. 7E is a top view of the AM3 in the SLA shown in FIG. 7D, where the vertical cross-sectional view in FIG. 7D is taken along line E-E' in FIG. 7D. FIG. 7F is a vertical cross-sectional view of the intermediate structure along line B-B' in FIG. 7A illustrating recesses 212 through the fourth dielectric material layer 104D exposing the second plurality of alignment marks 207-1, 207-2 and 207-3 in the AM2 of the in-chip die EA according to various embodiments of the present disclosure.

Referring to FIGS. 7A-7F, the fourth dielectric material layer 104D may include a suitable dielectric material as described above, such as a dielectric polymer material. In some embodiments, the fourth dielectric material layer 104D may have the same composition as the first dielectric material layer 104A, the second dielectric material layer 104B, and/or the third dielectric material layer 104C. Alternatively, the fourth dielectric material layer 104D may have a different composition than the first dielectric material layer 104A, the second dielectric material layer 104B, and/or the third dielectric material layer 104C. The fourth dielectric material layer 104D may be deposited over the upper surface of 113 of the third dielectric material layer 104C using a suitable deposition process, such as a spin coating and drying process. Within the UAs of the intermediate structure, the fourth dielectric material layer 104D may be deposited over the third redistribution structures 105C, the seal rings 110, and over the first plurality of alignment marks 107-1, 107-2 and 107-3 in the AM1 and the second plurality of alignment marks 207-1, 207-2 and 207-3 in the AM2 in the in-chip die EA. Within the SLA of the intermediate structure, the fourth dielectric material layer 104D may be deposited over the second plurality of alignment marks 207-1, 207-2 and 207-3 and over the exposed upper and side surfaces of the peripheral metal pads 109, and over the upper surface and side surfaces of the third dielectric material layer 104C and the exposed upper surface of the second dielectric material layer 104B in the AM2. The fourth dielectric material layer 104D may also be deposited over the third plurality of alignment marks 307-1, 307-2 and 307-3 and the peripheral metal pads 109 in the AM3 of the SLA.

Referring to FIGS. 7B and 7C, the fourth dielectric material layer 104D may fill the recesses 212 in the third dielectric material layer 104C through which the second plurality of alignment marks 207-1, 207-2 and 207-3 in the AM2 of the SLA were previously exposed. Thus, the fourth dielectric material layer 104D may contact the upper surface 113 and side surfaces of the third dielectric material layer 104C within the AM2, and may also contact the exposed upper surface 111 of the second dielectric material layer 104B at the bottom of the recesses 212. Thus, the second dielectric material layer 104B, third dielectric material layer 104C and fourth dielectric material layer 104D all contact one another within the AM2. This may result in weak spots in the multi-layer structure, particularly around the peripheral edges of the alignment marks 207-1, 207-2 and 207-3 where all three of the second dielectric material layer 104B, third dielectric material layer 104C and fourth dielectric material layer 104D converge (which may be referred to as "stacking interface regions" 114 in FIG. 7C). In particular, these regions are prone to crack formation under thermal and/or mechanical stress due at least in part to a relatively low amount of adhesion between the respective second dielectric material layer 104B, third dielectric material layer 104C and fourth dielectric material layer 104D. In various embodiments, by providing a peripheral metal pad 109 around the alignment marks 207-1, 207-2 and 207-3 in the AM2 that contacts at least the second dielectric material layer 104B and the third dielectric material layer 104C, the adhesion between the second dielectric material layer 104B, third dielectric material layer 104C and fourth dielectric material layer 104D may be enhanced, and the likelihood of crack formation may be reduced.

Referring to FIG. 7E, within the in-chip die EA the fourth dielectric material layer 104D may fill the recesses 212 in the third dielectric material layer 104C through which the second plurality of alignment marks 207-1, 207-2 and 207-3 in the AM2 of the in-chip die EA were previously exposed. Thus, the fourth dielectric material layer 104D may contact the upper surface 113 and side surfaces of the third dielectric material layer 104C within the AM2, and may also contact the exposed upper surface 111 of the second dielectric material layer 104B at the bottom of the recesses 212. In various embodiments, by providing a peripheral metal pad 109 around the alignment marks 207-1, 207-2 and 207-3 in the AM2 that contacts at least the second dielectric material layer 104B and the third dielectric material layer 104C, the adhesion between the second dielectric material layer 104B, third dielectric material layer 104C and fourth dielectric material layer 104D may be enhanced, and the likelihood of crack formation may be reduced.

Referring to FIGS. 7B, 7D and 7E, portions of the fourth dielectric material layer 104D may be removed from the SLA to expose the alignment marks 307-1, 307-2 and 307-3 in the third alignment mark region AM3. In various embodiments, the fourth dielectric material layer 104D may be patterned as described above with reference to FIGS. 3B-3D to provide a plurality of recesses 312 through the fourth dielectric material layer 104D, where an alignment mark 307-1, 307-2 and 307-3 may be exposed at the bottom of each of the recesses 312. In some embodiments, the peripheral metal pads 109 surrounding the respective alignment marks 307-1, 307-2 and 307-3 may be partially exposed within the respective recesses 312. A portion of the peripheral metal pads 109 may remain covered by the fourth dielectric material layer 104D. Referring to FIG. 7D, the portion of the peripheral metal pads 109 that remains covered by the fourth dielectric material layer 104D may have a width dimension $W_3$. In some embodiments, the ratio of the portion of the upper surface of the peripheral metal pad 109 that remains covered by the fourth dielectric material layer 104D to the total width dimension of the peripheral metal pad 109 (i.e., $W_3/W_2$) may be greater than or equal to 0.1 and less than or equal to 1.0.

Referring to FIG. 7D, the fourth dielectric material layer 104D may have a thickness dimension $H_3$ between the upper surface 113 of the third dielectric material layer 104C and the upper surface 115 of the fourth dielectric material layer 104D that is greater than the height dimension $H_2$ of the peripheral metal pads 109. In various embodiments, the ratio of the height dimension of the peripheral metal pads 109 to the thickness dimension of the fourth dielectric material layer 104D (i.e., $H_2/H_3$) may be greater than or equal to 0.1 and less than 1.0.

In various embodiments, the alignment marks 307-1, 307-2 and 307-3 exposed through the recesses 312 in the AM3 may be used for alignment and registration of the photolithography equipment used to form the fourth redistribution structures 105D within the UAs of the intermediate structure. Referring to FIG. 7A, within each of the UAs, the fourth dielectric material layer 104D may be patterned as described above to form open regions (i.e., trenches and via openings) within the fourth dielectric material layer 104D. The fourth redistribution structures 105D may be formed by providing a conductive material, such as a metallic material, within the plurality of open regions formed in the fourth dielectric material layer 104D using a suitable deposition process as described above. Portions of the metallic material may be removed from over the upper surface 115 of the fourth dielectric material layer 104D via a planarization process (e.g., chemical mechanical planarization (CMP)) and/or an etching process. The remaining portion of the metallic material may form the fourth redistribution structures 105D embedded within the fourth dielectric material layer 104D. The fourth redistribution structures 105D may be located over and may electrically contact third distribution structures 105B in the underlying third dielectric material layer 104B. In some embodiments, a portion of the metallic material may form a portion of the seal ring 110 extending around the periphery of the redistribution structures 105A, 105B, 105C and 105D within each of the UAs, as shown in FIGS. 7A and 7F.

Referring to FIG. 7F, portions of the fourth dielectric material layer 104D may be removed from the in-chip die EA to expose the second plurality of alignment marks 207-1, 207-2 and 207-3 in the AM2 of the in-chip die EA. In various embodiments, the fourth dielectric material layer 104D may be patterned as described above with reference to FIGS. 3B-3D to provide a plurality of recesses 212 through the fourth dielectric material layer 104D, where an alignment mark 207-1, 207-2 and 207-3 may be exposed at the bottom of each of the recesses 212. In some embodiments, the peripheral metal pads 109 surrounding the respective alignment marks 207-1, 207-2 and 207-3 may be partially exposed within the respective recesses 212. A portion of the peripheral metal pads 109 may remain covered by the fourth dielectric material layer 104D. In various embodiments, the alignment marks 207-1, 207-2 and 207-3 exposed through the recesses 212 in the AM2 in the in-chip die EA may be used for alignment and registration of the photolithography equipment used to form the fourth redistribution structures 105D within the unit areas UAs of the exemplary intermediate structure.

Figure 8A:
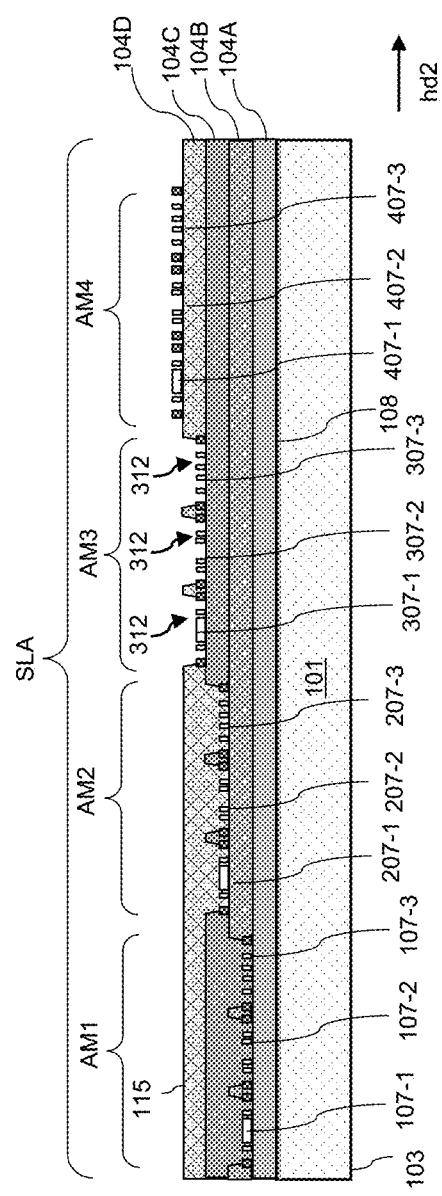
FIG. 8A is a vertical cross-sectional view of the intermediate structure during a process of forming a semiconductor package illustrating a fourth plurality of alignment marks and peripheral metal pads over the fourth dielectric material layer in a fourth alignment mark region of the scribe line area according to various embodiments of the present disclosure.
Figure 8D:
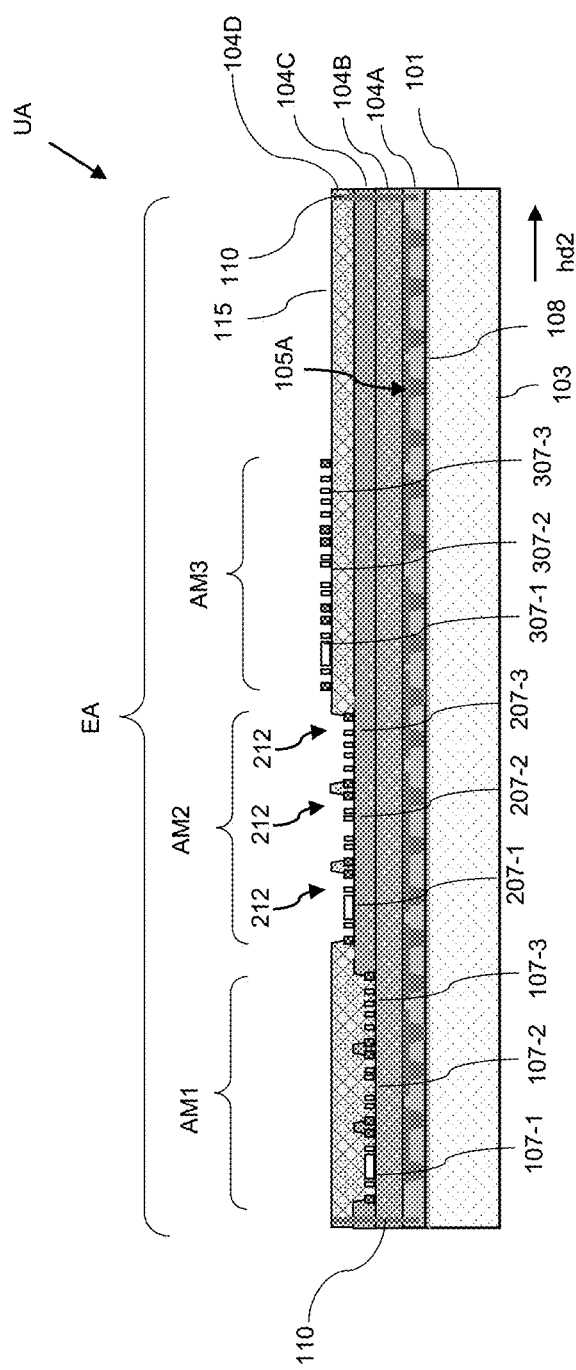
FIG. 8D is a vertical cross-sectional view of the intermediate structure during a process of forming a semiconductor package illustrating a third plurality of alignment marks and peripheral metal pads over the fourth dielectric material layer in a third alignment mark region of the in-chip die edge area according to various embodiments of the present disclosure.

FIG. 8A is a vertical cross-sectional view of the intermediate structure during a process of forming a semiconductor package illustrating a fourth plurality of alignment marks 407-1, 407-2 and 407-3 and peripheral metal pads 109 over the fourth dielectric material layer 104D in a fourth alignment mark region (AM4) of the SLA according to various embodiments of the present disclosure. FIG. 8B is a vertical cross-sectional view of the intermediate structure showing an enlarged view of the AM4 in the SLA including the fourth plurality of alignment marks 407-1, 407-2 and 407-3 and peripheral metal pads 109 over the fourth dielectric material layer 104D according to various embodiments of the present disclosure. FIG. 8C is a top view of the fourth alignment mark region in the scribe line area shown in FIG. 8B, where the vertical cross-sectional view in FIG. 7B is taken along line F-F' in FIG. 8C. FIG. 8D is a vertical cross-sectional view of the intermediate structure during a process of forming a semiconductor package illustrating a third plurality of alignment marks 307-1, 307-2 and 307-3 and peripheral metal pads 109 over the fourth dielectric material layer 104D in a AM3 of the in-chip die EA according to various embodiments of the present disclosure.

Referring to FIGS. 8A-8C, the fourth plurality of alignment marks 407-1, 407-2 and 407-3 and peripheral metal pads 109 may be formed over the upper surface 115 of the fourth dielectric material layer 104D in a AM4 of the SLA. The AM4 may be laterally offset from the first alignment mark region AM1 in a second horizontal direction hd2, the AM2 and the AM3 within the SLA. In various embodiments, the fourth plurality of alignment marks 407-1, 407-2 and 407-3 and the peripheral metal pads 109 may be formed of a suitable conductive material, such as a metallic material. The fourth plurality of alignment marks 407-1, 407-2 and 407-3 and the peripheral metal pads 109 may be formed using materials and processes as described above in connection with the first plurality of alignment marks 107-1, 107-2 and 107-3, the second plurality of alignment marks 207-1, 207-2 and 207-3, and the third plurality of alignment marks 307-1, 307-2 and 307-3. In some embodiments, the fourth plurality of alignment marks 407-1, 407-2 and 407-3 and the peripheral metal pads 109 may be formed of the same metallic material used to form the fourth redistribution structures 105D.

The fourth plurality of alignment marks 407-1, 407-2 and 407-3 in the fourth alignment mark region AM4 may have a similar or identical configuration as the first plurality of alignment marks 107-1, 107-2 and 107-3 in the AM1, the second plurality of alignment marks 207-1, 207-2 and 207-3 in the AM2 and/or the third plurality of alignment marks 307-1, 307-2 and 307-3 in the AM3. Each of the alignment marks 407-1, 407-2 and 407-3 in the AM4 may be in the form of a pattern that may be used as a reference for subsequent lithographic patterning steps. For example, the alignment marks 407-1, 407-2 and 407-3 may facilitate proper alignment when forming additional features, such as additional redistribution structures, over the fourth dielectric material layer 104D and the fourth redistribution structures 105D within the UAs of the exemplary intermediate structure. Although in the embodiment shown in FIGS. 8A-8C, the alignment marks 407-1, 407-2 and 407-3 in the AM4 have identical patterns as the alignment marks in the AM1, AM2, and AM3, it will be understood that the alignment marks in the different alignment mark regions AM1, AM2, AM3 and AM4 may have different patterns. In various embodiments, multiple incidents of the AM4 may be formed in different locations in the exemplary intermediate structure. For example, each of the SLA between adjacent UAs and/or around the periphery of the UAs may include at least one instance of a fourth alignment mark region AM4 as shown in FIGS. 8A-8C over the fourth dielectric material layer 104D.

A peripheral metal pad 109 may surround the periphery of each of the alignment marks 407-1, 407-2 and 407-3 in the AM4 of the SLA. Each of the peripheral metal pads 109 may be offset from the respective alignment marks 407-1, 407-2 and 407-3 by a minimum distance $W_1$. In some embodiments, $3 \ \mu m \leq W_1 \leq 10 \ \mu m$. In various embodiments, the peripheral metal pads 109 may have a width dimension $W_2$ that is between about 5 μm and about 20 μm. The peripheral metal pads 109 have a height dimension $H_2$ that may be greater than, less than, or equal to the height dimension $H_1$ of the alignment marks 407-1, 407-2 and 407-3. In some embodiments, the ratio of the height dimension of the peripheral metal pads 109 to the height dimension of the alignment marks 407-1, 407-2 and 407-3 (i.e., $H_2/H_1$) may be greater than or equal to 0.8 and less than or equal to 1.2. In some embodiments, the height dimension $H_2$ of the peripheral metal pads 109 may be greater than or equal to 1 μm and less than or equal to 10 μm, although lesser and greater height dimensions for the peripheral metal pads are within the contemplated scope of disclosure.

Referring to FIG. 8D, a third plurality of alignment marks 307-1, 307-2 and 307-3 and peripheral metal pads 109 may be formed over upper surface 115 of the fourth dielectric material layer 104D in a AM3 of the in-chip die EA according to various embodiments of the present disclosure. The AM3 of the in-chip die EA may be laterally offset from the AM1 and the AM2 of the in-chip die EA in a second horizontal direction hd2. The alignment marks 307-1, 307-2 and 307-3 and peripheral metal pads 109 formed over upper surface 115 of the fourth dielectric material layer 104D in the in-chip die EA may be in addition to, or as an alternative to, the alignment marks 407-1, 407-2 and 407-3 and peripheral metal pads 109 formed over the upper surface 115 of the fourth dielectric material layer 104D in the SLA described above with reference to FIGS. 8A-8C. The third plurality of alignment marks 307-1, 307-2 and 307-3 and peripheral metal pads 109 formed in the AM3 of the in-chip die EA may have a similar or identical construction as the alignment marks and peripheral metal pads 109 formed in the AM1 and the AM2 of the in-chip die EA, as well as to the alignment marks and peripheral metal pads 109 formed in the AM1, AM2, AM3 and AM4 of the SLA. Thus, repeated discussion of the details of the second plurality of alignment marks 207-1, 207-2 and 207-3 and peripheral metal pads 109 is omitted. Further, although the embodiment shown in FIG. 8D includes a single AM3 in an in-chip die EA of a UA, it will be understood that multiple incidents of the AM3 may be formed in different locations in the in-chip die EAs of the intermediate structure.

Figure 9C:
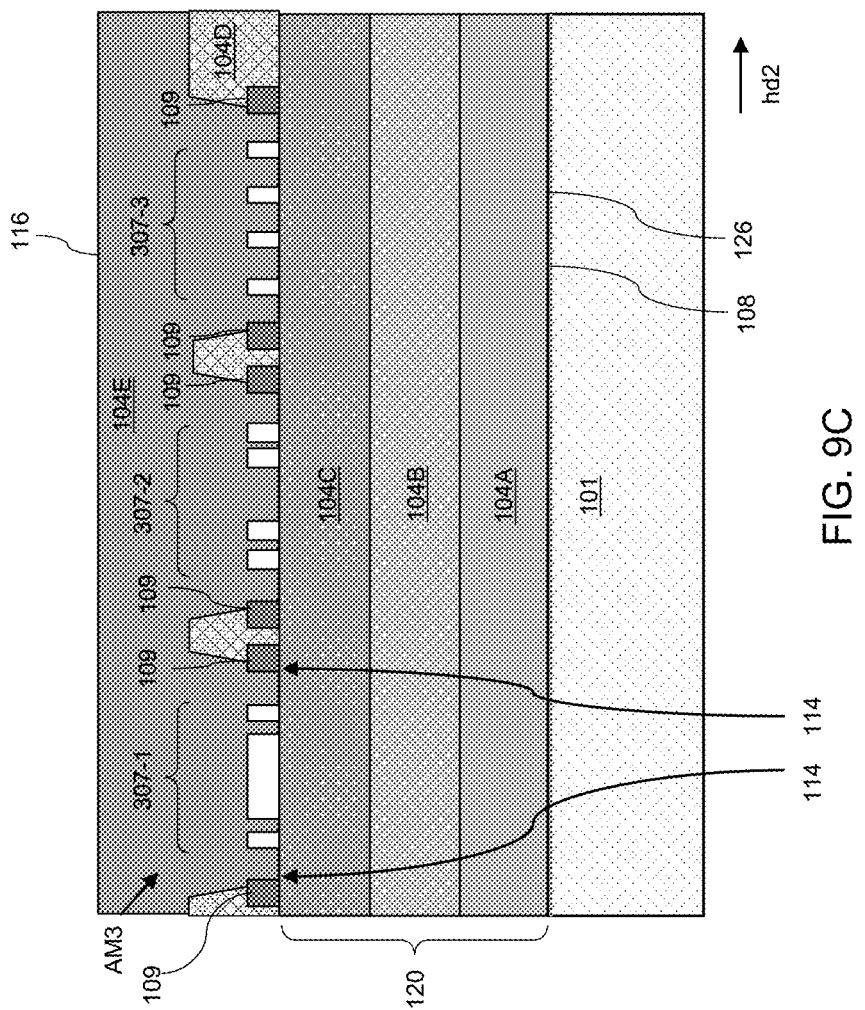
FIG. 9C is a vertical cross-sectional view of the intermediate structure showing an enlarged view of the third alignment mark region in the scribe line area illustrating the top dielectric material layer over the third plurality of alignment marks and over the upper surface and side surfaces of the fourth dielectric material layer and the upper surface of the third dielectric material layer according to various embodiments of the present disclosure.
Figure 9D:
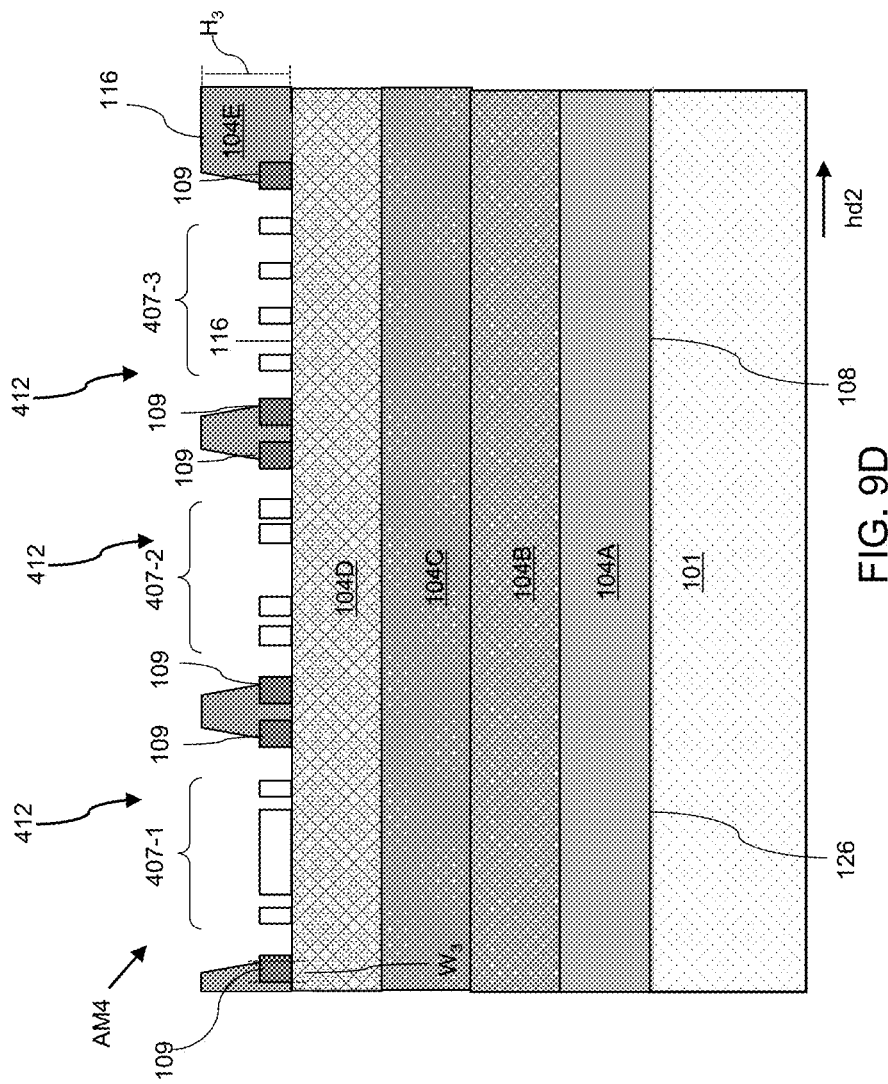
FIG. 9D is a vertical cross-sectional view of the intermediate structure showing an enlarged view of the fourth alignment mark region in the scribe line area including the recesses through the top dielectric layer exposing the fourth plurality of alignment marks according to various embodiments of the present disclosure.
Figure 9E:
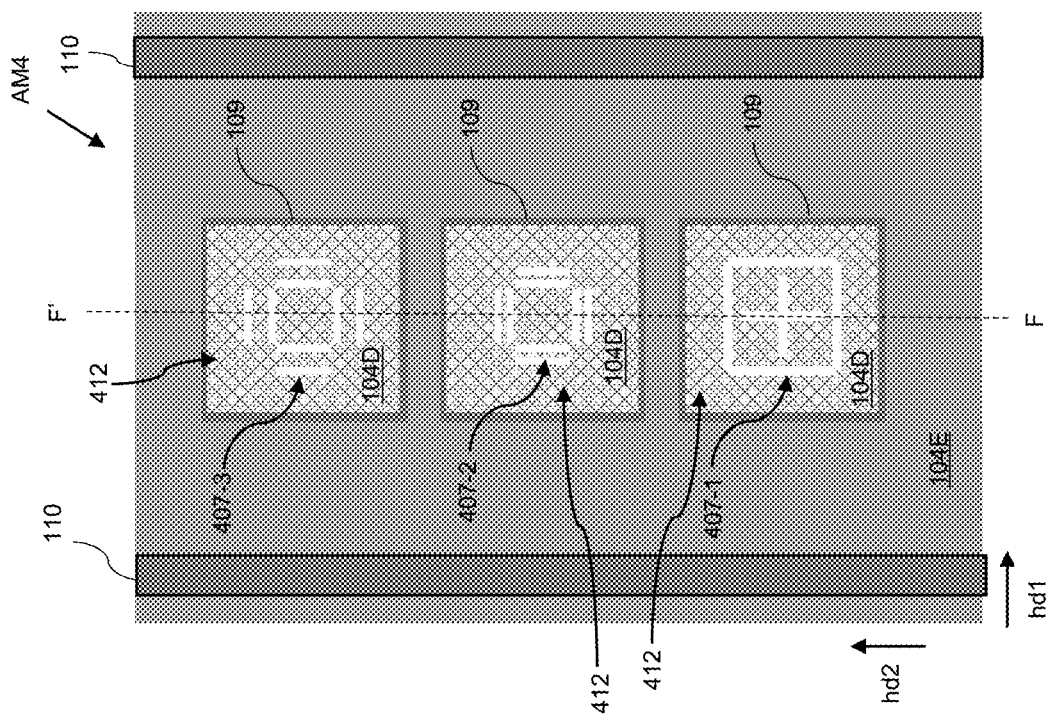
FIG. 9E is a top view of the fourth alignment mark region in the scribe line area shown in FIG. 9D according to various embodiments of the present disclosure.
Figure 9F:
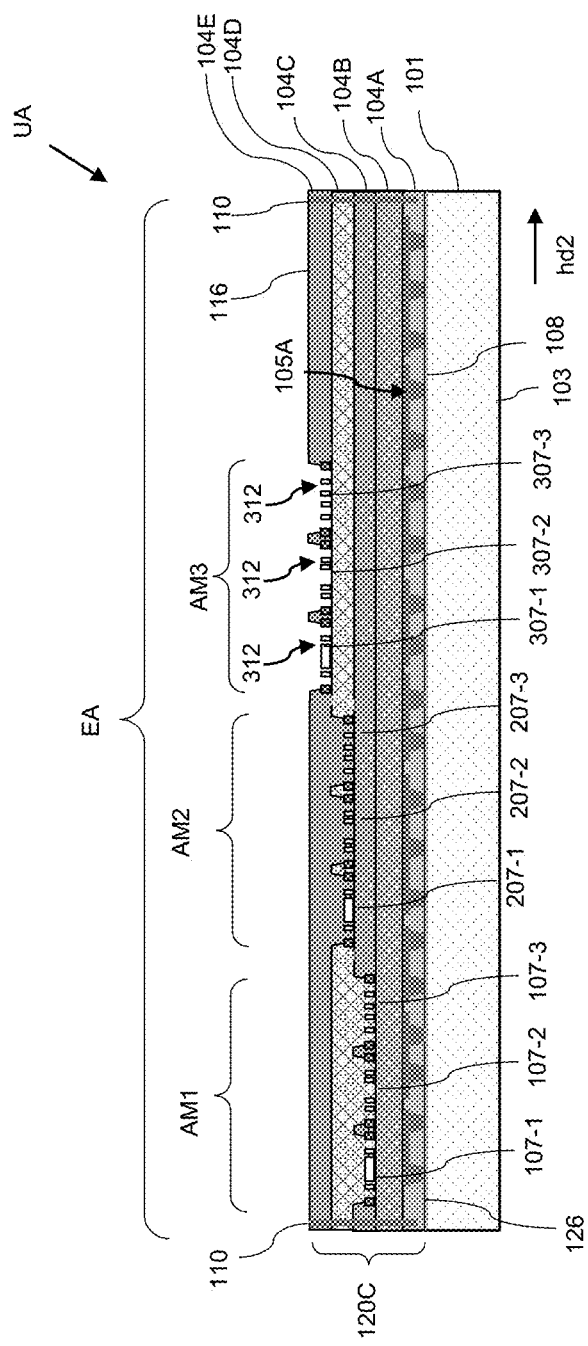
FIG. 9F is a vertical cross-sectional view of the intermediate structure along line B-B' in FIG. 9A illustrating recesses through the top dielectric material layer exposing the third plurality of alignment marks in the third alignment mark region of the in-chip die edge area according to various embodiments of the present disclosure.

FIG. 9A is a vertical cross-sectional view of the intermediate structure during a process of forming a semiconductor package illustrating a top dielectric material layer 104E and top redistribution structures 105E formed over the fourth dielectric material layer 104D and fourth redistribution structures 105D to provide a continuous interposer structure 120C according to various embodiments of the present disclosure. FIG. 9B is a vertical cross-sectional view of the intermediate structure along line A-A' in FIG. 9A illustrating the top dielectric material layer 104E over the third plurality of alignment marks 307-1, 307-2 and 307-3 in the AM3 of the SLA and recesses 412 through the top dielectric material layer 104E exposing the fourth plurality of alignment marks 407-1, 407-2 and 407-3 in the AM4 of the SLA according to various embodiments of the present disclosure. FIG. 9C is a vertical cross-sectional view of the exemplary intermediate structure showing an enlarged view of the AM3 in the SLA illustrating the top dielectric material layer 104E over the third plurality of alignment marks 307-1, 307-2 and 307-3 and over the upper surface and side surfaces of the fourth dielectric material layer 104D and the upper surface of the third dielectric material layer 104C according to various embodiments of the present disclosure. FIG. 9D is a vertical cross-sectional view of the intermediate structure showing an enlarged view of the AM4 in the SLA including the recesses 412 through the top dielectric layer 104E exposing the fourth plurality of alignment marks 407-1, 407-2 and 407-3 according to various embodiments of the present disclosure. FIG. 9E is a top view of the AM4 in the SLA shown in FIG. 9D, where the vertical cross-sectional view of FIG. 9D is taken along line F-F' in FIG. 9E. FIG. 9F is a vertical cross-sectional view of the intermediate structure along line B-B' in FIG. 9A illustrating recesses 312 through the top dielectric material layer 104E exposing the third plurality of alignment marks 307-1, 307-2 and 307-3 in the AM3 of the in-chip die EA according to various embodiments of the present disclosure.

Referring to FIGS. 9A-9F, the top dielectric material layer 104E may include a suitable dielectric material as described above, such as a dielectric polymer material. In some embodiments, the top dielectric material layer 104E may have the same composition as the first dielectric material layer 104A, the second dielectric material layer 104B, the third dielectric material layer 104C, and/or the fourth dielectric material layer 104D. Alternatively, the top dielectric material layer 104E may have a different composition than the first dielectric material layer 104A, the second dielectric material layer 104B, the third dielectric material layer 104C, and/or the fourth dielectric material layer 104D. The top dielectric material layer 104E may be deposited over the upper surface of 115 of the fourth dielectric material layer 104D using a suitable deposition process, such as a spin coating and drying process. Within the UAs of the intermediate structure, the top dielectric material layer 104E may be deposited over the fourth redistribution structures 105D, the seal rings 110, and over the second plurality of alignment marks 207-1, 207-2 and 207-3 and peripheral metal pads 109 and the third plurality of alignment marks 307-1, 307-2 and 307-3 and peripheral metal pads 109 in the AM2 and AM3 in the in-chip die EA. Within the SLA of the intermediate structure, the top dielectric material layer 104E may be deposited over the third plurality of alignment marks 307-1, 307-2 and 307-3 and over the exposed upper and side surfaces of the peripheral metal pads 109, and over the upper surface and side surfaces of the fourth dielectric material layer 104D and the exposed upper surface of the third dielectric material layer 104C in the AM3. The top dielectric material layer 104E may also be deposited over the fourth plurality of alignment marks 407-1, 407-2 and 407-3 and the peripheral metal pads 109 in the AM4 of the SLA.

Referring to FIGS. 9B and 9C, the top dielectric material layer 104E may fill the recesses 312 in the fourth dielectric material layer 104D through which the third plurality of alignment marks 307-1, 307-2 and 307-3 in the AM3 of the SLA were previously exposed. Thus, the top dielectric material layer 104E may contact the upper surface 115 and side surfaces of the fourth dielectric material layer 104D within the AM3, and may also contact the exposed upper surface 113 of the third dielectric material layer 104C at the bottom of the recesses 312. Thus, the third dielectric material layer 104C, fourth dielectric material layer 104D and top dielectric material layer 104E all contact one another within the AM3. This may result in weak spots in the multi-layer structure, particularly around the peripheral edges of the alignment marks 307-1, 307-2 and 307-3 where all three of the third dielectric material layer 104C, fourth dielectric material layer 104D and top dielectric material layer 104E converge (which may be referred to as "stacking interface regions" 114). In particular, these regions are prone to crack formation under thermal and/or mechanical stress due at least in part to a relatively low amount of adhesion between the respective third dielectric material layer 104C, fourth dielectric material layer 104D and top dielectric material layer 104E. In various embodiments, by providing a peripheral metal pad 109 around the alignment marks 307-1, 307-2 and 307-3 in the AM3 that contacts at least the third dielectric material layer 104C and the fourth dielectric material layer 104D, the adhesion between the third dielectric material layer 104C, fourth dielectric material layer 104D and top dielectric material layer 104E may be enhanced, and the likelihood of crack formation may be reduced.

Referring to FIG. 9E, within the in-chip die EA the top dielectric material layer 104E may fill the recesses 212 in the fourth dielectric material layer 104D through which the second plurality of alignment marks 207-1, 207-2 and 207-3 in the AM2 of the in-chip die EA were previously exposed. Thus, the top dielectric material layer 104E may contact the upper surface 115 and side surfaces of the fourth dielectric material layer 104D within the AM2, and may also contact the exposed upper surface 113 of the third dielectric material layer 104C at the bottom of the recesses 212. In various embodiments, by providing a peripheral metal pad 109 around the alignment marks 207-1, 207-2 and 207-3 in the AM2 that contacts at least the third dielectric material layer 104C and the fourth dielectric material layer 104D, the adhesion between the third dielectric material layer 104C, fourth dielectric material layer 104D and top dielectric material layer 104E may be enhanced, and the likelihood of crack formation may be reduced.

Referring to FIGS. 9B, 9D and 9E, portions of the top dielectric material layer 104E may be removed from the SLA to expose the alignment marks 407-1, 407-2 and 407-3 in the AM4. In various embodiments, the top dielectric material layer 104E may be patterned as described above with reference to FIGS. 3B-3D to provide a plurality of recesses 412 through the top dielectric material layer 104E, where an alignment mark 407-1, 407-2 and 407-3 may be exposed at the bottom of each of the recesses 412. In some embodiments, the peripheral metal pads 109 surrounding the respective alignment marks 407-1, 407-2 and 407-3 may be partially exposed within the respective recesses 412. A portion of the peripheral metal pads 109 may remain covered by the top dielectric material layer 104E. Referring to FIG. 9D, the portion of the peripheral metal pads 109 that remains covered by the top dielectric material layer 104E may have a width dimension $W_3$. In some embodiments, the ratio of the portion of upper surface of the peripheral metal pad 109 that remains covered by the top dielectric material layer 104E to the total width dimension of the peripheral metal pad 109 (i.e., $W_3/W_2$) may be greater than or equal to 0.1 and less than or equal to 1.0.

Referring to FIG. 9D, the top dielectric material layer 104E may have a thickness dimension $H_3$ between the upper surface 115 of the fourth dielectric material layer 104D and the upper surface 116 of the top dielectric material layer 104E that is greater than the height dimension $H_2$ of the peripheral metal pads 109. In various embodiments, the ratio of the height dimension of the peripheral metal pads 109 to the thickness dimension of the top dielectric material layer 104E (i.e., $H_2/H_3$) may be greater than or equal to 0.1 and less than 1.0.

In various embodiments, the alignment marks 407-1, 407-2 and 407-3 exposed through the recesses 412 in the AM4 may be used for alignment and registration of the photolithography equipment used to form the top redistribution structures 105E within the UAs of the intermediate structure. Referring to FIG. 9A, within each of the UAs, the top dielectric material layer 104E may be patterned as described above to form open regions (e.g., trenches and/or via openings) within the top dielectric material layer 104E. The top redistribution structures 105E may be formed by providing a conductive material, such as a metallic material, within the plurality of open regions formed in the top dielectric material layer 104E using a suitable deposition process as described above. Portions of the metallic material may be removed from over the upper surface 116 of the top dielectric material layer 104E via a planarization process (e.g., CMP) and/or an etching process. The remaining portion of the metallic material may form the top redistribution structures 105E embedded within the top dielectric material layer 104E. The top redistribution structures 105E may be located over and may electrically contact fourth distribution structures 105C in the underlying fourth dielectric material layer 104D. In some embodiments, a portion of the metallic material may form a portion of the seal ring 110 extending around the periphery of the redistribution structures 105A, 105B, 105C, 105D and 105E within each of the unit areas (UAs), as shown in FIGS. 9A and 9F.

Referring to FIG. 9F, portions of the top dielectric material layer 104E may be removed from the in-chip die EA to expose the third plurality of alignment marks 307-1, 307-2 and 307-3 in the AM3 of the in-chip die EA. In various embodiments, the top dielectric material layer 104E may be patterned as described above with reference to FIGS. 3B-3D to provide a plurality of recesses 312 through the top dielectric material layer 104E, where an alignment mark 307-1, 307-2 and 307-3 may be exposed at the bottom of each of the recesses 312. In some embodiments, the peripheral metal pads 109 surrounding the respective alignment marks 307-1, 307-2 and 307-3 may be partially exposed within the respective recesses 312. A portion of the peripheral metal pads 109 may remain covered by the top dielectric material layer 104E. In various embodiments, the alignment marks 307-1, 307-2 and 307-3 exposed through the recesses 312 in the AM3 in the in-chip die EA may be used for alignment and registration of the photolithography equipment used to form the top redistribution structures 105E within the UAs of the intermediate structure.

Referring again to FIGS. 9A-9F a continuous interposer structure 120C may include a stack of dielectric material layers 104A, 104B, 104C, 104D and 104E (collectively referred to as dielectric material layers 104) over a carrier substrate 101. Within each UA of the continuous interposer structure 120C, a network of interconnected redistribution structures 105A, 105B, 105C, 105D and 105E may extend between a first surface 116 and a second surface 126 of the stack of dielectric material layers 104A, 104B, 104C, 104D and 104E. A seal ring 110 may optionally surround the redistribution structures 105A, 105B, 105C, 105D and 105E (collectively referred to as redistribution structures 105) within each UA. SLAs may be located around each UA and between adjacent UAs. The SLAs may not include redistribution structures in various embodiments. In the embodiment shown in FIGS. 9A-9F, the continuous interposer structure 120C includes a stack of five dielectric material layers 104A, 104B, 104C, 104D and 104E, each having redistribution structures 105A, 105B, 105C, 105D and 105E embedded therein, although it will be understood that a continuous interposer structure 120C may include a greater or lesser number of dielectric material layers 104 and embedded redistribution structures 105.

In various embodiments, the continuous interposer structure 120C may include at least one alignment mark 107, 207, 307, 407. The at least one alignment mark 107, 207, 307, 407 may be located in a SLA and/or in an in-chip die EA of a UA of the continuous interposer structure 120C. In some embodiments, each of the dielectric material layers 104 of the dielectric layer stack underlying a top dielectric material layer 105E may include at least one alignment mark 107, 207, 307, 407 located over and contacting the respective dielectric material layer 104. A peripheral metal pad 109 may surround each of the alignment marks 107, 207, 307, 407.

FIG. 10 is a vertical cross-sectional view of the intermediate structure during a process of forming a semiconductor package illustrating a plurality of interposer bonding structures 117 formed over the upper surface 116 of the continuous interposer structure 120C according to various embodiments of the present disclosure. Referring to FIG. 10, the interposer bonding structures 117 may include a plurality of metallic bumps. The interposer bonding structures 117 may be formed by depositing one or more layers of a metal material and patterning the one or more layers of metal material to form the plurality of interposer bonding structures 117 over the upper surface 116 of the continuous interposer structure 120C. Each interposer bonding structure 117 may be electrically coupled to an underlying redistribution structure 105 of the continuous interposer structure 120C. In some embodiments, the interposer bonding structures 117 may form at least one periodic two-dimensional array (such as a rectangular array) of interposer bonding structures 117 within a UA. In some embodiments, a plurality of interposer bonding structures 117 may be formed over the upper surface 116 of the continuous interposer structure 120C in each UA.

In various embodiments, the interposer bonding structures 117 may be configured for subsequent microbump bonding (i.e., C2 bonding) to corresponding bonding structures formed on semiconductor integrated circuit (IC) dies. In some embodiments, the interposer bonding structures 117 may include a plurality of metal pillars. The metal pillars may include copper or a copper-containing alloy. In some embodiments, the interposer bonding structures 117 may include a plurality of metal stacks, such as a plurality of Cu—Ni—Cu stacks. In some embodiments, the interposer bonding structures 117 may include a solder material, such as tin or a tin-containing alloy, on an upper surface of the interposer bonding structures 117. Other suitable materials and/or configurations for the interposer bonding structures 117 are within the contemplated scope of disclosure.

Figure 11:
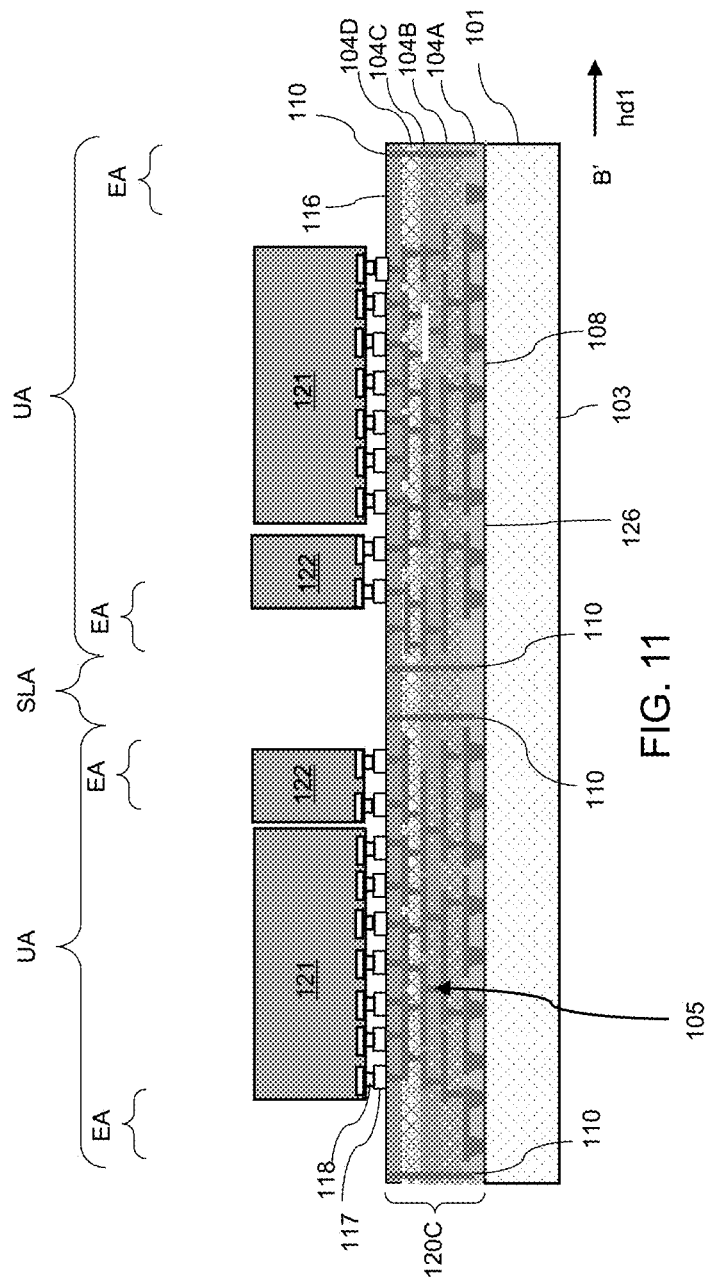
FIG. 11 is a vertical cross-sectional view of the intermediate structure during a process of forming a semiconductor package showing a plurality of semiconductor integrated circuit (IC) dies mounted over the upper surface of the continuous interposer structure according to various embodiments of the present disclosure.

FIG. 11 is a vertical cross-sectional view of the intermediate structure during a process of forming a semiconductor package showing a plurality of semiconductor IC dies 121, 122 mounted over the upper surface 116 of the continuous interposer structure 120C according to various embodiments of the present disclosure. Referring to FIG. 11, the plurality of semiconductor IC dies may include at least one system-on-chip (SoC) die 121. An SoC die 121 may include, for example, an application processor die, a central processing unit die, and/or a graphic processing unit die. In some embodiments, the plurality of IC semiconductor dies may include at least one memory die 122. The at least one memory die may include a high bandwidth memory (HBM) die. In some embodiments, a HBM die may include a vertical stack of interconnected memory dies. Alternatively, or in addition, the at least one memory die may include a dynamic random access memory (DRAM) die. In some embodiments, the plurality of semiconductor IC dies 121, 122 may be homogeneous, meaning that all of the semiconductor IC dies may be of the same type (e.g., all SoC dies, all HBM dies, all DRAM dies, etc.). Alternatively, the plurality of semiconductor IC dies 121, 122 may be heterogeneous, meaning that the plurality of semiconductor IC dies may include different types of semiconductor IC dies (e.g., at least one SoC die 121 and at least one memory die 122). In some embodiments, the plurality of semiconductor IC dies 121, 122 may include one or more SoC dies 121 and a plurality of HBM dies 122. Further, although two semiconductor IC dies 121, 122 are shown mounted over the upper surface 116 of the continuous interposer structure 120C within each unit area UA in the exemplary embodiment of FIG. 11, it will be understood that in various embodiments more than two semiconductor IC dies 121, 122 may be mounted over the upper surface 116 of the continuous interposer structure 120C within each unit area UA.

Referring again to FIG. 11, each of the semiconductor IC dies 121, 122 may include a plurality of semiconductor die bonding structures 118 located over a lower surface of the semiconductor IC die 121, 122. The semiconductor die bonding structures 118 on the semiconductor IC dies 121, 122 may have a similar or identical configuration as the interposer bonding structures 117 over the upper surface 116 of the continuous interposer structure 120C described above with reference to FIG. 10. For example, the semiconductor die bonding structures 118 on the lower surfaces of the semiconductor IC dies 121, 122 may include a plurality of metallic bumps, such as metal pillars and/or metal stacks. In some embodiments, the semiconductor die bonding structures 118 on the semiconductor IC dies 121, 122 may include a solder material, such as tin or a tin-containing alloy, on the lower surface of the semiconductor die bonding structures 118. The semiconductor die bonding structures 118 on the lower surfaces of each semiconductor IC die 121, 122 may be configured for microbump bonding (i.e., C2 bonding) to corresponding interposer bonding structures 117 on the upper surface 116 of the continuous interposer structure 120C.

The semiconductor IC dies 121, 122 may be mounted over the upper surface 116 of the continuous interposer structure 120C by placing each of the semiconductor IC dies 121, 122 over the upper surface 116 of the continuous interposer structure 116 (e.g., using a pick-and-place apparatus). The semiconductor IC dies 121, 122 may be aligned over the upper surface 116 of the continuous interposer structure 120C such that the semiconductor die bonding structures 118 on the lower surfaces of the semiconductor IC dies 121, 122 contact corresponding interposer bonding structures 117 over the upper surface 116 of the continuous interposer structure 120C. A reflow process may be used to bond the semiconductor die bonding structures 118 on the lower surfaces of the semiconductor IC dies 121, 122 to the corresponding interposer bonding structures 117 over the upper surface 116 of the continuous interposer structure 120C, thereby providing a mechanical and electrical connection between each of the semiconductor IC dies 121, 122 and the continuous interposer structure 120C. In various embodiments, a plurality of semiconductor IC dies 121, 122 may mounted over the upper surface 116 of the continuous interposer structure 120C within each UA.

Figure 12A:
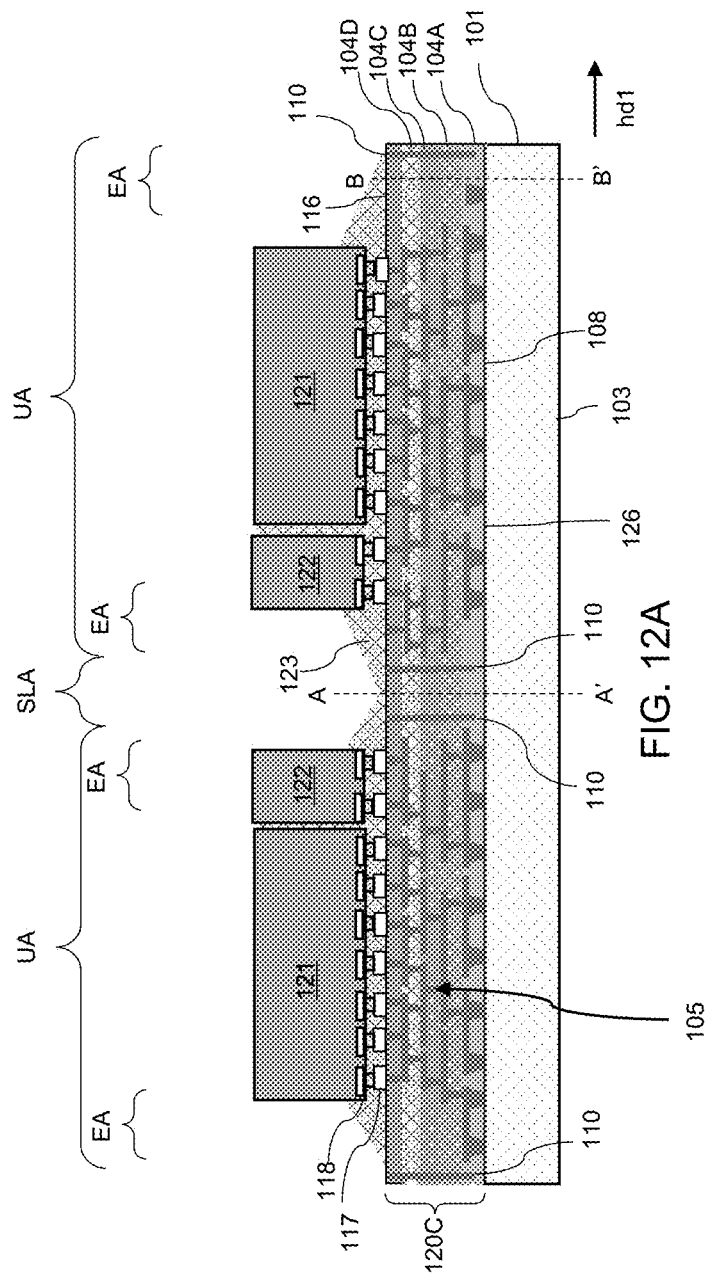
FIG. 12A is a vertical cross-sectional view of the intermediate structure during a process of forming a semiconductor package showing a first underfill material portion located between the lower surfaces of the semiconductor IC dies and the upper surface of the continuous interposer structure according to various embodiments of the present disclosure.

FIG. 12A is a vertical cross-sectional view of the intermediate structure during a process of forming a semiconductor package showing a first underfill material portion 123 located between the lower surfaces of the semiconductor IC dies 121, 122 and the upper surface 116 of the continuous interposer structure 120C according to various embodiments of the present disclosure. FIG. 12B is a vertical cross-sectional view of the exemplary intermediate structure along line A-A' in FIG. 12A illustrating the first underfill material portion 123 over the fourth plurality of alignment marks 407-1, 407-2 and 407-3 in the AM4 of the SLA according to various embodiments of the present disclosure. FIG. 12C is a vertical cross-sectional view of the exemplary intermediate structure along line B-B' in FIG. 12A illustrating the first underfill material portion 123 over the third plurality of alignment marks 307-1, 307-2 and 307-3 in the AM3 of the in-chip die EA according to various embodiments of the present disclosure.

Referring to FIGS. 12A-12C, the first underfill material portion 123 may be applied into the spaces between the upper surface 116 of the continuous interposer structure 120C and the plurality of semiconductor IC dies 121, 122 mounted to the continuous interposer structure 120C. The first underfill material portion 123 may laterally surround and contact each of the interposer bonding structures 117 and semiconductor die bonding structures 118 that bond the respective semiconductor IC dies 121, 122 to the continuous interposer structure 120C. The first underfill material portion 123 may also be located between adjacent semiconductor IC dies 121, 122 of the plurality of semiconductor IC dies 121, 122 mounted within each UA.

The first underfill material portion 123 may include any underfill material known in the art. For example, the first underfill material portion 123 may be composed of an epoxy-based material, which may include a composite of resin and filler materials. Other suitable materials for the first underfill material portion 123 are within the contemplated scope of disclosure. Any known underfill material application method may be used to apply the first underfill material portion 123.

Referring to FIG. 12B, in some embodiments, the first underfill material portion 123 may partially or completely fill the recesses 412 through the top dielectric material layer 104E through which the fourth plurality of alignment marks 407-1, 407-2 and 407-3 are exposed in the AM4 in the SLA. Referring to FIG. 12C, in some embodiments, the first underfill material portion 123 may partially or completely fill the recesses 312 through the top dielectric material layer 104E through which the third plurality of alignment marks 307-1, 307-2 and 307-3 are exposed in the AM3 in the in-chip die EA.

Figure 13A:
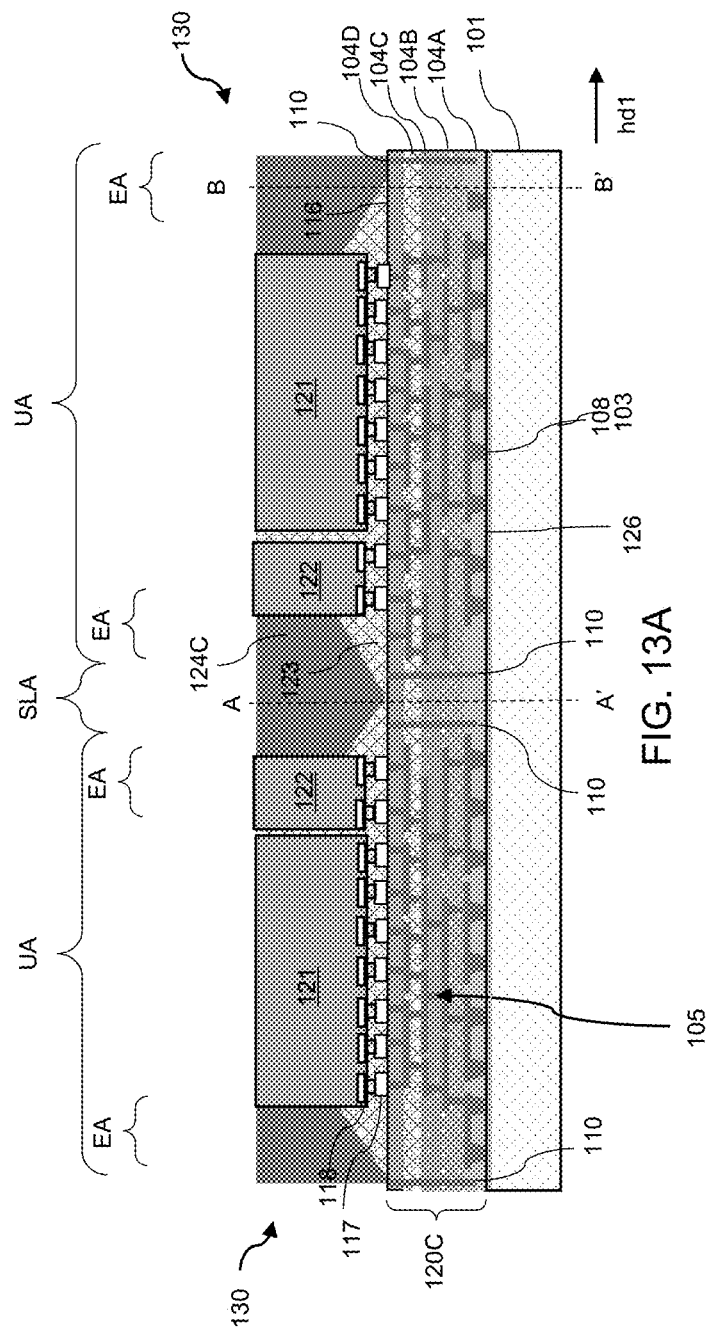
FIG. 13A is a vertical cross-sectional view of the intermediate structure during a process of forming a semiconductor package showing a continuous molding portion over the first underfill material portion and around the outer periphery of the semiconductor IC dies according to various embodiments of the present disclosure.
Figure 13B:
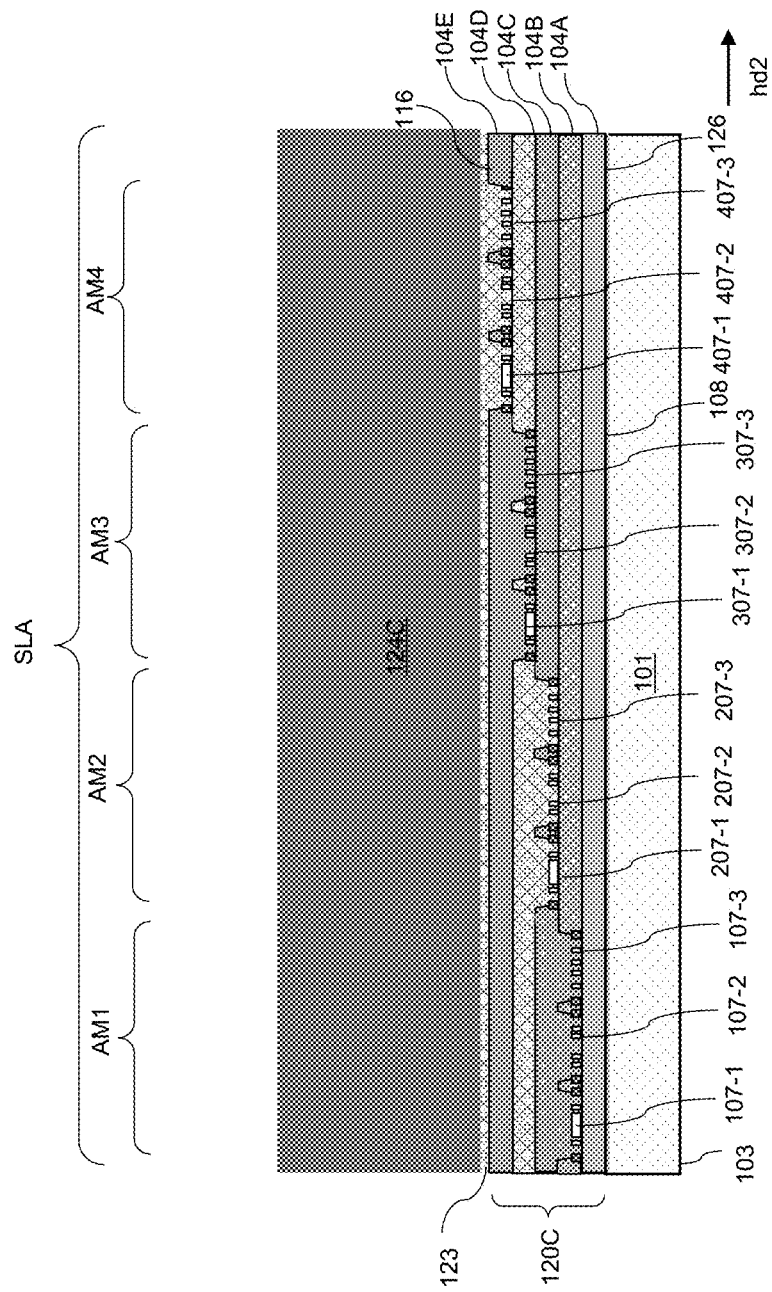
FIG. 13B is a vertical cross-sectional view of the intermediate structure along line A-A' in FIG. 13A illustrating the continuous molding portion over the first underfill material portion in the scribe line area according to various embodiments of the present disclosure.
Figure 13C:
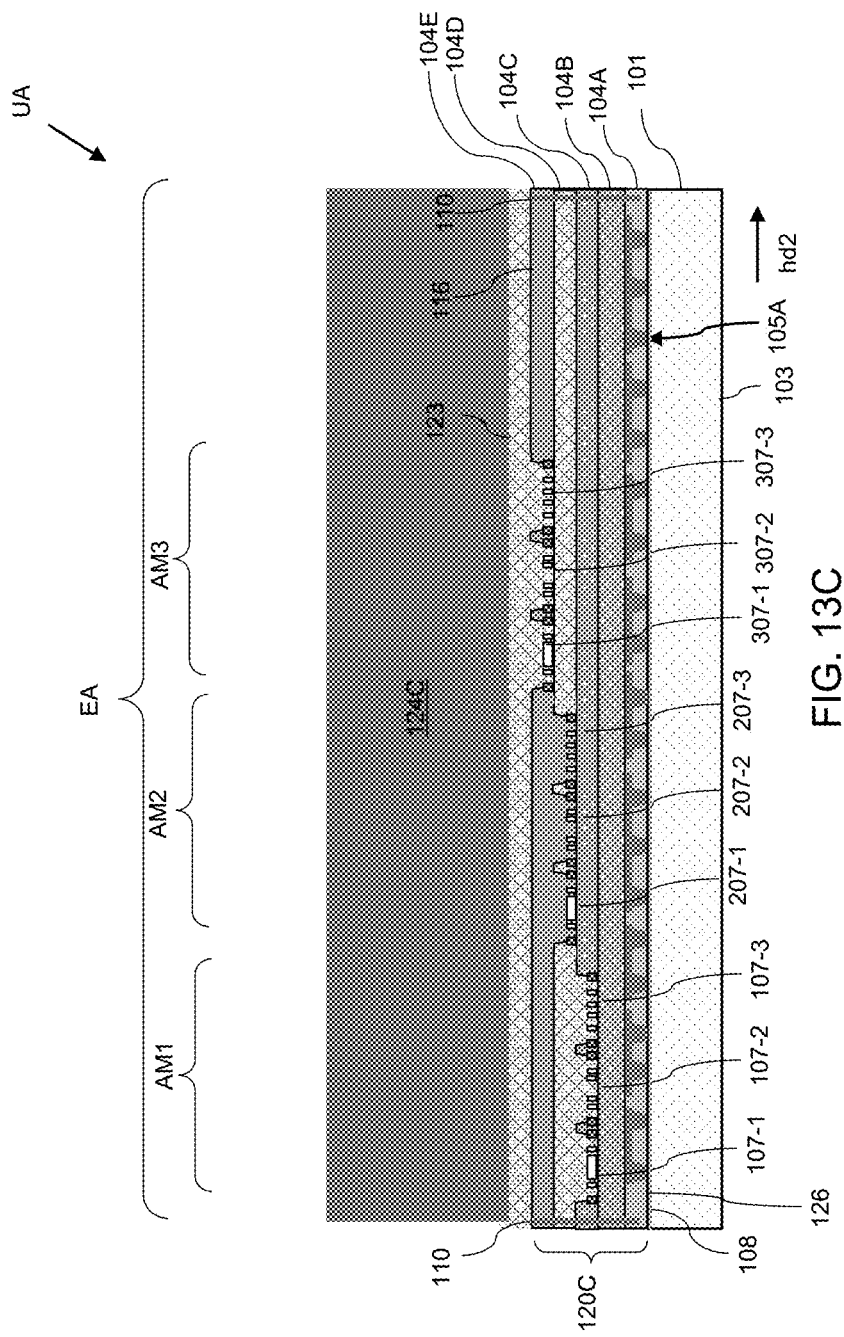
FIG. 13C is a vertical cross-sectional view of the intermediate structure along line B-B' in FIG. 13A illustrating the continuous molding portion over the first underfill material portion the in-chip die edge area according to various embodiments of the present disclosure.

FIG. 13A is a vertical cross-sectional view of the intermediate structure during a process of forming a semiconductor package showing a continuous molding portion 124C over the first underfill material portion 123 and around the outer periphery of the semiconductor IC dies 121, 122 according to various embodiments of the present disclosure. FIG. 13B is a vertical cross-sectional view of the intermediate structure along line A-A' in FIG. 13A illustrating the continuous molding portion 124C over the first underfill material portion 123 in the SLA according to various embodiments of the present disclosure. FIG. 13C is a vertical cross-sectional view of the exemplary intermediate structure along line B-B' in FIG. 13A illustrating the continuous molding portion 124C over the first underfill material portion 123 the in-chip die EA according to various embodiments of the present disclosure.

Referring to FIGS. 13A-13C, a continuous molding portion 124C may laterally surround the plurality of semiconductor IC dies 121, 122 mounted to the continuous interposer structure 120C within each UA. The continuous molding portion 124C may contact lateral side surfaces of at least some of the semiconductor IC dies 121, 122 and may also contact the first underfill material portion 123. In various embodiments, the continuous molding portion 124C may include an epoxy material. For example, the continuous molding portion 124C may include an epoxy mold compound (EMC) that may include epoxy resin, a hardener (i.e., a curing agent), silica or other filler material(s), and optionally additional additives. The EMC may be applied around the periphery of the semiconductor IC dies 121, 122 in liquid or solid form, and may be hardened (i.e., cured) to form a continuous molding portion 124C having sufficient stiffness and mechanical strength surrounding the plurality of semiconductor IC dies 121, 122. Portions of the continuous molding portion 124C that extend above a horizontal plane including the top surfaces of the semiconductor IC dies 121, 122 may be removed using a planarization process, such as a chemical mechanical planarization (CMP) process.

In various embodiments, each UA of the intermediate structure may include a first underfill material portion 123 located between the upper surface 116 of the continuous interposer structure 120C and the undersides of the plurality of semiconductor IC dies 121, 122 mounted to the continuous interposer structure 120C, and a continuous molding portion 124C around the outer periphery of the plurality of semiconductor IC dies 121, 122. In some embodiments, the continuous molding portion 124C may form a continuous matrix extending over the SLAs extending around and between the UAs and laterally surrounding and embedding the respective sets of semiconductor IC dies 121, 122 within each of the UAs.

Referring to FIG. 13B, in some embodiments, the continuous molding portion 124C may overlie the first underfill material portion 123 and the AM1, AM2, AM3 and AM4 in the SLA. In embodiments in which the first underfill material portion 123 is not present in, or does not extend fully over, the SLA, the continuous molding portion 124C may contact the top dielectric material layer 104E and may extend into the recesses 412 through the top dielectric material layer 104E through which the fourth plurality of alignment marks 407-1, 407-2 and 407-3 are exposed in the AM4 in the SLA. Referring to FIG. 13C, in some embodiments, the continuous molding portion 124C may overlie the first underfill material portion 123 and the AM1, AM2, and AM3 in the in-chip die EA. In embodiments in which the first underfill material portion 123 is not present in, or does not extend fully over, the in-chip die EA, the continuous molding portion 124C may contact the top dielectric material layer 104E and may extend into the recesses 312 through the top dielectric material layer 104E through which the third plurality of alignment marks 307-1, 307-2 and 307-3 are exposed in the AM3 in the in-chip die EA.

Figure 14:
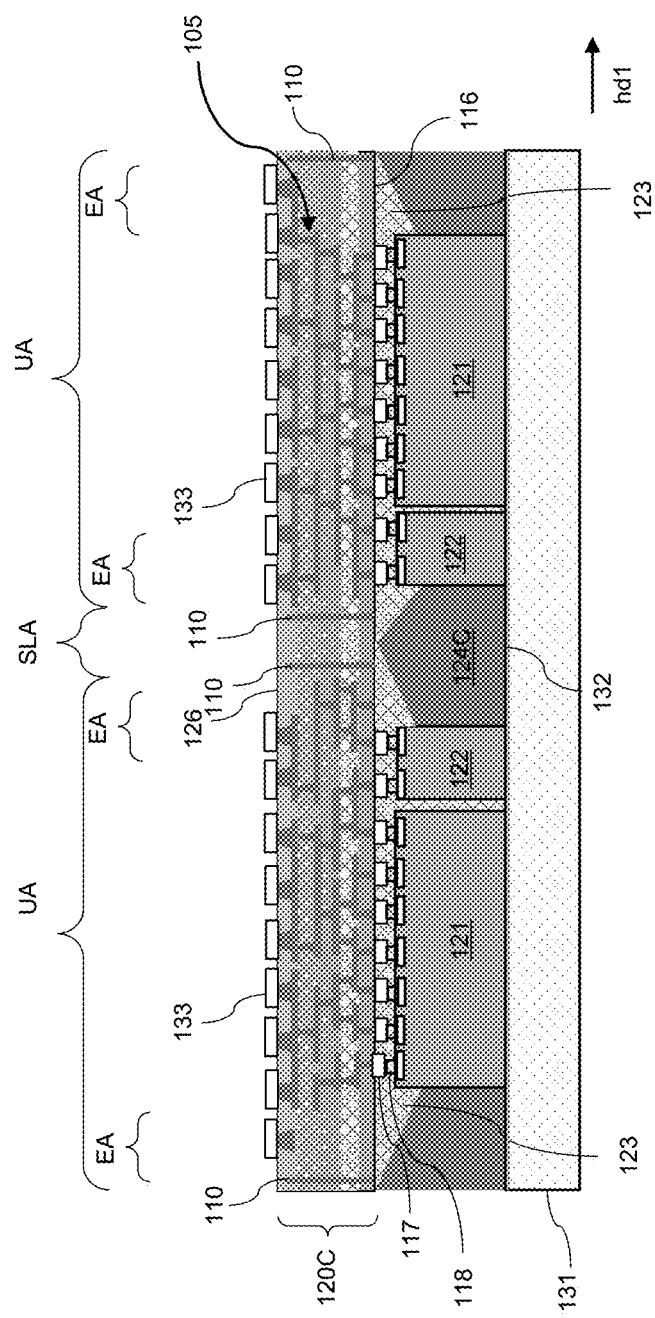
FIG. 14 is a vertical cross-sectional view of the intermediate structure during a process of forming a semiconductor package showing the first carrier substrate removed and the exemplary intermediate structure located on a second carrier substrate and a plurality of bonding pads formed on a surface of the interposer according to various embodiments of the present disclosure.

FIG. 14 is a vertical cross-sectional view of the intermediate structure during a process of forming a semiconductor package showing the first carrier substrate 101 removed and the exemplary intermediate structure located on a second carrier substrate 131 and a plurality of bonding pads 133 formed on a surface 126 of the continuous interposer structure 120C according to various embodiments of the present disclosure. Referring to FIG. 14, the first carrier substrate 101 may be removed using any suitable method known in the art. In embodiments in which the first carrier substrate 101 is adhered to the continuous interposer structure 120C by a first release layer 108, the first release layer 108 may be subjected to a treatment that causes the first release layer 108 to lose its adhesive properties. This may enable the first carrier substrate 101 to be separated from the continuous interposer structure 120C. For example, the first release layer 108 may include a light-to-heat conversion (LTHC) material that may be irradiated by optical radiation in a specified wavelength range, such as ultraviolet radiation, causing the LTHC material to heat up and thereby lose adhesion. The first release layer 108 may optionally be irradiated through the first carrier substrate 101 in embodiments in which the first carrier substrate 101 is composed of an optically-transparent material. Alternatively, the first release layer 108 may include a thermally-decomposing adhesive material. The exemplary intermediate structure be subjected to a thermal anneal process at a debonding temperature sufficient to cause the first release layer 108 to decompose and thereby enable the first carrier substrate 101 to be detached from the continuous interposer structure 120C.

Referring again to FIG. 14, the intermediate structure may be inverted (i.e., flipped over), either prior to or following the removal of the first carrier substrate 101, such that the intermediate structure may be located over and supported by the second carrier substrate 131 such that a surface 126 of the continuous interposer structure 120C opposite the second carrier substrate 131 is exposed. In some embodiments, a second release layer 132 may optionally be located between the second carrier substrate 131 the exemplary intermediate structure. Referring to FIG. 14, the second release layer 132 may include an adhesive material that may adhere the second carrier substrate 131 to the plurality of semiconductor dies 121, 122, the first underfill material portion 123 and the continuous molding portion 124C. As with the first release layer 108 described above, the second release layer 132 may also be configured to lose its adhesive properties when subjected to a treatment using an energy source, such as a thermal, optical (e.g., UV, laser, etc.) and/or sonic (e.g., ultrasonic) energy source. In some embodiments, the first release layer 108 and the second release layer 132 may be composed of the same material(s). Alternatively, the first release layer 108 and the second release layer 132 may be composed of different material(s). The second carrier substrate 131 may be formed of a suitable substrate material, such as the materials described above with reference to the first carrier substrate 101. In some embodiments, the second carrier substrate 131 may be composed of the same material(s) as the first carrier substrate 101. Alternatively, the second carrier substrate 131 and the first carrier substrate 101 may be composed of different material(s).

Referring again to FIG. 14, a plurality of bonding pads 133 may be formed over the exposed surface 126 of the continuous interposer structure 120C. The plurality of bonding pads 133 may be formed of a suitable metallic material, such as copper, aluminum, nickel, titanium, etc., including combinations and alloys thereof. Other suitable metallic materials for the bonding pads 133 are within the contemplated scope of disclosure. The bonding pads 133 may be a single layer structure, or may be a multi-layer structure composed of multiple layers of different metallic materials. Each of the bonding pads 133 may be electrically coupled to an underlying redistribution structure 105 of the continuous interposer structure 120C. In some embodiments, the plurality of bonding pads 133 may form a periodic two-dimensional array (such as a rectangular array) of bonding pads 133 within each of the UAs. In various embodiments, the plurality of bonding pads 133 may be formed by depositing a continuous metallic material over the surface 126 of the continuous interposer structure 120C, and lithographically patterning and etching the continuous metallic material to form a plurality of discrete bonding pads 133 over the surface 126 of the continuous interposer structure 120C.

Figure 15A:
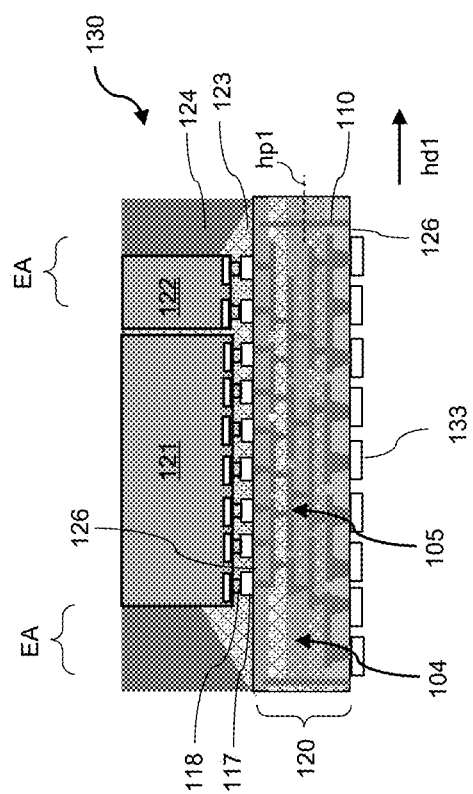
FIG. 15A is a vertical cross-sectional view of the intermediate structure during a process of forming a semiconductor package showing a package structure according to various embodiments of the present disclosure.
Figure 15B:
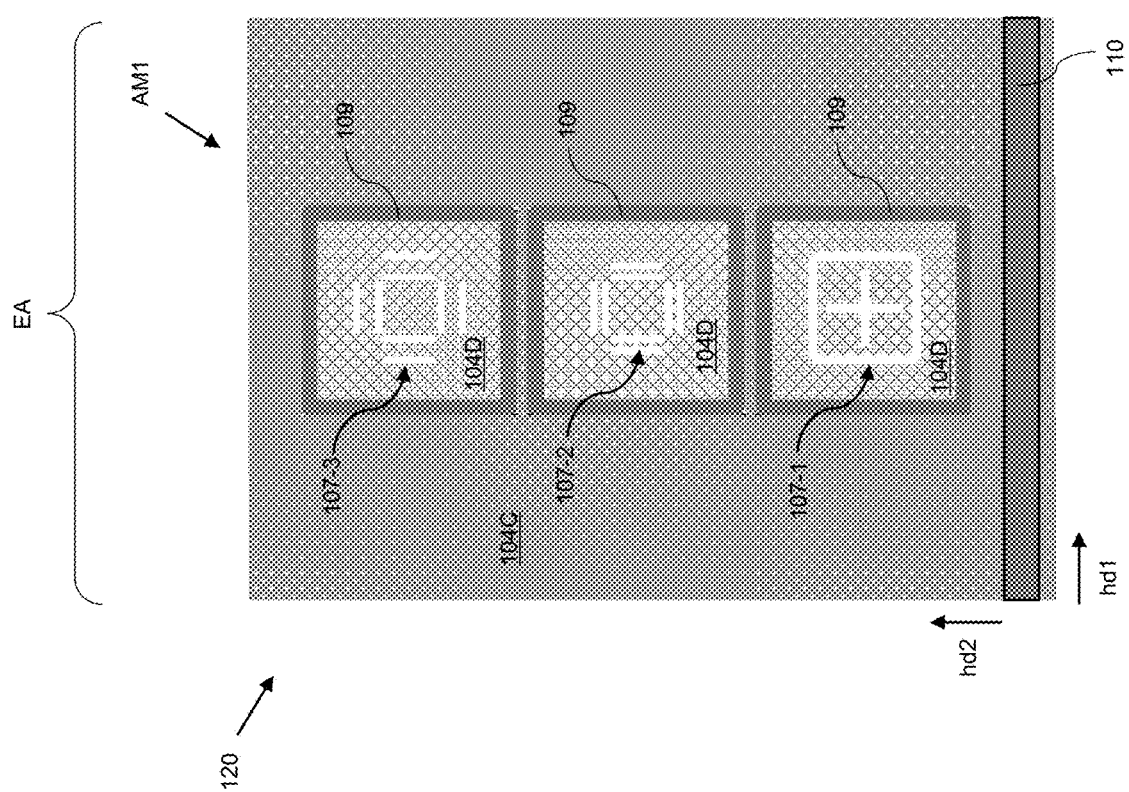
FIG. 15B is a horizontal cross-sectional view of a portion an interposer of the package structure taken along horizontal plane hp1 in FIG. 15A showing the first alignment mark region of an in-chip die edge area of the interposer according to various embodiments of the present disclosure.
Figure 15C:
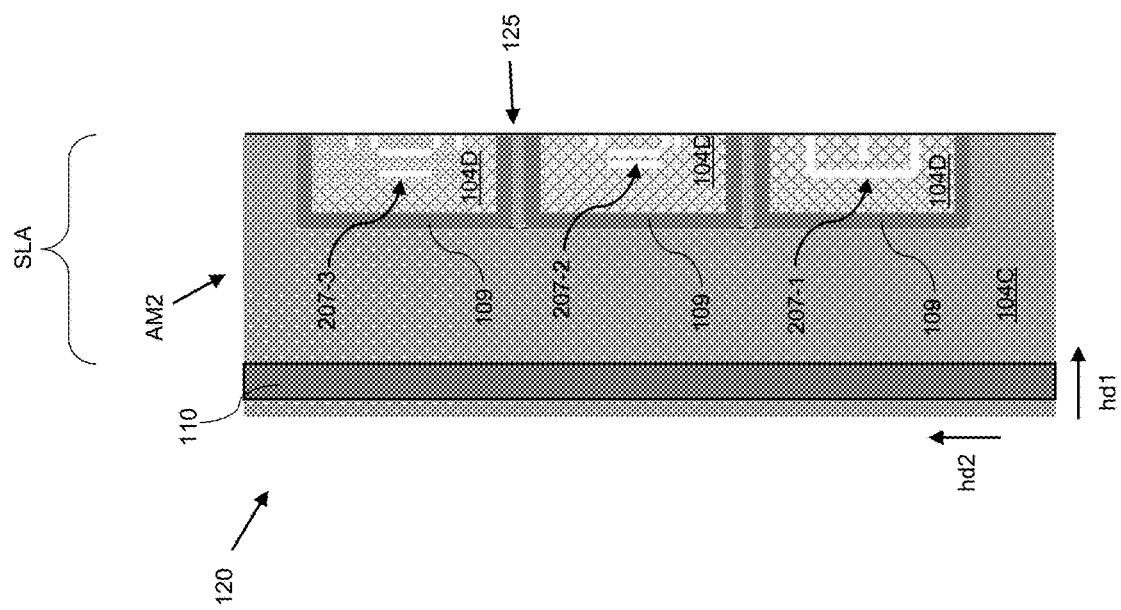
FIG. 15C is a horizontal cross-sectional view of a portion an interposer of the package structure taken along horizontal plane hp1 in FIG. 15A showing a portion of the second alignment mark region in a remaining portion of a scribe line area according to various embodiments of the present disclosure.

FIG. 15A is a vertical cross-sectional view of the intermediate structure during a process of forming a semiconductor package showing a package structure 130 according to various embodiments of the present disclosure. FIG. 15B is a horizontal cross-sectional view of a portion an interposer 120 of the package structure 130 taken along horizontal plane hp1 in FIG. 15A showing the AM1 of an in-chip die EA of the interposer 120. FIG. 15C is a horizontal cross-sectional view of a portion an interposer 120 of the package structure 130 taken along horizontal plane hp1 in FIG. 15A showing a portion of the AM2 in a remaining portion of a SLA.

Referring to FIG. 15A, the second carrier substrate 131 may be removed from the intermediate structure. The second carrier substrate 131 may be removed using any suitable method known in the art, such as any of the methods described above for removal of the first carrier substrate 101. In embodiments in which the second carrier substrate 131 is adhered to the semiconductor IC dies 121, 122, the first underfill material portion 123 and the continuous molding portion 124C using a second release layer 132, the second release layer 132 may be subjected to a treatment that causes the second release layer 132 to lose its adhesive properties, such as a thermal anneal and/or an optical irradiation treatment process as described above with reference to FIG. 14. The intermediate structure may be inverted relative to the orientation shown in FIG. 14.

A dicing process may be used to separate each UA of the intermediate structure to provide a plurality of discrete semiconductor package structures 130. The dicing process may be performed through the SLAs of the intermediate structure to separate each of the UAs. Each semiconductor package structure 130 may include a discrete interposer 120, a plurality of semiconductor IC dies 121, 122 mounted over a first surface 116 of the interposer 120, a first underfill material portion 123 located in the gaps between the first surface 116 of the interposer 120 and each of the semiconductor IC dies 121, 122, and a discrete molding portion 124 laterally surrounding the plurality of semiconductor IC dies 121, 122. A plurality of bonding pads 133 may be located over a second surface 126 of the interposer 120. The interposer 120 of the package structure 130 may include redistribution structures 105 extending through a dielectric material layer stack 104 between the first surface 116 and the second surface 126 of the interposer 120. A seal ring 110 may optionally surround the redistribution structures 105 within the dielectric material layer stack 104.

In some embodiments, the interposer 120 may include one or more alignment mark structures and a peripheral metal pad structure surrounding each of the alignment mark structures within an in-chip die EA of the interposer 120. For example, the AM1 in an in-chip die EA of the interposer 120 is shown in the horizontal cross-sectional view of FIG. 15B taken along horizontal plane hp1 in FIG. 15A. Referring to FIG. 15B, the AM1 in an in-chip die EA of the interposer 120 may include a plurality of first alignment mark structures 107-1, 107-2 and 107-3 that may be located over the second dielectric material layer 104B (not visible in FIG. 15B). In the embodiment shown in FIG. 15B, the first alignment mark structures 107-1, 107-2 and 107-2 include full alignment marks, but in other embodiments described in further detail below, the remaining alignment mark structures 107-1, 107-2 and 107-3 in the finished interposer 120 may be portions of previously-fabricated alignment marks. A plurality of peripheral metal pad structures 109 may surround each of the first alignment mark structures 107-1, 107-2 and 107-3, and may contact the underlying second dielectric material layer 104B and the third dielectric material layer 104C, which may contact side surfaces and an upper surface of the peripheral metal pad structures 109. In the embodiment shown in FIG. 15B, the peripheral metal pad structures 109 include full peripheral metal pads surrounding the respective first alignment mark structures 107-1, 107-2 and 107-3. However, in other embodiments described in further detail below, the peripheral metal pad structures 109 may be portions of previously-fabricated peripheral metal pads. The overlying fourth dielectric material layer 104D may extend through recesses in the third dielectric material layer 104C and may contact each of the alignment marks 107-1, 107-2 and 107-3, and may optionally also contact side surfaces and the upper surfaces of the peripheral metal pad structures 109.

In some embodiments, following the dicing process, at least a portion of a SLA of the continuous interposer structure 120C, including at least a portion of one or more alignment mark regions in the SLA, may remain in the interposer 120. For example, the AM2 in a remaining portion of a SLA in the interposer 120 is shown in the horizontal cross-sectional view of FIG. 15C, which is taken along horizontal plane hp1 in FIG. 15A. Referring to FIG. 15C, the AM2 in the remaining portion of the SLA of the interposer 120 may include second alignment mark structures 207-1, 207-2 and 207-3 that may include remaining portions of previously-fabricated alignment marks located adjacent to a peripheral edge 125 of the interposer 120. The second alignment mark structures 207-1, 207-2 and 207-3 may be located over the second dielectric material layer 104B (not visible in FIG. 15C). A plurality of peripheral metal pad structures 109 may include remaining portions of previously-fabricated peripheral metal pads partially surrounding the second alignment mark structures 207-1, 207-2 and 207-3. Portions of the peripheral metal pad structures 109 may extend to the peripheral edge 125 of the interposer 120. The peripheral metal pad structures 109 may each contact the underlying second dielectric material layer 104B and the third dielectric material layer 104C, which may contact side surfaces and an upper surface of the peripheral metal pad structures 109. The overlying fourth dielectric material layer 104D may extend through recesses in the third dielectric material layer 104C and may contact the alignment mark structures 207-1, 207-2 and 207-3, and may optionally also contact side surfaces and the upper surfaces of the peripheral metal pad structures 109.

Referring to FIGS. 15A-15C, in various embodiments, the alignment mark structures 107-1, 107-2, 107-3, 207-1, 207-2, 207-3, 307-1, 307-2, 307-3, 407-1, 407-2 and 407-2 and peripheral metal pad structures 109 in the interposer 120 may be electrically isolated from the redistribution structures 105 and optional seal ring 110 extending through the stack of dielectric material layers 104A, 104B, 104C, 104D and 104E.

Figure 16:
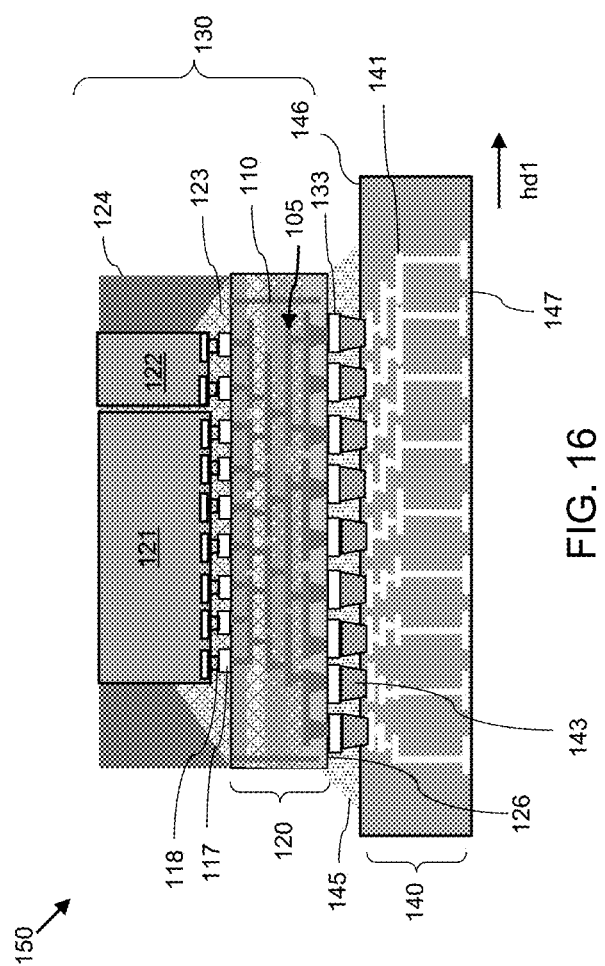
FIG. 16 is a vertical cross-sectional view of a semiconductor package including a package structure mounted over the front side surface of a package substrate according to various embodiments of the present disclosure.

FIG. 16 is a vertical cross-sectional view of a semiconductor package 150 including a package structure 130 mounted over the front side surface 146 of a package substrate 140 according to various embodiments of the present disclosure. Referring to FIG. 16, the package substrate 140 may include any suitable substrate material(s), such as polymer, glass, epoxy resin, ceramic and/or semiconductor substrate materials. The package substrate 140 may include a first side surface 140 (which, for convenience, may also be referred to as a "front" side surface 146 of the package substrate 140) and a second side surface 147 (which, for convenience, may also be referred to as a "rear" side surface 147 of the package substrate 140) that is opposite the first side surface 146.

In various embodiments, the package substrate 140 may include redistribution structures 105 (e.g., metal lines, vias, bonding regions, etc.) extending within the package substrate 140. In some embodiments, the rear side surface 147 of the package substrate 140 may be configured to be mounted to a supporting substrate, such as a printed circuit board (PCB). Electrical connections between the supporting substrate (e.g., a PCB) and the semiconductor package 150 may be made via the redistribution structures 141 within the package substrate 140.

Referring again to FIG. 16, the package structure 130 may be aligned over the package substrate 140 such that the second surface 126 of the interposer 120 faces the front side surface 146 of the package substrate 140. The package structure 130 may be disposed over the front side surface 146 of the package substrate 140 such that an array of solder material portions 143 are located between redistribution structures 141 (e.g., bonding pads) that are exposed through the front side surface 146 of the package substrate 140 and the bonding pads 133 over the second surface 126 of the interposer 120.

A reflow process may be performed to reflow the solder material portions 143, thereby inducing bonding between the interposer 120 of the package structure 130 and the package substrate 140. Each of the solder material portions 143 may be bonded to a respective one of the bonding pads 133 over the second surface 126 of the interposer 120 and to a respective one of redistribution structures 141 (e.g., bonding pads) of the package substrate 140. In some embodiments, the solder material portions 143 may include C4 solder balls, and the package structure 130 may be bonded to the substrate package 140 through an array of C4 solder balls.

Referring again to FIG. 16, a second underfill material portion 145 may be applied into the space between the front side surface 146 of the package substrate 140 and the second surface 126 of the interposer 120. The second underfill material portion 145 may laterally surround and contact each of the solder material portions 143 that bond the interposer 120 to the package substrate 140. The second underfill material portion 145 may include any underfill material known in the art. For example, the second underfill material portion 145 may be composed of an epoxy-based material, which may include a composite of resin and filler materials. Other suitable materials for the second underfill material portion 145 are within the contemplated scope of disclosure. Any known underfill material application method may be used to apply the second underfill material portion 145.

Figure 17:
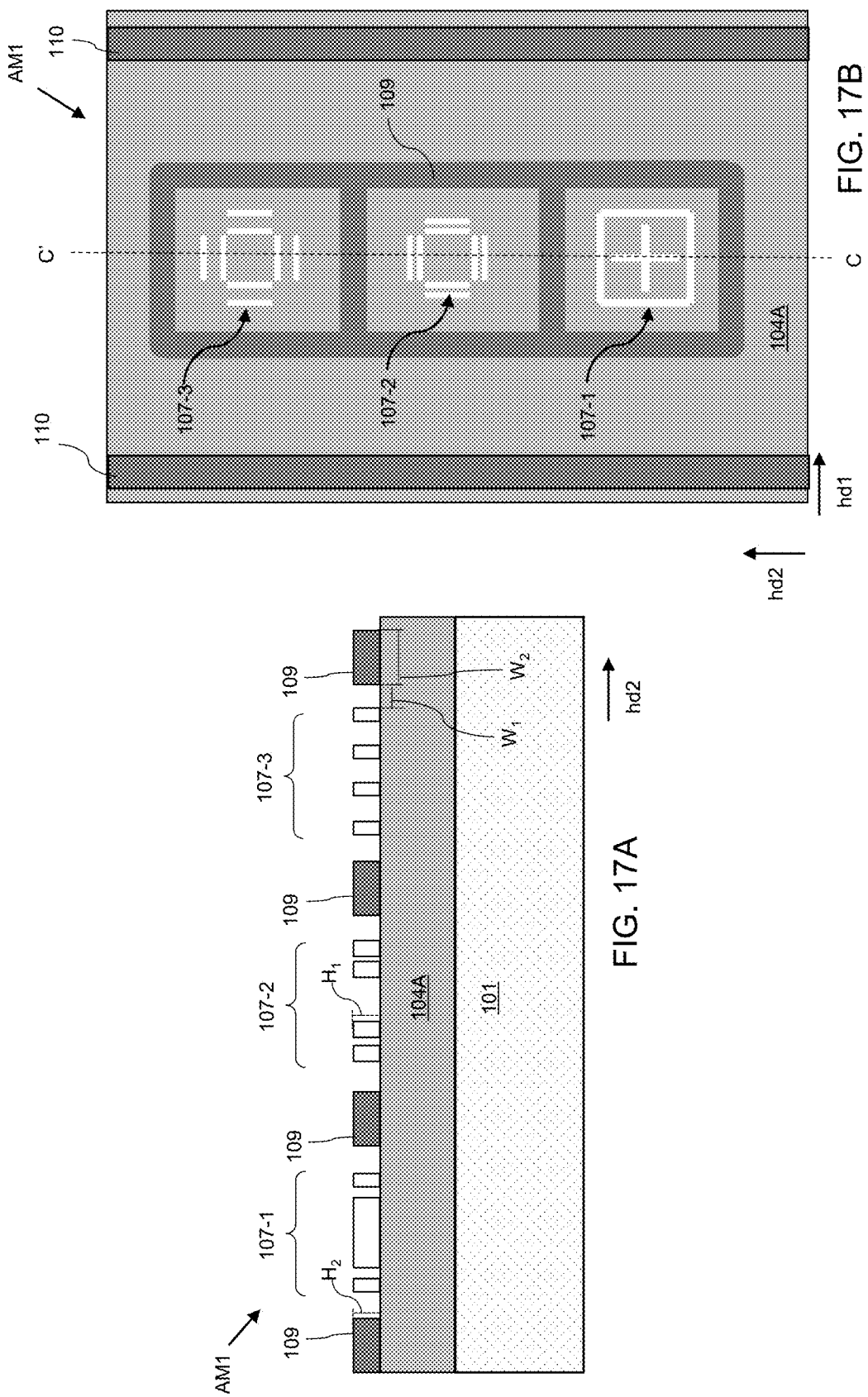
FIG. 17A is a vertical cross-sectional view of an intermediate structure during a process of forming a semiconductor package showing an enlarged view of the first alignment mark region in the scribe line area including the first plurality of alignment marks and a continuous peripheral metal pad surrounding the periphery of each of alignment marks according to an alternative embodiment of the present disclosure.
FIG. 17B is a top view of the first alignment mark region in the scribe line area shown in FIG. 17A according to various embodiments of the present disclosure.

FIG. 17A is a vertical cross-sectional view of an intermediate structure during a process of forming a semiconductor package 150 showing an enlarged view of the AM1 in the SLA including the first plurality of alignment marks 107-1, 107-2 and 107-7 and a continuous peripheral metal pad 109 surrounding the periphery of each of alignment marks 107-1, 107-2 and 107-7 according to an alternative embodiment of the present disclosure. FIG. 17B is a top view of the AM1 in the SLA shown in FIG. 17A, where the vertical cross-sectional view of FIG. 17A is taken along line C-C' in FIG. 17B. As discussed above with reference to FIGS. 2C and 2D, a continuous peripheral metal pad 109 may be formed surrounding multiple alignment marks 107-1, 107-2 and 107-3, including all of the alignment marks 107-1, 107-2 and 107-3 within an alignment mark region. The continuous peripheral metal pad 109 may be offset from the respective alignment marks 107-1, 107-2 and 107-3 that it surrounds by a minimum distance $W_1$. In some embodiments, 3 $\mu m \leq W_1 \leq 10$ $\mu m$. In various embodiments, the continuous peripheral metal pad 109 may have a width dimension $W_2$ that is between about 5 $\mu m$ and about 20 $\mu m$. Although the continuous peripheral metal pad 109 in FIGS. 17A and 17B is shown surrounding the alignment marks 107-1, 107-2 and 107-3 in the AM1 of the SLA, it will be understood that a similar configuration of the peripheral metal pad 109 may be utilized in any of the alignment mark regions (e.g., AM1, AM2, AM3, AM4) in the SLA and/or the in-chip die EA.

Figure 18:
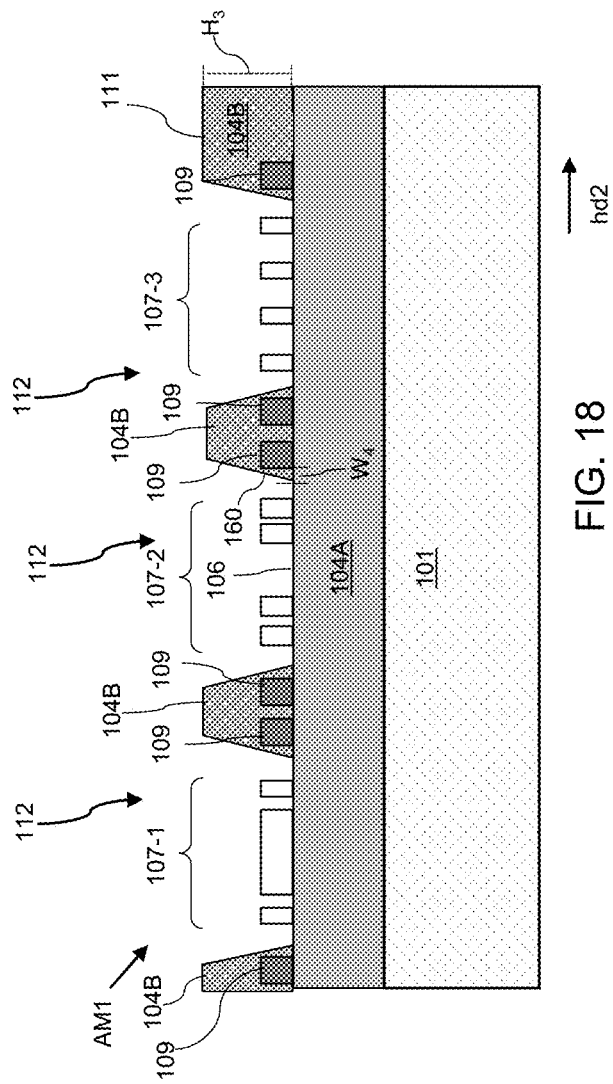
FIG. 18 is a vertical cross-sectional view of an intermediate structure during a process of fabricating a semiconductor package showing an enlarged view of the first alignment mark region in the scribe line area including the recesses through the second dielectric layer exposing the first plurality of alignment marks and the peripheral metal pads fully embedded within the second dielectric layer according to an alternative embodiment of the present disclosure.

FIG. 18 is a vertical cross-sectional view of an intermediate structure during a process of fabricating a semiconductor package showing an enlarged view of the AM1 in the SLA including the recesses 112 through the second dielectric layer 104B exposing the first plurality of alignment marks 107-1, 107-2 and 107-2 and the peripheral metal pads 109 fully embedded within the second dielectric layer 104B according to an alternative embodiment of the present disclosure. As discussed above with reference to FIGS. 3B-3D, in some embodiments the peripheral metal pads 109 may be fully embedded within the overlying second dielectric material layer 104B such that no portions of the peripheral metal pads 109 are exposed through the recesses 112 in the second dielectric material layer 104B. In some embodiments, the distance $W_4$ between the side surface of the peripheral metal pads 109 facing the adjacent alignment mark 107-1, 107-2 and 107-2 and the sidewall 160 of the recess 112 may be about 0.5 µm or less to maintain effective adhesion between the first dielectric material layer 104A, the second dielectric material layer 104B, and the subsequently-deposited third dielectric material layer 104B at the stacking interface region 114 where the dielectric material layers 104A, 104B and 104C converge. Although the fully-embedded peripheral metal pads 109 in FIG. 18 are shown in the AM1 of the SLA, it will be understood that a similar configuration of the peripheral metal pads 109 being fully embedded in the overlying dielectric material layer 104 may be utilized in any of the alignment mark regions (e.g., AM1, AM2, AM3, AM4) in the SLA and/or the in-chip die EA.

Figure 19:
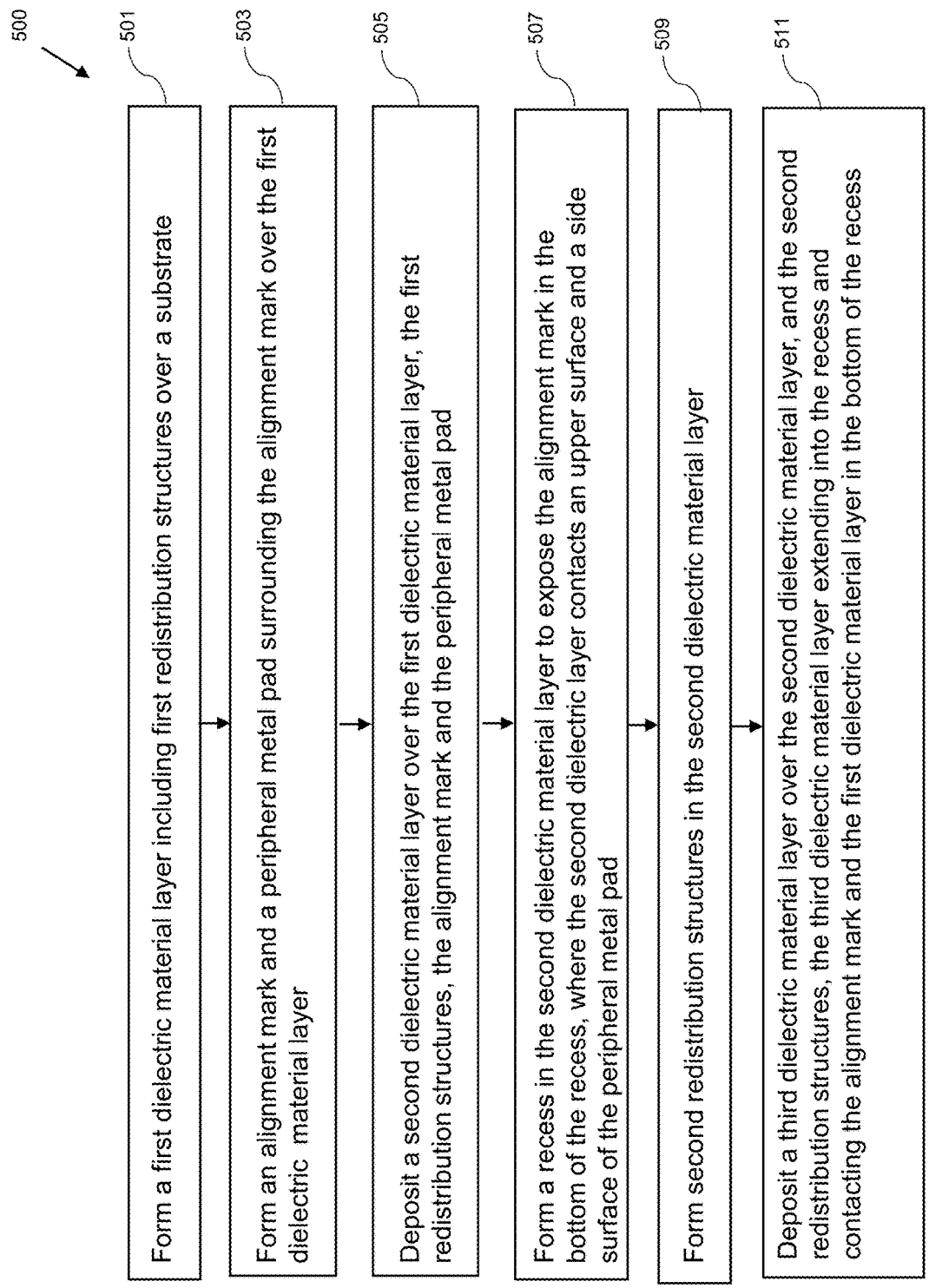
FIG. 19 is a flow diagram illustrating a method of fabricating an interposer for a semiconductor package according to various embodiments of the present disclosure.

FIG. 19 is a flow diagram illustrating a method 500 of fabricating an interposer 120 for a semiconductor package 150 according to various embodiments of the present disclosure. Referring to FIGS. 1A-2A and FIG. 19, in step 501 of embodiment method 500, a first dielectric material layer 104A including first redistribution structures 105A may be formed over a substrate 101. Referring to FIGS. 2B-2D, 17A, 17B and 19, in step 503 of embodiment method 500, an alignment mark 107 and a peripheral metal pad 109 surrounding the alignment mark 107 may be formed over the first dielectric material layer 104A. Referring to FIGS. 3A-3E, in step 505 of embodiment method 500, a second dielectric material layer 104B may be deposited over the first dielectric material layer 104A, the first redistribution structures 105A, the alignment mark 107 and the peripheral metal pad 109. Referring to FIGS. 3B-3D, 18 and 19, in step 507 of embodiment method 500, a recess 112 may be formed in the second dielectric material layer 104B to expose the alignment mark 107 at the bottom of the recess 112, where the second dielectric material layer 104B contacts an upper surface and a side surface of the peripheral metal pad 109. Referring to FIGS. 3A and 19, in step 509 of embodiment method 500, second redistribution structures 105B may be formed in the second dielectric material layer 104B. Referring to FIGS. 5A-5C and 19, in step 511 of embodiment method 500, a third dielectric material layer 104C may be deposited over the second dielectric material layer 104B and the second redistribution structures 105B, the third dielectric material layer 104C extending into the recess 112 and contacting the alignment mark 107 and the first dielectric material layer 104A in the bottom of the recess 112.

Referring to all drawings and according to various embodiments of the present disclosure, an interposer 120 for a semiconductor package 150 includes a first dielectric material layer 104A, a second dielectric material layer 104B over the first dielectric material layer 104A, redistribution structures 105 disposed in the first dielectric material layer 104A and the second dielectric material layer 104B, an alignment mark structure 107 over the first dielectric material layer 104A, where the second dielectric material layer 104B includes a recess 112 corresponding to the alignment mark structure 107, and a peripheral metal pad structure 109 extending around the alignment mark structure 107, the peripheral metal pad structure 109 contacting the first dielectric material layer 104A on a bottom surface of the peripheral metal pad structure 109 and contacting the second dielectric material layer 104B over an upper surface and a side surface of the peripheral metal pad structure 109.

In an embodiment, the alignment mark structure 107 comprises a full alignment mark 107 including a pattern of metal features over the first dielectric material layer 104A, and the peripheral metal pad structure 109 extends around an entire periphery of the full alignment mark 107. In another embodiment, the alignment mark structure 107 and the peripheral metal pad structure 109 are located in an in-chip die EA of the interposer 120. In another embodiment, the alignment mark structure includes a portion of an alignment mark 107, and the peripheral metal pad structure 109 extends around a periphery of the portion of the alignment mark 107 to a peripheral edge 125 of the interposer 120. In another embodiment, the alignment mark structure 107 and the peripheral metal pad structure 109 are located in a SLA of the interposer 120. In another embodiment, a minimum separation distance, $W_1$, between the peripheral metal pad structure 109 and the alignment mark structure 107 is greater than or equal to 3 µm and less than or equal to 10 µm. In another embodiment, the peripheral metal pad structure 109 includes a width dimension, $W_2$, and a ratio of the width $W_3$ of a portion of the upper surface of the peripheral metal pad structure 109 that is covered by the second dielectric material layer 104B to the width dimension $W_2$ of the peripheral metal pad structure 109 is greater than or equal to 0.1 and less than or equal to 1.0. In another embodiment, the width dimension $W_2$ of the peripheral metal pad structure 109 is greater than or equal to 5 µm and less than or equal to 20 µm. In another embodiment, the peripheral metal pad structure 109 is fully embedded within the second dielectric material layer, and a distance $W_4$ between the side surface of the peripheral metal pad structure facing the alignment mark structure and a sidewall 160 of the recess 112 in the second dielectric material layer is 0.5 µm or less. In another embodiment, the alignment mark structure 107 includes at least one metal feature having a height dimension $H_1$ with respect to the upper surface 106 of the first dielectric material layer 104A, the peripheral metal pad structure 109 has a height dimension $H_2$ respect to the upper surface 106 of the first dielectric material layer 104A, and the ratio $H_2/H_1$ is greater than or equal to 0.8 and less than or equal to 1.2. In another embodiment, the height dimension $H_2$ of the peripheral metal pad structure 109 is greater than or equal to 1 µm and less than or equal to 10 µm. In another embodiment, the second dielectric material layer 104B has a height dimension $H_3$, and the ratio $H_2/H_3$ is greater than or equal to 0.1 and less than 1.0. In another embodiment, a third dielectric material layer 104C is located over the second dielectric material layer 104B and includes redistribution structures 105 disposed in the third dielectric material layer 104C, where a portion of the third dielectric material layer 104C extends into the recess 112 in the second dielectric material layer 104B and contacts the alignment mark structure 107 and the upper surface 106 of the first dielectric material layer 104A. In another embodiment, the third dielectric material layer 104C contacts the upper surface and a side surface of the peripheral metal pad structure 109. In another embodiment, the interposer includes a plurality of alignment mark structures 107 over the first dielectric material layer 104A, where the second dielectric material layer 104B includes recesses 112 corresponding to each of the alignment mark structures 107, and the peripheral metal pad structure 109 extends continuously around each of the alignment mark structures 107.

An additional embodiment is drawn to a semiconductor package 150 including a package substrate 140, an interposer 120 mounted over the package substrate 140, wherein the interposer comprises a stack of dielectric material layers 104 and redistribution structures 105 extending through the stack of dielectric material layers 104, where the interposer 120 further includes a plurality of peripheral metal pad structures 109 electrically isolated from the redistribution structures 105, each of the peripheral metal pad structures 109 extends around an alignment mark 107, to a peripheral edge 125 of the interposer 120, or both, and at least one semiconductor integrated circuit (IC) die 121, 122 mounted over a first surface 116 of the interposer 120.

In an embodiment, the semiconductor package 150 further includes an underfill material portion 123 located between an upper surface 116 of a top dielectric material layer 104E of the stack of dielectric material layers 104 of the interposer 120 and the at least one semiconductor IC die 121, 122 and a molding portion 124 laterally surrounding the at least one semiconductor IC die 121, 122, where the top dielectric material layer 104E includes a recess 412 exposing a portion of a peripheral metal pad structure 109, and at least one of the underfill material portion 123 and the molding portion 124 extends into the recess 412 in the top dielectric material layer 104E and contacts the peripheral metal pad structure 109.

An additional embodiment is drawn to a method of fabricating an interposer 120 for a semiconductor package 150 that includes forming a first dielectric material layer 104A including first redistribution structures 105A over a substrate 101, forming an alignment mark 107 and a peripheral metal pad 109 surrounding the alignment mark 107 over the first dielectric material layer 104A, depositing a second dielectric material layer 104B over the first dielectric material layer 104A, the first redistribution structures 105A, the alignment mark 107 and the peripheral metal pad 109, forming a recess 112 in the second dielectric material layer 104B to expose the alignment mark 107 at the bottom of the recess 112, where following the formation of the recess 112, the second dielectric material layer 104B contacts the upper surface and a side surface of the peripheral metal pad 109, forming second redistribution structures 105B in the second dielectric material layer 104B, and depositing a third dielectric material layer 104C over the second dielectric material layer 104B and the second redistribution structures 105B, the third dielectric material layer 104C extending into the recess 112 and contacting the alignment mark 107 and the first dielectric material layer 106 in the bottom of the recess 112.

In an embodiment, forming second redistribution structures 105B in the second dielectric material layer 104B includes patterning the second dielectric material layer 104B to form trenches and via openings in the second dielectric material layer 104B overlying the first redistribution structures 105A, where the alignment mark 107 is used to align photolithography equipment used to pattern the second dielectric material layer 104B, and depositing a metallic material over the upper surface 111 of the second dielectric material layer 104B and within the trenches and via openings in the second dielectric material layer 104B, and removing portions of the metallic material from over the upper surface 111 of the second dielectric material layer 104B to provide the second redistribution structures 105B in the second dielectric material layer 104B. In another embodiment, the method further includes patterning a portion of the metallic material over the upper surface 111 of the second dielectric material layer 104B to form a second alignment mark 207 and a second peripheral metal pad 109 surrounding the second alignment mark 207, where the third dielectric material layer 104C is deposited over the second alignment mark 207 and the second peripheral metal pad 109, forming a recess 212 in the third dielectric material layer 104C to expose the second alignment mark 207 at the bottom of the recess 212 in the third dielectric material layer 104C, where following the formation of the recess 212 in the third dielectric material layer 104C, the third dielectric material layer 104C contacts the upper surface and a side surface of the second peripheral metal pad 109, and forming third redistribution structures 105C in the third dielectric material layer 104C using the second alignment mark 207 to align photolithography equipment used to pattern the third dielectric material layer 104C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interposer for a semiconductor package, comprising:
    a first dielectric material layer;
    a second dielectric material layer over the first dielectric material layer;
    redistribution structures disposed in the first dielectric material layer and the second dielectric material layer;
    an alignment mark structure over the first dielectric material layer, wherein the second dielectric material layer comprises a recess corresponding to the alignment mark structure; and
    a peripheral metal pad structure extending around the alignment mark structure, the peripheral metal pad structure contacting the first dielectric material layer on a bottom surface of the peripheral metal pad structure and contacting the second dielectric material layer over an upper surface and a side surface of the peripheral metal pad structure.

2. The interposer of claim 1, wherein the alignment mark structure comprises a full alignment mark comprising a pattern of metal features over the first dielectric material layer, and the peripheral metal pad structure extends around an entire periphery of the full alignment mark.

3. The interposer of claim 2, wherein the alignment mark structure and the peripheral metal pad structure are located in an in-chip die edge area of the interposer.

4. The interposer of claim 1, wherein the alignment mark structure comprises a portion of an alignment mark, and the peripheral metal pad structure extends around a periphery of the portion of the alignment mark to a peripheral edge of the interposer.

5. The interposer of claim 4, wherein the alignment mark structure and the peripheral metal pad structure are located in a scribe line area of the interposer.

6. The interposer of claim 1, wherein a minimum separation distance, $W_1$, between the peripheral metal pad structure and the alignment mark structure is greater than or equal to 3 μm and less than or equal to 10 μm.

7. The interposer of claim 1, wherein the peripheral metal pad structure includes a width dimension, $W_2$, and a ratio of a width $W_3$ of a portion of the upper surface of the peripheral metal pad structure that is covered by the second dielectric material layer to the width dimension $W_2$ of the peripheral metal pad structure is greater than or equal to 0.1 and less than or equal to 1.0.

8. The interposer of claim 7, wherein the width dimension $W_2$ of the peripheral metal pad structure is greater than or equal to 5 μm and less than or equal to 20 μm.

9. The interposer of claim 7, wherein the peripheral metal pad structure is fully embedded within the second dielectric material layer, and a distance $W_4$ between the side surface of the peripheral metal pad structure facing the alignment mark structure and a sidewall of the recess in the second dielectric material layer is 0.5 μm or less.

10. The interposer of claim 1, wherein the alignment mark structure comprises at least one metal feature having a height dimension $H_1$ with respect to the upper surface of the first dielectric material layer, the peripheral metal pad structure has a height dimension $H_2$ respect to the upper surface of the first dielectric material layer, and a ratio $H_2/H_1$ is greater than or equal to 0.8 and less than or equal to 1.2.

11. The interposer of claim 10, wherein the height dimension $H_2$ of the peripheral metal pad structure is greater than or equal to 1 μm and less than or equal to 10 μm.

12. The interposer of claim 10, wherein the second dielectric material layer has a height dimension $H_3$, and a ratio $H_2/H_3$ is greater than or equal to 0.1 and less than 1.0.

13. The interposer of claim 1, further comprising:
a third dielectric material layer over the second dielectric material layer and including redistribution structures disposed in the third dielectric material layer,
wherein a portion of the third dielectric material layer extends into the recess in the second dielectric material layer and contacts the alignment mark structure and the upper surface of the first dielectric material layer.

14. The interposer of claim 13, wherein the third dielectric material layer contacts the upper surface and a side surface of the peripheral metal pad structure.

15. The interposer of claim 1, wherein the interposer comprises a plurality of alignment mark structures over the first dielectric material layer, wherein the second dielectric material layer comprises recesses corresponding to each of the alignment mark structures, and the peripheral metal pad structure extends continuously around each of the alignment mark structures.

16. A semiconductor package, comprising:
a package substrate;
an interposer mounted over the package substrate, wherein the interposer comprises a stack of dielectric material layers and redistribution structures extending through the stack of dielectric material layers, wherein the interposer further comprises a plurality of peripheral metal pad structures electrically isolated from the redistribution structures, each of the peripheral metal pad structures extends around an alignment mark, to a peripheral edge of the interposer, or both, wherein a top dielectric material layer of the stack of dielectric material layers of the interposer includes a recess exposing a portion of a peripheral metal pad structure; and
at least one semiconductor integrated circuit (IC) die mounted over a first surface of the interposer.

17. The semiconductor package of claim 16, further comprising:
an underfill material portion located between an upper surface of the top dielectric material layer of the stack of dielectric material layers of the interposer and the at least one semiconductor IC die; and
a molding portion laterally surrounding the at least one semiconductor IC die, wherein at least one of the underfill material portion and the molding portion extends into the recess of the top dielectric material layer and contacts the peripheral metal pad structure.

18. A semiconductor package structure, comprising:
a semiconductor die;
an interposer, the semiconductor die mounted to the interposer, the interposer comprising:
a first dielectric material layer;
an alignment mark structure and a peripheral metal pad structure over the first dielectric material layer;
a second dielectric material layer over the first dielectric material layer and contacting the peripheral metal pad structure; and
a third dielectric material layer over the second dielectric material layer and contacting the alignment mark structure.

19. The semiconductor package structure of claim 18, wherein the peripheral metal pad structure surrounds the alignment mark structure.

20. The semiconductor package structure of claim 18, wherein the peripheral metal pad structure extends around a portion of the alignment mark structure to a peripheral edge of the interposer.

* * * * *